(12) United States Patent
Shin et al.

(10) Patent No.: US 11,393,841 B2
(45) Date of Patent: Jul. 19, 2022

(54) VERTICAL MEMORY DEVICES WITH REDUCED GATE ELECTRODE COUPLING AND METHODS OF MANUFACTURING THE SAME

(71) Applicant: Samsung Electronics Co., Ltd., Suwon-si (KR)

(72) Inventors: Kyungjun Shin, Suwon-si (KR); Hyunseok Na, Suwon-si (KR); Yunkyu Jung, Suwon-si (KR); Heejueng Lee, Suwon-si (KR); Seungwan Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/733,301

(22) Filed: Jan. 3, 2020

(65) Prior Publication Data

US 2020/0365615 A1 Nov. 19, 2020

(30) Foreign Application Priority Data

May 17, 2019 (KR) .......................... 10-2019-0058112

(51) Int. Cl.
*H01L 27/11582* (2017.01)
*H01L 21/28* (2006.01)
*H01L 29/49* (2006.01)
*H01L 29/51* (2006.01)

(52) U.S. Cl.
CPC .. *H01L 27/11582* (2013.01); *H01L 29/40117* (2019.08); *H01L 29/4916* (2013.01); *H01L 29/518* (2013.01)

(58) Field of Classification Search
CPC ........................................ H01L 27/115–11597
See application file for complete search history.

(56) References Cited

U.S. PATENT DOCUMENTS

| | | | |
|---|---|---|---|
| 9,576,966 B1* | 2/2017 | Peri | H01L 27/11582 |
| 9,653,565 B2 | 5/2017 | Jang et al. | |
| 9,754,954 B2 | 9/2017 | Higuchi et al. | |
| 9,831,267 B2 | 11/2017 | Kim et al. | |
| 9,997,533 B2 | 6/2018 | Yoshimizu et al. | |
| 10,020,314 B1 | 7/2018 | Baraskar et al. | |
| 10,068,917 B2 | 9/2018 | Kanamori et al. | |
| 10,381,376 B1* | 8/2019 | Nishikawa | H01L 21/823481 |

(Continued)

*Primary Examiner* — Stephen M Bradley
*Assistant Examiner* — Gustavo G Ramallo
(74) *Attorney, Agent, or Firm* — Muir Patent Law, PLLC

(57) ABSTRACT

Example embodiments disclose a vertical memory device and method of manufacturing the same. The device may include a plurality of gate electrodes and a plurality of insulation patterns and a channel that penetrates a first gate electrode and a first insulation pattern. The device may have a charge storage structure including a tunnel insulation pattern, a charge trapping pattern, and a blocking pattern that are sequentially stacked from an outer sidewall of a channel. The device may have a buried pattern structure that is surrounded by the tunnel insulation pattern and the charge trapping pattern. The charge trapping pattern may include a first vertically sloped portion having a first thickness in the horizontal direction and a second vertically sloped portion having a second thickness in the horizontal direction, and the first thickness may be less than or equal to the second thickness.

11 Claims, 42 Drawing Sheets

(56) References Cited

U.S. PATENT DOCUMENTS

| | | |
|---|---|---|
| 2017/0062451 A1 | 3/2017 | Shingu et al. |
| 2017/0221921 A1* | 8/2017 | Kanamori ............... H01L 28/00 |
| 2017/0236827 A1 | 8/2017 | Hirotani et al. |
| 2017/0373084 A1* | 12/2017 | Shim ..................... H01L 23/528 |
| 2018/0033799 A1 | 2/2018 | Kanamori et al. |

* cited by examiner

VERTICAL MEMORY DEVICES WITH REDUCED GATE ELECTRODE COUPLING AND METHODS OF MANUFACTURING THE SAME

CROSS-REFERENCE TO RELATED APPLICATION

This application claims priority under 35 USC § 119 to Korean Patent Application No. 10-2019-0058112, filed on May 17, 2019 in the Korean Intellectual Property Office (KIPO), the contents of which are herein incorporated by reference in their entirety.

BACKGROUND

1. Field

The inventive concepts relate to vertical memory devices. More particularly, the inventive concepts relate to nonvolatile memory devices having vertical channels.

2. Description of the Related Art

As the number of layers vertically stacked in a vertical memory device increases, it is important to reduce the thickness of each layer for scaling down the vertical memory device. However, as the thickness of each layer decreases, a coupling may occur between cells vertically adjacent to each other, and thus the electrical characteristics of the vertical memory device may be deteriorated.

SUMMARY

Example embodiments provide a vertical memory device having improved electrical characteristics.

Example embodiments provide a method of manufacturing a vertical memory device having improved electrical characteristics.

According to example embodiments, there is provided a vertical memory device. The vertical memory device may include a plurality of gate electrodes that are spaced apart from each other and are sequentially stacked in a vertical direction that is substantially perpendicular to an upper surface of a substrate. The plurality of gate electrodes may include a first gate electrode and a second gate electrode. The vertical memory device may include a plurality of insulation patterns including a first insulation pattern located at an elevation between the first gate electrode and the second gate electrode and a channel extending in the vertical direction on the substrate. The channel may penetrate at least the first gate electrode and the first insulation pattern. The vertical memory device may include a charge storage structure extending in the vertical direction and covering an outer sidewall of the channel. The charge storage structure may include a tunnel insulation pattern, a charge trapping pattern, and a blocking pattern that are sequentially stacked from the outer sidewall of the channel along a horizontal direction that is substantially parallel to the upper surface of the substrate. The vertical memory device may have a plurality of buried pattern structures including a first buried pattern structure with each buried pattern structure being surrounded by the tunnel insulation pattern and the charge trapping pattern between the channel and a respective insulation pattern. Each buried pattern structure may include an inner sidewall that contacts the tunnel insulation pattern and an outer sidewall that contacts the charge trapping pattern. A maximum thickness of a first portion of the charge trapping pattern having a vertical slope with respect to the upper surface of the substrate and being horizontally between the channel and the first gate electrodes is less than or equal to a maximum thickness of a second portion of the charge trapping pattern having a vertical slope with respect to the upper surface of the substrate and being horizontally between the channel and the first insulation pattern.

According to example embodiments, there is provided a vertical memory device. The vertical memory device may include a support pattern and a channel connection pattern on a substrate and a plurality of gate electrodes on the support pattern and the channel connection pattern. The gate electrodes may be spaced apart from each other in a vertical direction that is substantially perpendicular to an upper surface of the substrate. The vertical memory device may include a plurality of insulation patterns, including a first insulation pattern that is located at an elevation between respective gate electrodes and a plurality of channels on the substrate, each of the channels extending in the vertical direction and penetrating the gate electrodes and the insulation patterns. The vertical memory device may include a charge storage structure that extends in the vertical direction and covers an outer sidewall of the channel. The charge storage structure may include a tunnel insulation pattern, a charge trapping pattern, and a blocking pattern that are sequentially stacked from the outer sidewall of the channel along a horizontal direction that is substantially parallel to the upper surface of the substrate. The vertical memory device may include a plurality of buried pattern structures with each buried pattern structure being surrounded by the tunnel insulation pattern and the charge trapping pattern between the channel and a respective insulation pattern. Each buried pattern structure may include an inner sidewall and an outer sidewall, and a lower surface and an upper surface. The inner sidewall may contact the tunnel insulation pattern, and, the outer sidewall, lower surface, and upper surface may contact the charge trapping pattern. The plurality of channels may be electrically connected to each other by the channel connection pattern, and the charge trapping pattern may have a constant thickness.

According to example embodiments, there is provided a method of manufacturing a vertical memory device. The method may include alternately and repeatedly forming a plurality of insulation layers and sacrificial layers on top of a substrate and forming a channel hole that penetrates the plurality of insulation layers and sacrificial layers to thereby expose an upper surface of the substrate. The method may also include partially removing respective portions of the insulation patterns that are exposed by the channel hole to form a first recess that continuously extends from the channel hole and forming a blocking layer, a charge trapping layer, and first and second buried layers on a sidewall of the channel hole and an inner wall of the first recess. The method may also include performing a first oxidation process on a surface of the second buried layer, then removing the oxidized portion of the second buried layer by a first etching process and performing a second oxidation process on a remaining portion of the second buried layer, then removing a portion of the second buried layer oxidized by the second oxidation process and a portion of the first buried layer by a second etching process to form a buried pattern. The method may also include forming a tunnel insulation layer and a channel layer that are sequentially stacked on the buried pattern and the charge trapping layer.

A vertical memory device in accordance with example embodiments may include a charge storage structure having a tunnel insulation pattern, a charge trapping pattern and a blocking pattern sequentially stacked from an outer sidewall of a channel, the channel penetrating gate electrodes and insulation patterns alternately and repeatedly formed in a vertical direction substantially perpendicular to an upper surface of the substrate. Also, the vertical memory device may further include a buried pattern structure that is formed between the tunnel insulation pattern and the charge trapping pattern, and a portion of the charge storage structure contacting the insulation patterns may have a protruding shape from the channel. Accordingly, the occurrence of coupling between adjacent gate electrodes may be reduced, and thus the electrical characteristics of the vertical memory device may be improved.

DESCRIPTION OF EMBODIMENTS

Vertical memory devices and methods of manufacturing the same in accordance with example embodiments will be described more fully hereinafter with reference to the accompanying drawings.

Figure 1:
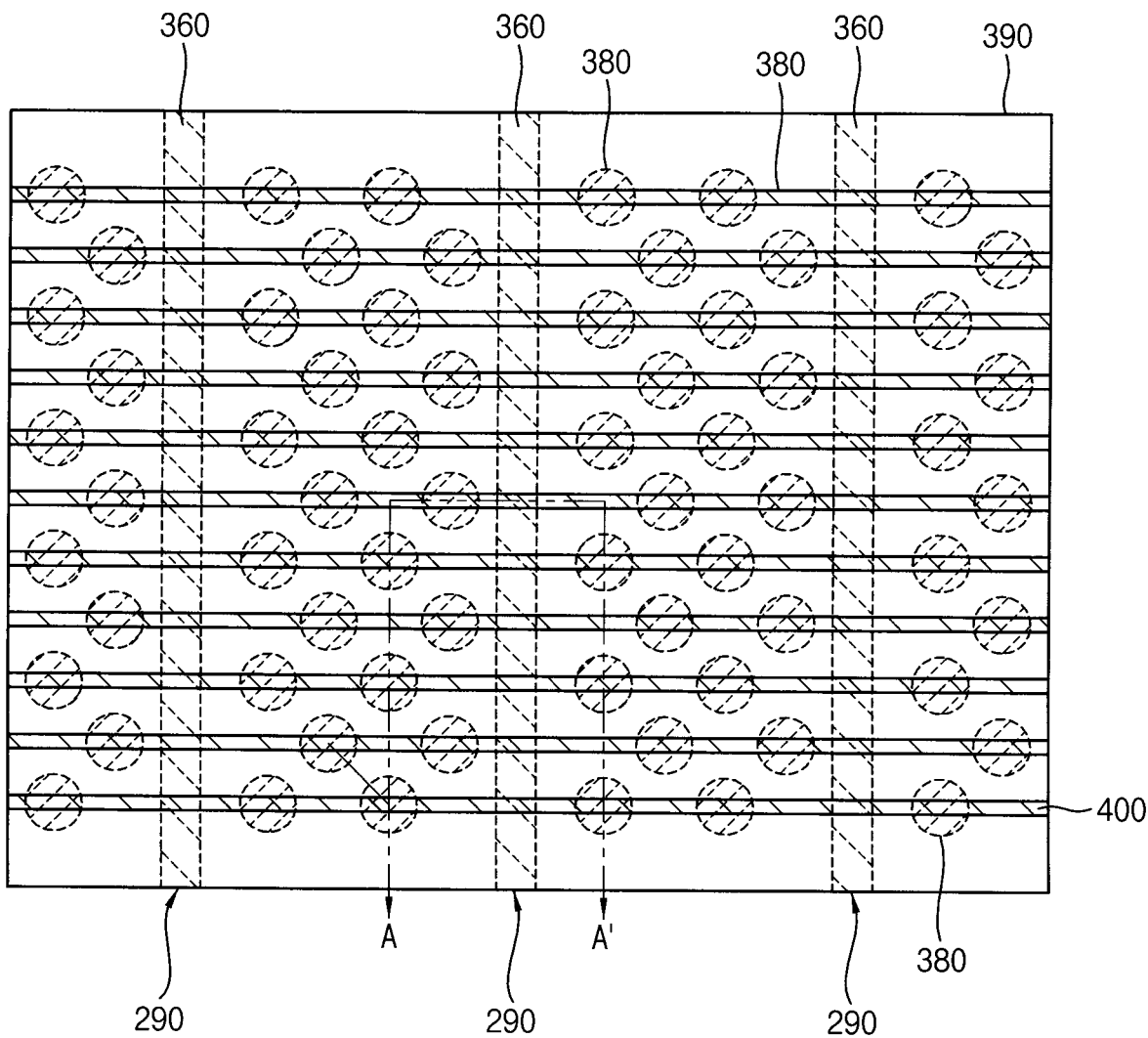
FIGS. 1, 2A and 2B are a plan view and cross-sectional views illustrating a vertical memory device in accordance with example embodiments.
Figure 2A:
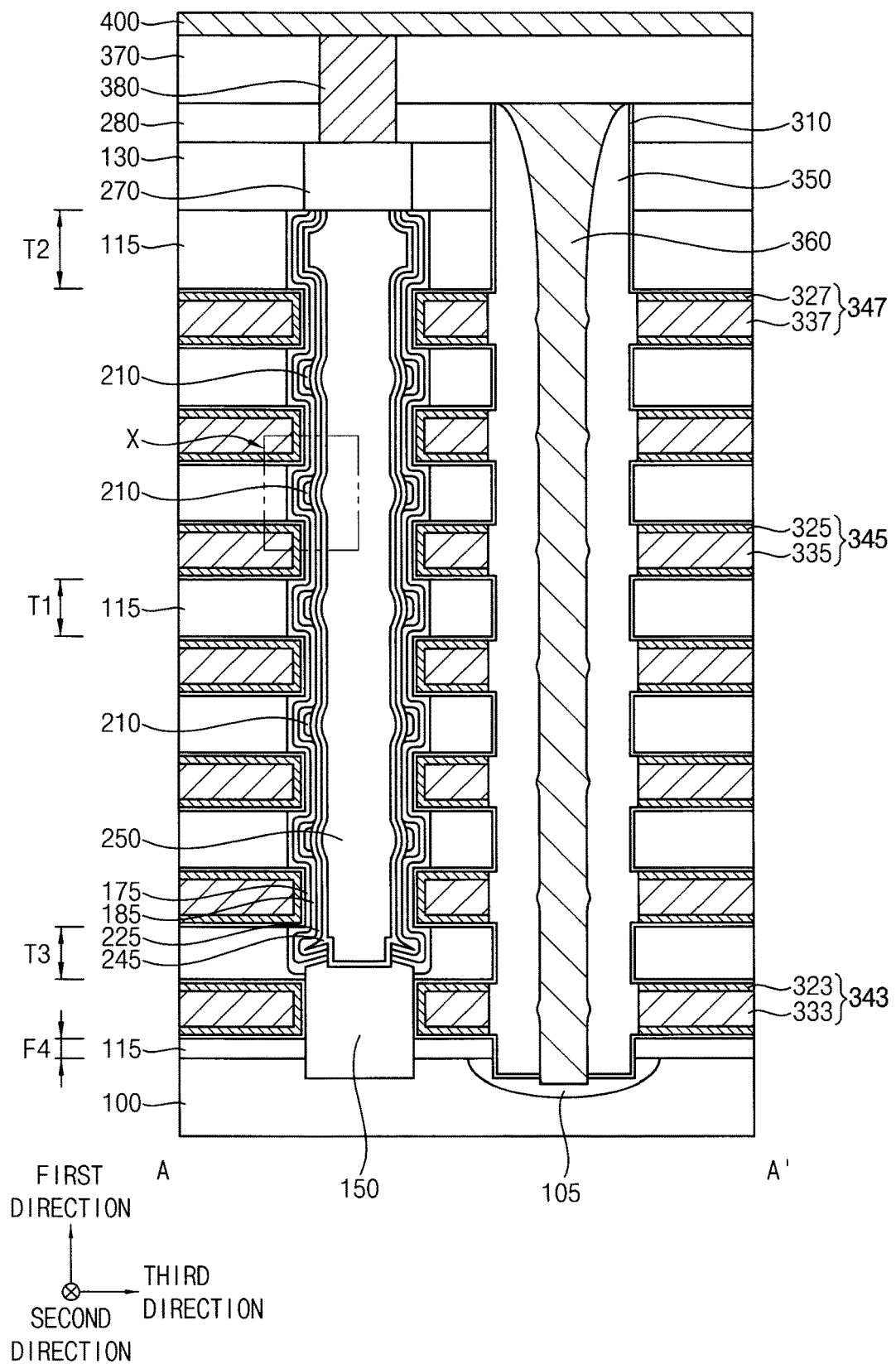
Figure 2B:
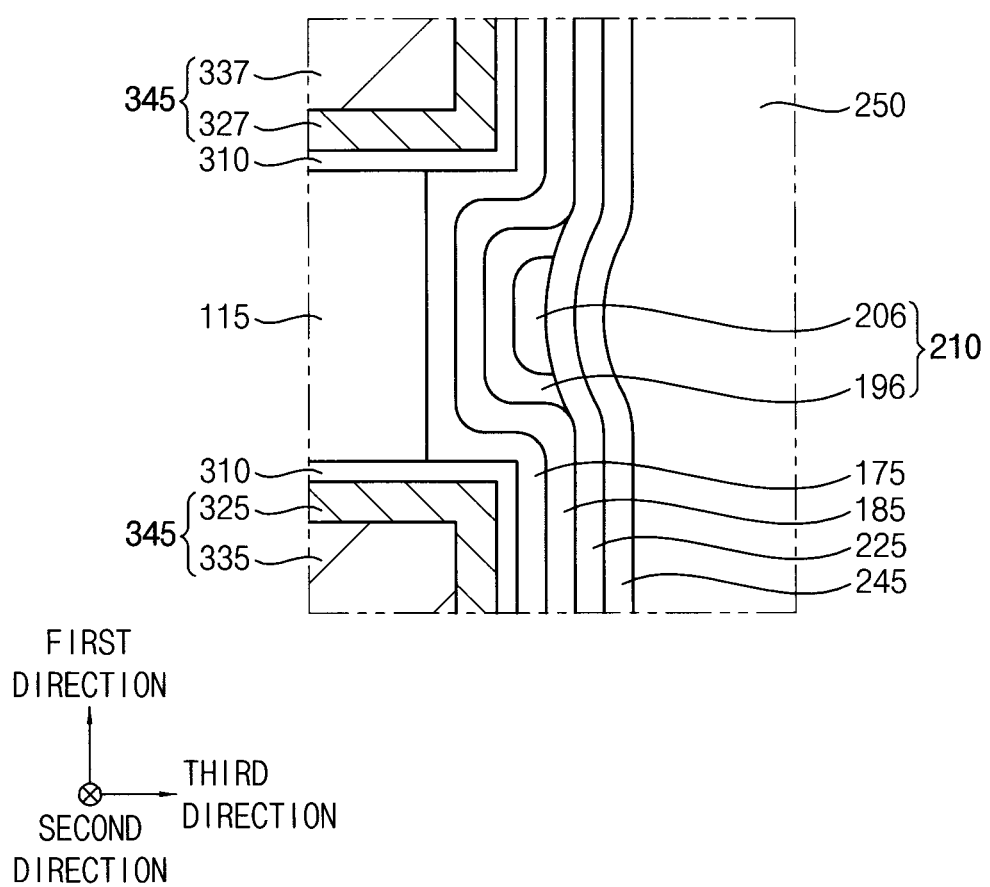

FIGS. 1, 2A and 2B are a plan view and cross-sectional views illustrating a vertical memory device in accordance with example embodiments. FIG. 1 is the plan view, FIG. 2A is a cross-sectional view taken along a line A-A' of FIG. 1, and FIG. 2B is an enlarged cross-sectional view of a region X of FIG. 2A.

Hereinafter, a vertical direction substantially endicular to an upper surface of a substrate is defined as a first direction, and two directions intersecting with each other among horizontal directions substantially parallel to the upper surface of the substrate are defined as second and third directions, respectively. Directions described as parallel or perpendicular shall be understood as encompassing acceptable variations that may occur, for example, due to manufacturing processes, tools of measurement, and/or surfaces that are not 100% consistently level throughout. The term "substantially" used with "parallel" or "perpendicular" may encompass an exactly parallel or perpendicular orientation or an orientation with these acceptable variations. The term "substantial" shall have a meaning understood by context unless clearly intended to have an alternate meaning. In example embodiments, the second and third directions may be orthogonal to each other.

Referring to FIGS. 1, 2A and 2B, the vertical memory device may include insulation patterns 115 on a substrate 100, gate electrodes 343, 345 and 347, a channel 245, a charge storage structure, and a buried pattern structure 210. Also, the vertical memory device may further include a semiconductor pattern 150, a third buried pattern 250, a pad 270, a second blocking pattern 310, a second spacer 350, a common source line (CSL) 360, first to fourth insulating interlayers 130, 280, 370 and 390, a contact plug 380, and a bit line 400.

The substrate 100 may include silicon, germanium, silicon-germanium or III-V compounds such as GaP, GaAs, GaSb, etc. In some embodiments, the substrate 100 may be a silicon-on-insulator (SOI) substrate or a germanium-on-insulator (GOI) substrate.

Insulation patterns 115 may be formed at a plurality of levels, respectively, on the substrate 100 along the first direction to be spaced apart from each other. As used herein, the term "level" may refer to an elevation or distance, e.g., a relative distance from substrate 100 or a relative elevation above substrate 100 in the first direction. Respective insulation patterns 115 may have different thicknesses in the first direction depending on the formed level. For example, in FIG. 2A, an insulation pattern 115 may be formed at a lowermost level (as measured from an upper surface of the substrate 100) along the first direction and may have a fourth thickness T4, an insulation pattern 115 formed at a second level may have a third thickness T3, an insulation pattern 115 formed at an uppermost level may have a second thickness T2, and each insulation pattern 115 formed at remaining central levels may have a first thickness. In example embodiments, the fourth thickness T4 may be smaller than (less than) the first to third thicknesses T1, T2, and T3, the first thickness T1 may be smaller than (less than) the second and third thicknesses T2 and T3, and the second and third thicknesses T2 and T3 may be the same as, similar to, or different from each other. As used herein, the term "thickness" is intended in its ordinary usage unless clearly contraindicated by context. For example, thickness is intended to refer to the distance between opposite surfaces of a component or layer.

The gate electrodes 343, 345 and 347 may be formed between insulation patterns 115, respectively, and thus may be formed at a plurality of levels, respectively, to be spaced apart from each other. That is, the insulation patterns 115 and the gate electrodes 343, 345, and 347 may be alternately and repeatedly stacked (sequentially stacked) on the substrate 100 in the first direction. Each of the gate electrodes 343, 345 and 347 may extend in the second direction, and a plurality of gate electrodes 343, 345 and 347 may be formed along the third direction. That is, each of the gate electrodes 343, 345 and 347 extending in the second direction may be spaced apart from each other in the third direction by the second spacer 350 and the CSL 360, which are formed in a second opening 290 (see FIG. 1) extending in the second direction.

An upper surface, a lower surface, and a sidewall of each of the gate electrodes 343, 345 and 347 may be covered by the second blocking pattern 310. Also, the second blocking pattern 310 may cover sidewalls of the insulation patterns 115, sidewalls of the first and second insulating interlayers 130 and 280, and a part of the upper surface of the substrate 100. The second blocking pattern 310 may extend in the first direction while having a concavo-convex shape as a whole.

The channel 245 may extend along the first direction on the semiconductor pattern 150 formed on the substrate 100, and may penetrate the insulation pattern 115, and second and third gate electrodes 345 and 347, which are alternately stacked.

The semiconductor pattern 150 may have a pillar shape, e.g., a cylinder shape.

In one embodiment, an upper surface of the semiconductor pattern 150 may be disposed between an upper surface and a lower surface of the insulation pattern 115 having the third thickness T3 (of the plurality of insulation patterns 115).

The channel 245 may penetrate the insulation patterns 115 above a first gate electrode 343, and the insulation patterns 115 above and below second and third gate electrodes 345 and 347. In example embodiments, the channel 245 may have a cup shape, and an inner space of the cup shape may be filled by the third buried pattern 250 of a pillar shape. Alternatively, the channel 245 may also have a pillar shape, and in this case, the third buried pattern 250 may not be formed (not illustrated). A plurality of channels 245 may be formed along the second and third directions, respectively, and thus a channel array may be defined.

The charge storage structure may have a cup shape of which a center of a lower surface is penetrated, and the cup shape may surround an outer sidewall of the channel 245 and extend in the first direction. The charge storage structure may include a tunnel insulation pattern 225, a charge trapping pattern 185, and a first blocking pattern 175 that are sequentially stacked between the channel 245, and each of the second and third gate electrodes 345 and 347 along the third direction. In some example embodiments, the charge storage structure may also include one or more buried pattern structures 210, as explained below.

A plurality of buried pattern structures 210 may be formed between the channel 245 and each of the insulation patterns 115 along the first direction, and may be surrounded by the tunnel insulation pattern 225 and the charge trapping pattern 185 to contact each of the tunnel insulation pattern 225 and the charge trapping pattern 185. Each of the buried pattern structures 210 may include an inner sidewall contacting the tunnel insulation pattern 225 and an outer sidewall contacting the charge trapping pattern 185. In example embodiments, each of the inner sidewall and the outer sidewall of the buried pattern structure 210 may have a concave shape toward the channel 245.

In example embodiments, the buried pattern structure 210 may include first and second buried patterns 196 and 206 sequentially stacked from an inner sidewall of the charge trapping pattern 185 along the third direction. The first buried pattern 196 may cover an outer sidewall, an upper surface, and a lower surface of the second buried pattern 206, and an inner sidewall of the first buried pattern 196 may be covered by the tunnel insulation pattern 225.

It shall be understood that in the example embodiments, the terms "inner" and "outer" are relative terms with meanings that are understood by context. For example, at least with respect to FIGS. 2A and 2B, an inner sidewall is intended to refer to the sidewall that is closest to the third buried pattern 250 and an outer sidewall is intended to refer to the sidewall that is farthest from the third buried pattern 250. Likewise, it shall be understood that in the example embodiment, the terms "upper" and "lower" are relative terms with meanings that are understood by context. For example, at least with respect to FIGS. 2A and 2B, an upper surface is intended to refer to a surface that is farthest from substrate 100 and a lower surface is intended to refer to a surface that is closest to the substrate 100. Additionally, the relative term "upper surface" may also refer to a surface that is above a "lower surface" of the same element.

In example embodiments, the first buried pattern 196 may include an oxide, e.g., a silicon oxide, and the second buried pattern 206 may include, e.g., a silicon oxide or a silicon oxynitride. Accordingly, when the first and second buried patterns 196 and 206 are formed of the same material and/or composite material, they may be merged with each other. For example, when first buried pattern 196 is formed of silicon oxide and second buried pattern 206 is formed of silicon oxide the patterns 196, 206 are merged whereas when first buried pattern 196 is formed of silicon oxide and second buried pattern 206 is formed of silicon oxynitride the patterns 196, 206 are not merged.

In example embodiments, the buried pattern structure 210 may be formed in a space between the tunnel insulation pattern 225 and the charge trapping pattern 185 adjacent the insulation patterns 115 having the first thickness T1, and may not be formed in spaces between the tunnel insulation patterns 225 and the charge trapping patterns 185 adjacent the insulation patterns 115 having the second to fourth thicknesses T2, T3 and T4. In other example embodiments, the buried pattern structure 210 may be formed in the space between the tunnel insulation pattern 225 and the charge trapping pattern 185 adjacent to the insulation pattern 115 having the third thickness T3.

In example embodiments, the charge storage structure may extend along the first direction and contact the outer sidewall (adjacent sidewall) of the channel 245, and for each portion of the charge storage structure formed between the channel 245 and one of the second to third gate electrodes 345 and 347, the portion (referred to as an "gate-electrode-adjacent portion") may have an inner sidewall and an outer sidewall vertical to the upper surface of the substrate 100. Also, for each portion of the charge storage structure formed between the insulation pattern 115 and the channel 245 (referred to as an "insulation-pattern-adjacent portion"), the portion may each have an outer sidewall vertical to the upper surface of the substrate 100.

In example embodiments, a maximum thickness of a first portion of the charge trapping pattern 185 having a vertical slope with respect to the upper surface of the substrate 100 and being horizontally between the channel 245 and gate electrode 345 is less than or equal to a maximum thickness of a second portion of the charge trapping pattern 185 having a vertical slope with respect to the upper surface of the substrate 100 and being horizontally between the channel 245 and an insulation pattern 115.

In example embodiments, the charge storage structure may have a plurality of portions having vertical slope (see e.g., region X of FIG. 2A). It shall be understood that the terms "vertical slope" or "vertically sloped" are relative terms with a meaning that is understood by context. In this example, the term "vertical slope" is intended to refer to a vertical slope with respect to substrate 100. That is, substrate 100 may extend horizontally in the third direction and another "vertically sloped" element may extend vertically in the first direction perpendicular to an upper surface of substrate 100. Additionally, in example embodiments, the thickness of the charge trapping pattern 185 may be constant throughout the pattern, i.e., an internal thickness from immediately adjacent and corresponding surfaces. The first insulating interlayer 130 may be formed on a first structure including the buried pattern structure 210, the charge storage structure, the channel 245, and the uppermost insulation pattern 115. The pad 270 may penetrate the first insulating interlayer 130 to contact an upper surface of the first structure. The second insulating interlayer 280 may be formed on the first insulating interlayer 130 and the pad 270.

The second spacer 350 may be formed on a sidewall of the second opening 290 penetrating the insulation patterns 115 and the gate electrodes 343, 345, and 347 to expose the upper surface of the substrate 100. The second spacer 350 may extend in the second direction, and the CSL 360 may fill a remaining portion of the second opening 290.

The third insulating interlayer 370 may be formed on the second insulating interlayer 280, the CSL 360, the second spacer 350 and the second blocking pattern 310. The contact plug 380 may penetrate the second and third insulating interlayers 280 and 370 to contact an upper surface of the pad 270. The bit line 400 may penetrate the fourth insulating interlayer 390 to contact an upper surface of the contact plug 380. In example embodiments, the bit line 400 may extend in the third direction, and a plurality of bit lines 400 may be formed along the second direction.

As described above, the buried pattern structure 210 may be formed on each of the portions of the charge storage structure between the insulation patterns 115 and the channel 245, and each of the portions of the charge trapping pattern 185 between the insulation patterns 115 and the channel 245 that are adjacent first buried pattern structure 210 may have a curved shape, so that a lateral charge loss of the charge trapping pattern 185 may be reduced. For example, portions of charge trapping pattern 185 between insulation patterns 115 and channel 245 may have more of a curved shape (more greatly curved) than other vertically sloped portions (or less accentuated portions) of charge trapping pattern 185.

Also, because the second and third gate electrodes 345 and 347 and the insulation patterns 115 (alternately and repeatedly stacked on the substrate 100) may be formed to have a concavo-convex shape, the outer sidewall of the charge storage structure contacting the second and third gate electrodes 345 and 347 and the insulation patterns 115 may also be formed to have the concavo-convex shape as a whole. Accordingly, since the charge storage structure may be at least partially interposed between the second and third gate electrodes 345 and 347, the interference between the second and third electrodes 345 and 347 may be minimized, the occurrence of coupling between the second electrodes 345 serving as word lines may be reduced, and thus the electrical characteristics of the vertical memory device may be improved.

FIGS. 3 to 22 are cross-sectional views illustrating stages of a method of manufacturing a vertical device in accordance with example embodiments. Specifically, FIGS. 3-7, 9, 15 and 17-22 are cross-sectional views taken along the line A-A' of FIG. 1, and FIGS. 8, 10-14 and 16 are enlarged cross-sectional views of the region X of each corresponding cross-sectional view.

Figure 3:
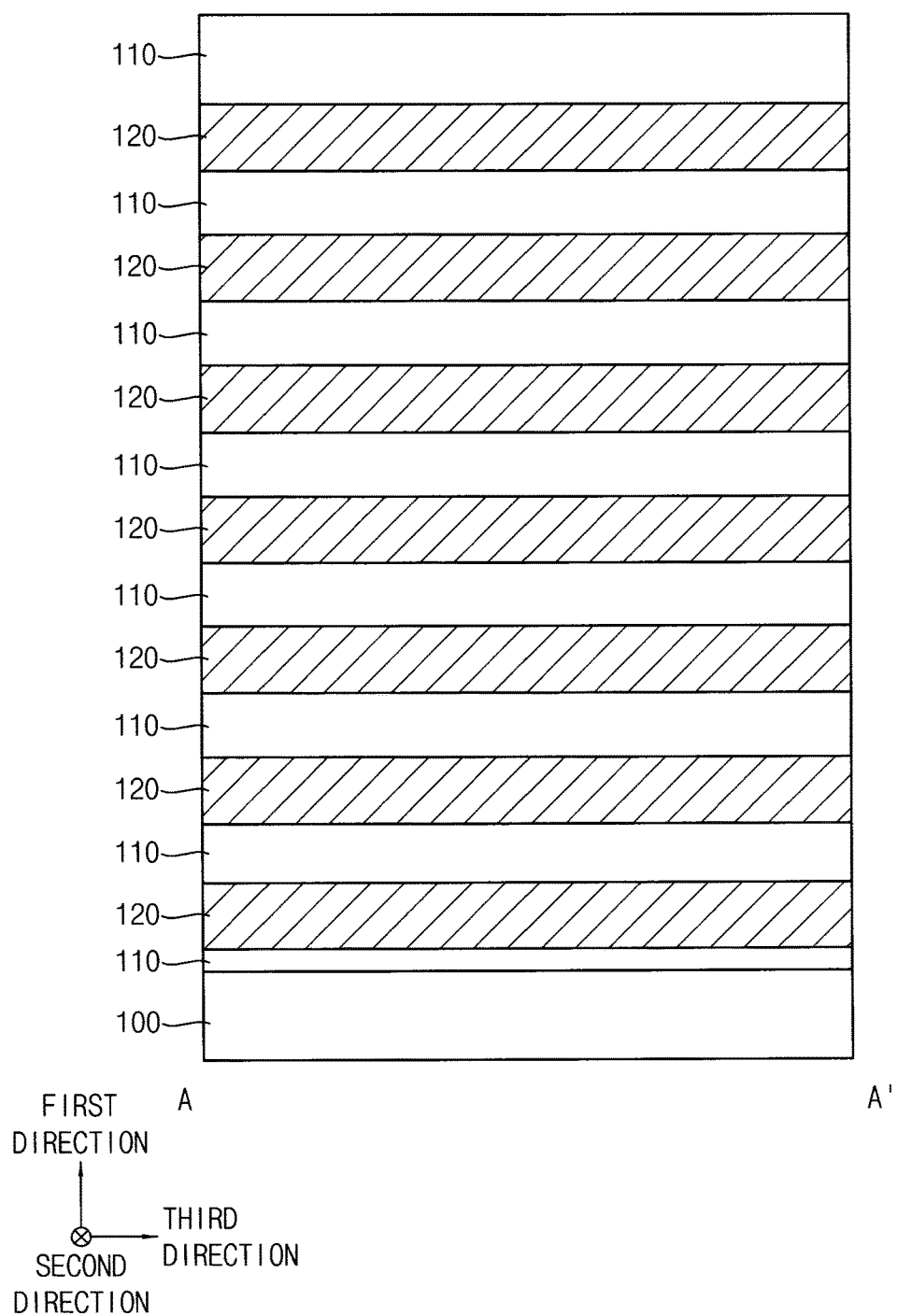
FIGS. 3 to 22 are cross-sectional views illustrating stages of a method of manufacturing a vertical device in accordance with example embodiments.

Referring to FIG. 3, an insulation layer 110 and a sacrificial layer 120 may be alternately and repeatedly stacked on a substrate 100. Accordingly, a plurality of insulation layers 110 and a plurality of sacrificial layers 120 may be alternately stacked along the first direction. FIG. 3 illustrates that eight levels of the insulation layers 110 and seven levels of the sacrificial layers 120 are alternately formed on the substrate 100, however, the inventive concept is not limited thereto, and each of the insulation layers 110 and the sacrificial layer 120 may be formed in a larger number or a smaller number.

The insulation layer 110 and the sacrificial layer 120 may be formed by a process, e.g., a chemical vapor deposition (CVD) process, a plasma enhanced chemical vapor deposition (PECVD) process, an atomic layer deposition (ALD) process, etc. Especially, a lowermost insulation layer 110 formed directly on an upper surface of the substrate 100 may be also be formed by a thermal oxidation process on the upper surface of the substrate 100.

The insulation layer 110 may include a silicon oxide, e.g., PE-TEOS, HDP oxide, PEOX, or the like. The sacrificial layer 120 may include a material having an etch selectivity with respect to the insulation layer 110, e.g., silicon nitride.

Figure 4:
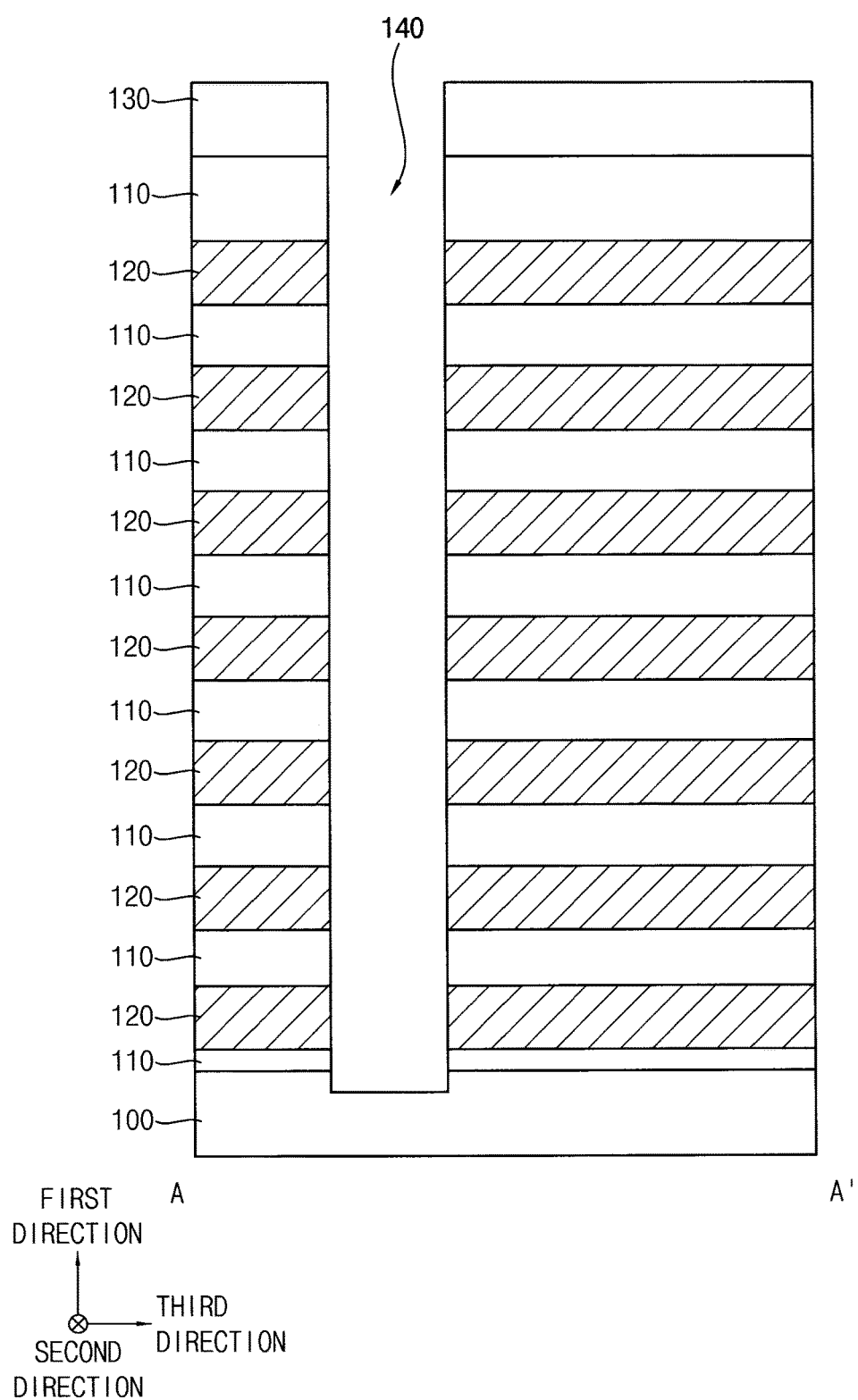

Referring to FIG. 4, after forming a first insulating interlayer 130 on an uppermost insulation layer 110, an etching process using an etching mask (not shown) may be performed to etch the first insulating interlayer 130, the insulation layers 110 and the sacrificial layers 120 under the etching mask, and thus a channel hole 140 may be formed to penetrate the first insulating interlayer 130, the insulation layers 110 and the sacrificial layers 120, and expose the upper surface of the substrate 100.

Figure 5:
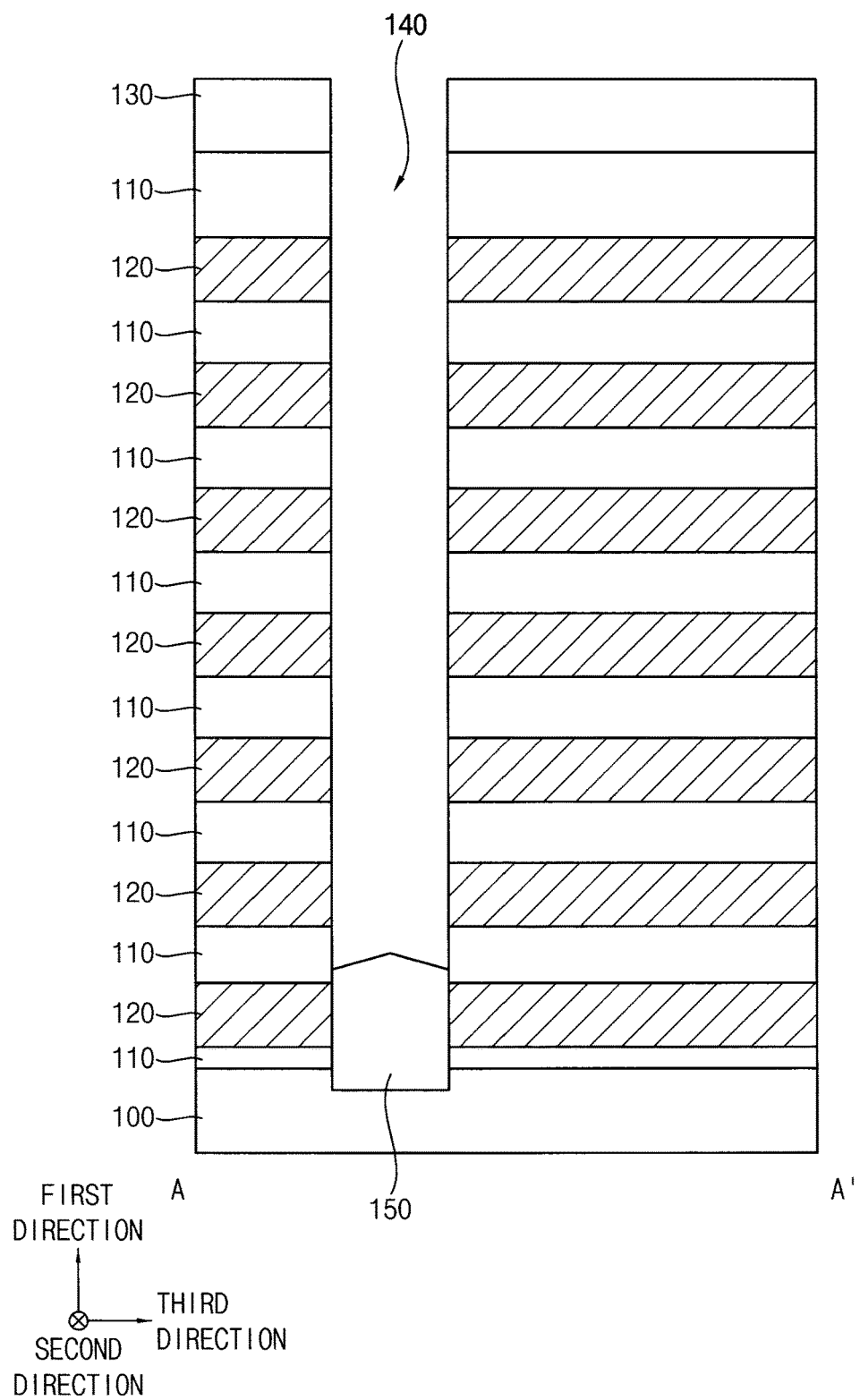

Referring to FIG. 5, a semiconductor pattern 150 may be formed to partially fill the channel hole 140.

For example, a selective epitaxial growth (SEG) process using the upper surface of the substrate 100 exposed by the channel hole 140 as a seed may be performed to form the semiconductor pattern 150 partially filling the channel hole 140. Accordingly, the semiconductor pattern 150 may include single crystalline silicon or single crystalline germanium according to the material of the substrate 100, and may be doped with impurities.

Alternatively, after forming an amorphous silicon layer to fill the channel hole 140, a laser epitaxial growth (LEG) process or a solid phase epitaxy (SPE) process may be performed on the amorphous silicon layer to form the semiconductor pattern 150.

In example embodiments, an upper surface of the semiconductor pattern 150 may be disposed between an upper surface and a lower surface of an insulation layer 110 formed at a second level from the upper surface of the substrate 100 in the first direction among the insulation layers 110.

The semiconductor pattern 150 may be served as a channel similarly to a channel 245 (see FIG. 17) formed subsequently, and thus may be referred to as a lower channel.

Figure 6:
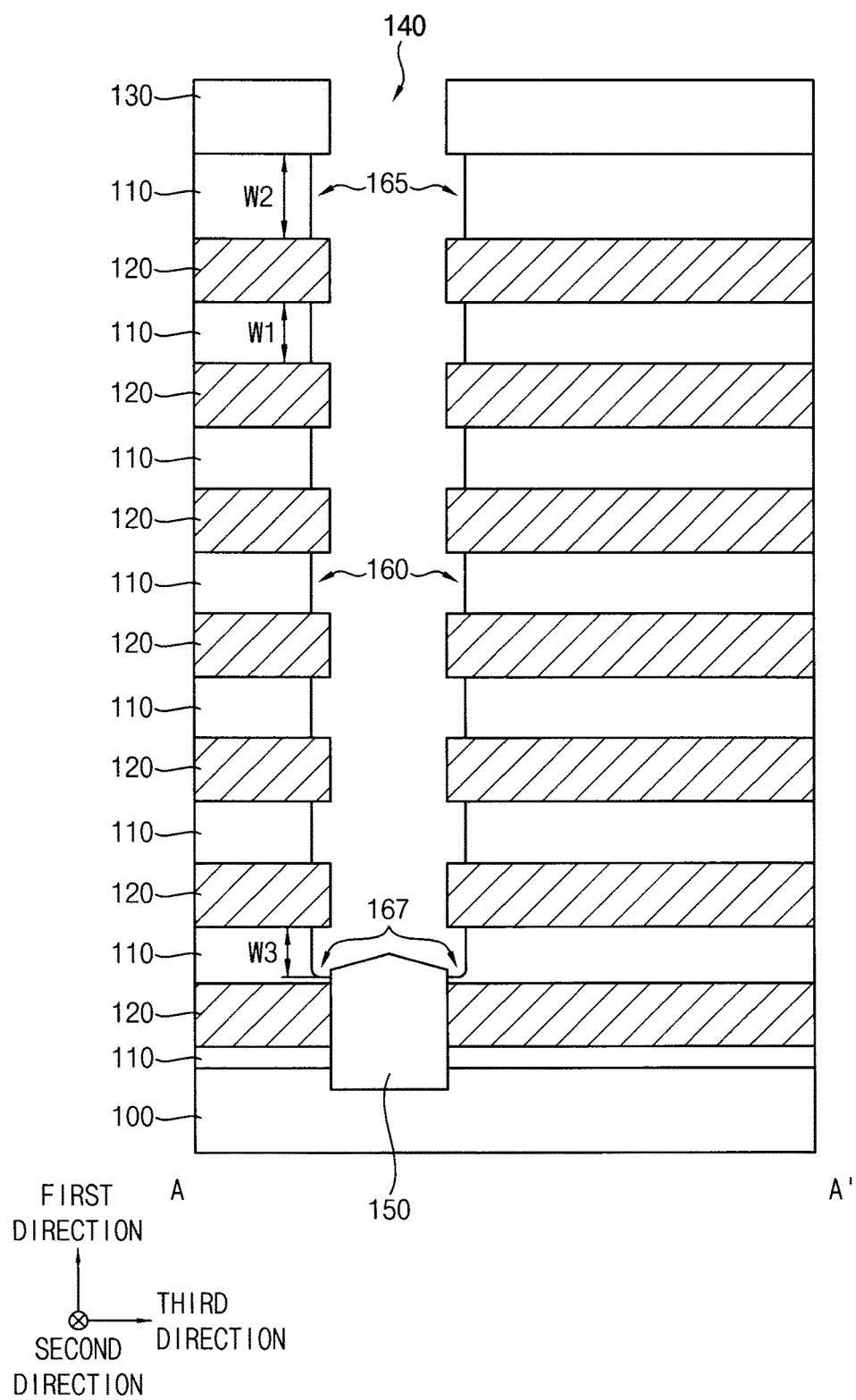

Referring to FIG. 6, a sidewall of each of the insulation layers 110 exposed by the channel hole 140 may be partially removed to form first to third recesses 160, 165, and 167.

In example embodiments, the first to third recesses 160, 165, and 167 may be formed by a dry etching process or a wet etching process.

Each of the first to third recesses 160, 165, and 167 may be formed by not completely (partially) removing each of the insulation layers 110, and the recesses 160, 165, and 167 may have, e.g., a constant depth in the third direction. As each of the insulation layers 110 may have a constant depth in the third direction, the insulation layers 110 and the sacrificial layers 120 alternately and repeatedly stacked, and the first insulating interlayer 130 may have a concavo-convex shape as a whole along the first direction.

In example embodiments, the first and second recesses 160 and 165 having first and second widths W1 and W2 may be formed on insulation layers 110 having first and second thicknesses T1 and T2 that may be substantially the same as the first and second widths W1 and W2, respectively. The third recess 167 having a third width W3 may be formed on an insulation layer 110 having a third thickness T3 that may be greater than the third width W3, and no recess may be formed on an insulation layer 110 having a fourth thickness T4. That is, no recess may be formed on the lowermost insulation layer 110 of which a sidewall may be covered by the semiconductor pattern 150 that may be formed on a lower portion of the channel hole 140, and the third recess 167 having the third width W3 that may be smaller than the third thickness T3 may be formed on the insulation layer 110 formed at the second level from the upper surface of the substrate 100 of which a sidewall may be partially covered by the semiconductor pattern 150.

Figure 7:
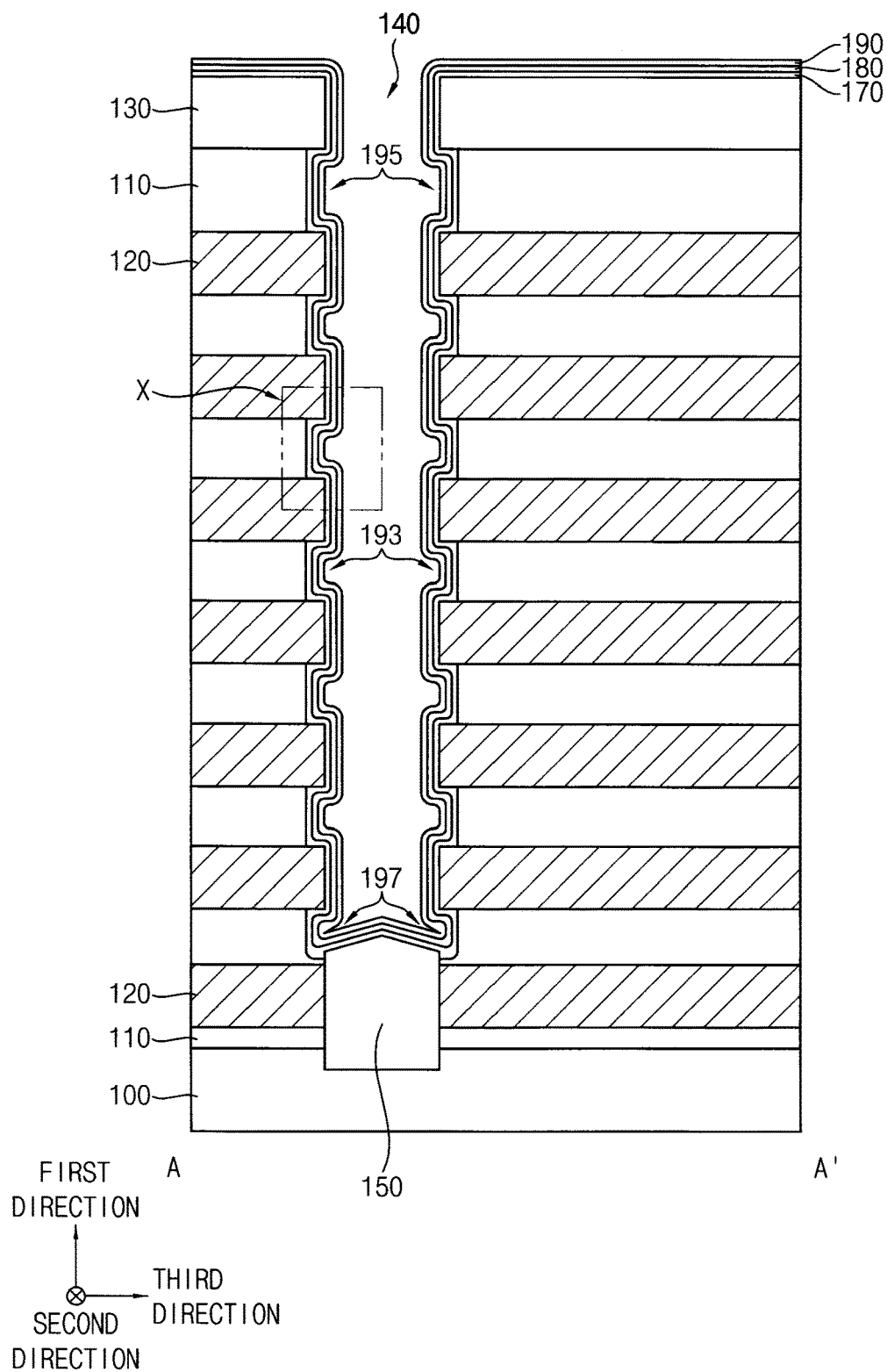
Figure 8:
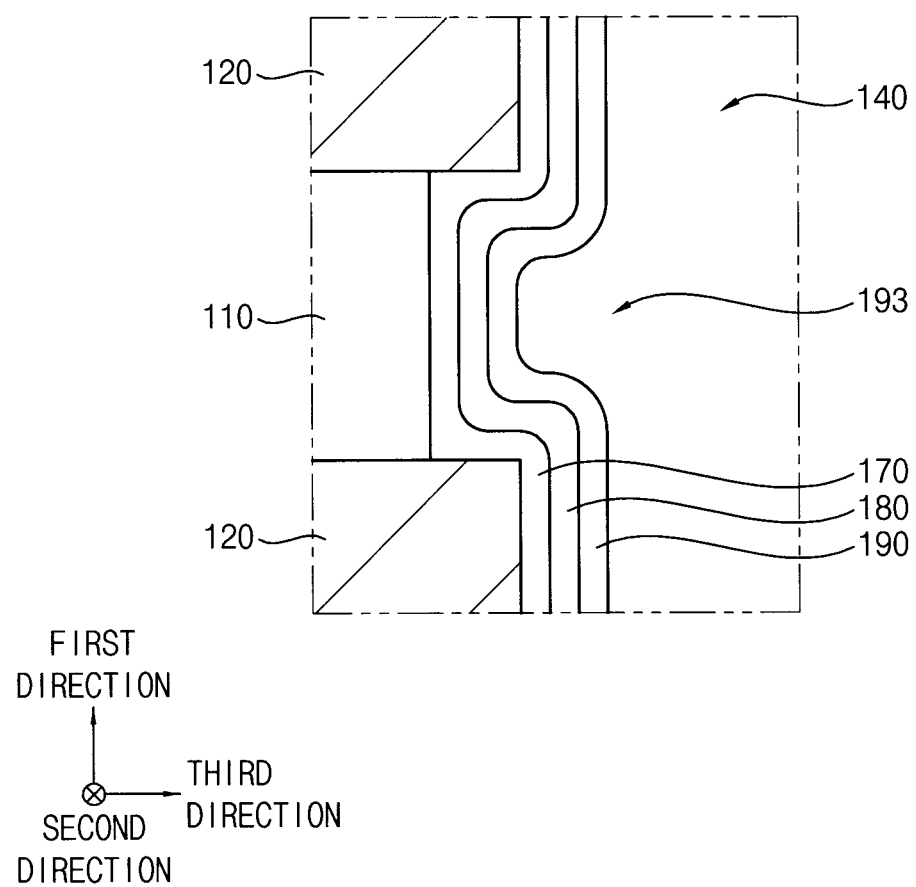

Referring to FIGS. 7 and 8, a first blocking layer 170, a charge trapping layer 180 and a first buried layer 190 may be sequentially formed on a sidewall of the channel hole 140, inner walls of the first to third recesses 160, 165, and 167, the upper surface of the semiconductor pattern 150, and an upper surface of the first insulating interlayer 130.

The first blocking layer 170, the charge trapping layer 180, and the first buried layer 190 may be sequentially formed along surfaces of the insulation layers 110 and the sacrificial layers alternately and repeatedly stacked, and a surface of the first insulating interlayer 130. Since the insulation layers 110 and the sacrificial layers 120 alternately and repeatedly stacked, and the first insulating interlayer 130 may have the concavo-convex shape as a whole along the first direction, the first blocking layer 170, the charge trapping layer 180 and the first buried layer 190 may also have a concavo-convex shape as a whole along the first direction corresponding thereto.

The first blocking layer 170 may be formed to further fill an inner edge portion of each of the first to third recesses 160, 165 and 167, according to the properties of the material thereof and/or the characteristics of the process. However, each of the charge trapping layer 180 and the first buried layer 190 may be conformally formed to have a constant thickness.

In example embodiments, portions of the first blocking layer 170, the charge trapping layer 180, and the first buried layer 190 (each having a varying slope with respect to the upper surface of the substrate 100) may have non-uniform thicknesses, however, at least portions thereof (each having a vertical slope with respect to the upper surface of the substrate 100) may have uniform thicknesses.

Fourth to sixth recesses 193, 195, and 197 corresponding to the first to third recesses 160, 165, and 167 on the insulation layers 110 may be formed on the first buried layer 190. The fourth to sixth recesses 193, 195, and 197 may have widths smaller than the first to third recesses 160, 165, and 167, respectively.

The first blocking layer 170 and the first buried layer 190 may each include an oxide, e.g., silicon oxide, and the charge trapping layer 180 may include a nitride, e.g., silicon nitride. In one embodiment, each of the first blocking layer 170 and the first buried layer 190 may include the same material as the insulation layer 110, and thus may be merged with the insulation layer 110.

Figure 9:
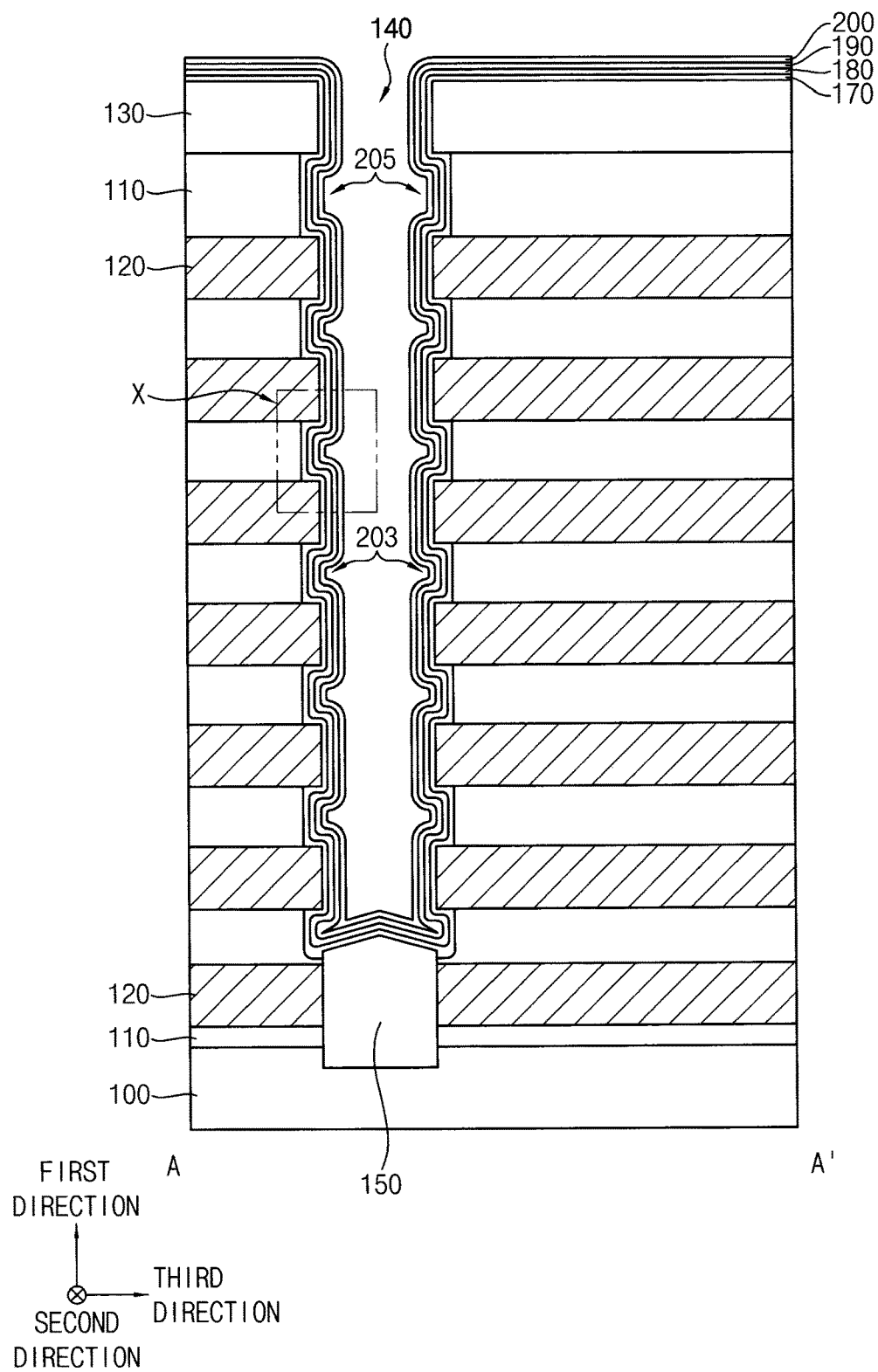
Figure 10:
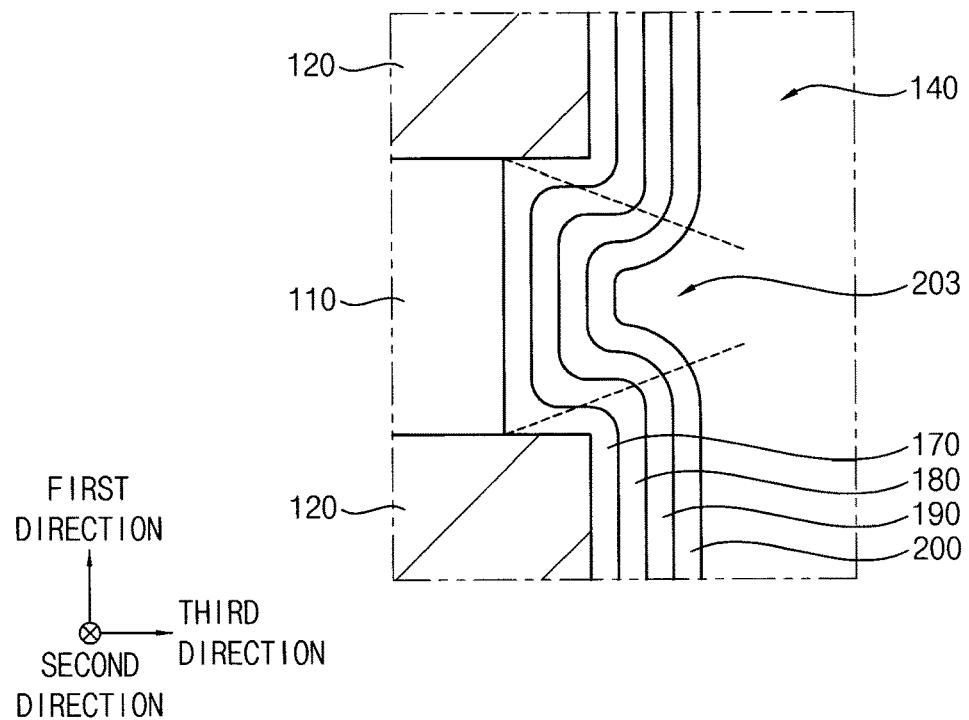

Referring to FIGS. 9 and 10, a second buried layer 200 may be conformally formed on the first buried layer 190. The second buried layer 200 may include a first portion adjacent to each of the sacrificial layers 120 along the third direction, and a second portion adjacent to each of the insulation layers 110 along the third direction.

Seventh and eighth recesses 203 and 205 corresponding to the fourth and fifth recesses 193 and 195 (see FIG. 7) on the first buried layer 190 may be formed in the second portion of the second buried layer 200. The seventh and eighth recesses 203 and 205 (see FIG. 9) may have widths smaller than the fourth and fifth recesses 193 and 195, respectively. FIG. 9 illustrates that no recess corresponding to the sixth recess 197 on the first buried layer 190 is formed on the second buried layer 200, however, the inventive concept is not limited thereto, and a ninth recess corresponding to the sixth recess 197 may also be formed on the second buried layer 200.

In example embodiments, a portion of the second buried layer 200 having a vertical slope with respect to the upper surface of the substrate 100 may have a constant thickness.

The second buried layer 200 may include a nitride, e.g., silicon nitride.

Figure 11:
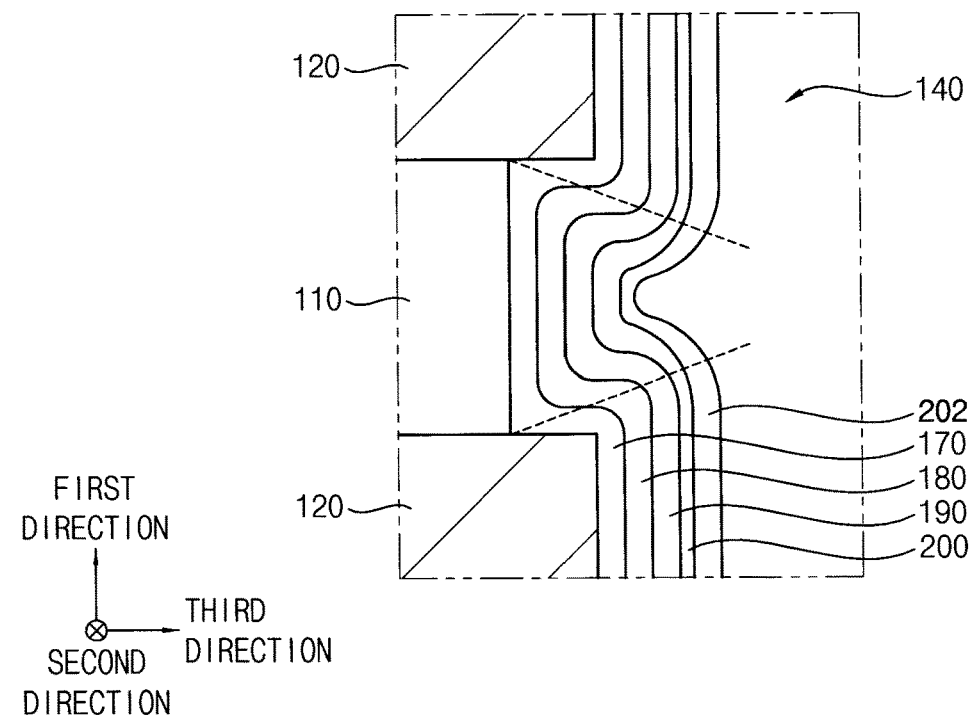

Referring to FIG. 11, a first oxidation process may be performed on the second buried layer 200, and the first portion adjacent to each of the sacrificial layers 120 and the second portion adjacent to each of the insulation layers 110 of the second buried layer 200 may be oxidized, respectively. Accordingly, a first oxide layer 202 may be formed on the second buried layer 200, and the thickness of the second buried layer 200 may be reduced.

As the seventh recess 203 or the eighth recess 205 may be formed on the second portion of the second buried layer 200, a surface of the second portion of the second buried layer 200 may be less exposed than that of the first portion, and may be less affected by the first oxidation process. Accordingly, a fourth portion of the first oxide layer 202 formed by the oxidation of the surface of the second portion of the second buried layer 200 may have a smaller thickness than a third portion of the first oxide layer 202 formed by the oxidation of the surface of the first portion of the second buried layer 200. For example, as illustrated by FIG. 11 the thickness of a portion of first oxide layer 202 in the central region of the area between the two diagonal dashed lines (fourth portion) is less than the thickness of a portion of first oxide layer 202 outside of the central region of the area between the two diagonal dashed lines (third portion).

In example embodiments, the thickness of the fourth portion of the first oxide layer 202 may be decreased as a surface thereof exposed by the channel hole 140 is close to each of the insulation layers 110.

The first oxide layer 202 may include, e.g., a silicon oxide or a silicon oxynitride.

Figure 12:
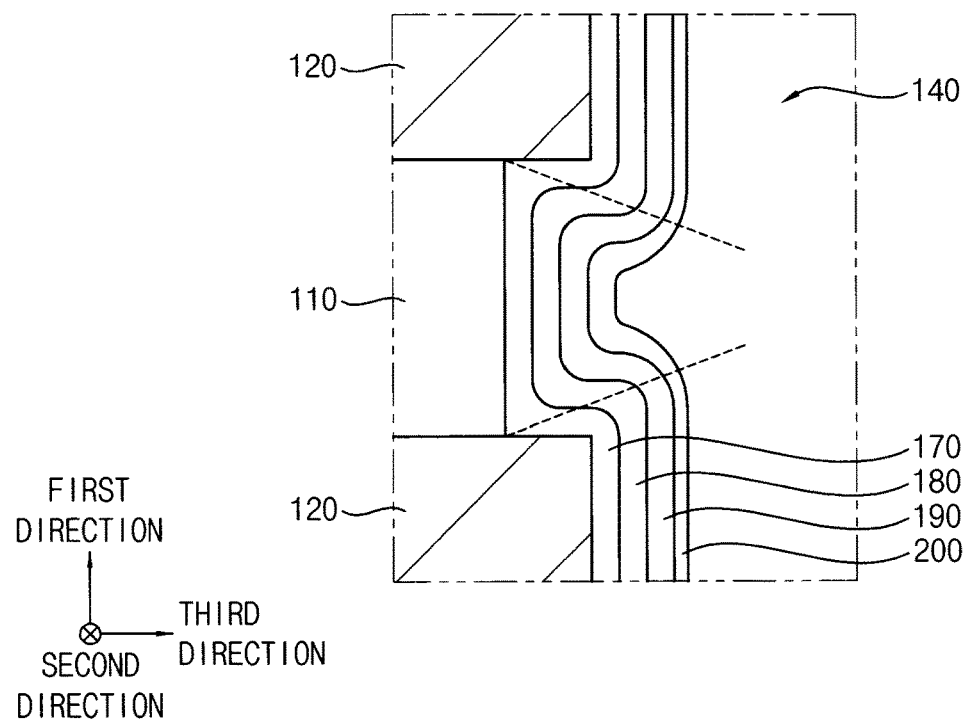

Referring to FIG. 12, a first etching process may be performed to selectively remove only the first oxide layer 202, and thus the surface of the second buried layer 200 may be exposed by the channel hole 140. Since the third and fourth portions of the first oxide layer 202 may have different thicknesses from each other, the first and second portions of the second buried layer 200 may also have different thicknesses from each other.

In example embodiments, the first portion of the second buried layer 200 may have a constant thickness, however, the second portion of the second buried layer 200 may have an increasing thickness toward the insulation layer 110.

The first etching process may include a wet etching process or a dry etching process.

Figure 13:
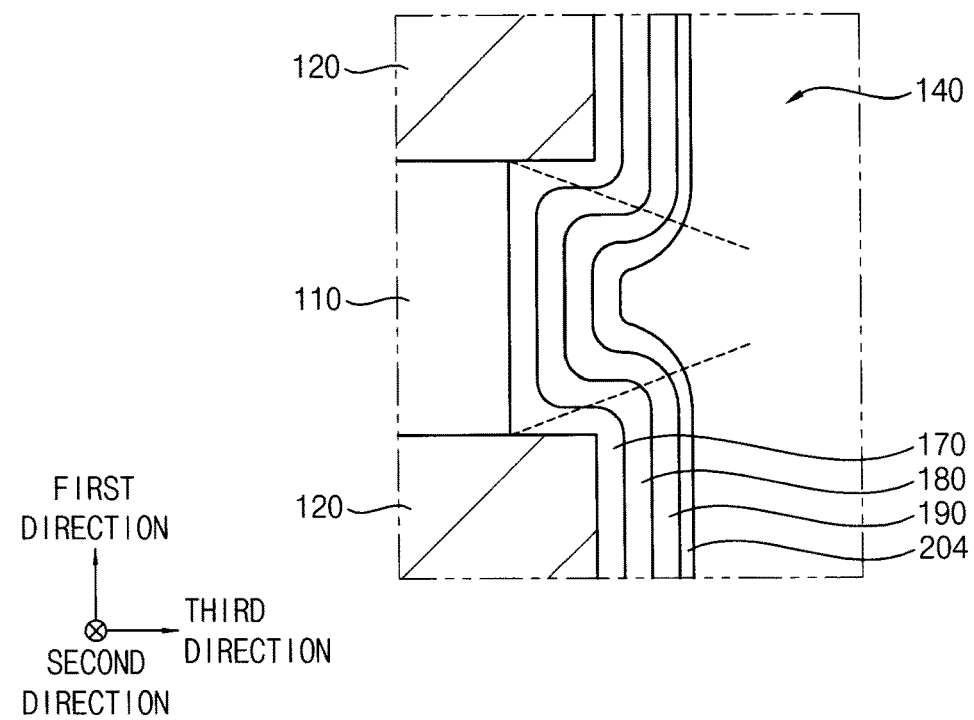

Referring to FIG. 13, a second oxidation process may be performed to oxidize all of the first and second portions of the second buried layer 200, and thus a second oxide layer 204 may be formed on the first buried layer 190.

The second oxide layer 204 may include, e.g., a silicon oxide or a silicon oxynitride, and may be merged with the first buried layer 190 in the case that the second oxide layer 204 and the first buried layer 190 may include the same, or substantially the same material as each other.

Figure 14:
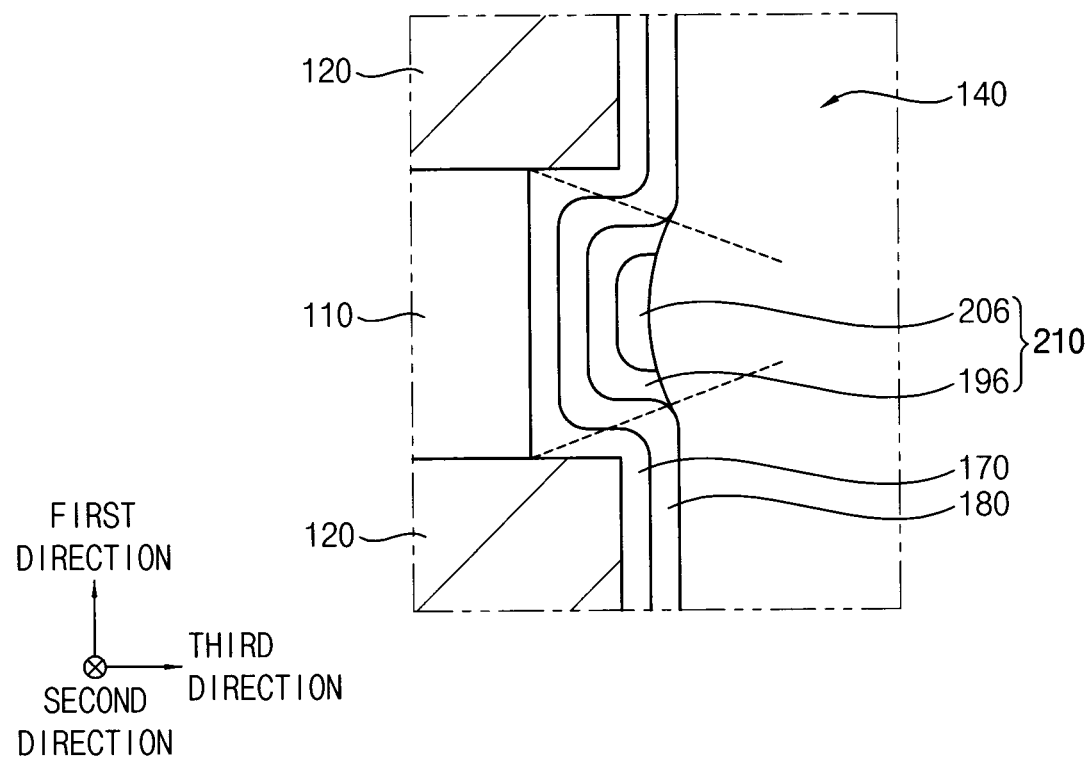

Referring to FIG. 14, a second etching process may be performed until a surface of the charge trapping layer 180 horizontally adjacent to each of the sacrificial layers 120 may be exposed, and the second oxide layer 204 and the first buried layer 190 may be removed from the charge trapping layer 180 by a predetermined thickness. For example, as illustrated in FIG. 14, the portions of second oxide layer 204 and first buried layer 190 horizontally adjacent sacrificial layers 120 are completely removed by the second etching process. Accordingly, a first buried pattern 196 and a second buried pattern 206 may be formed, and they may together form a buried pattern structure 210. Additionally, portions of charge trapping layer 180 horizontally adjacent sacrificial layers 120 may be selectively etched such that corresponding portions of charge trapping layer 180 have alternate thicknesses. For example, portions of charge trapping layer 180 horizontally adjacent sacrificial layers 120 may have a thickness less than portions of charge trapping layer 180 horizontally adjacent insulation layer 110.

Portions of the second buried layer 200 and the first buried layer 190 adjacent to each of the sacrificial layers 120 may have constant thicknesses, respectively, however, portions of the second buried layer 200 and the first buried layer 190 adjacent to each of the insulation layers 110 may have increasing thicknesses toward the insulation layer 110, respectively (see FIGS. 12-13). Accordingly, the portion of the second buried layer 200 and the first buried layer 190 adjacent to each of the sacrificial layers 120 having relatively thin thickness may be completely removed, whereas the portion of the second buried layer 200 and the first buried layer 190 adjacent to each of the insulation layers 110 having relatively thick thickness may remain to form the buried pattern structure 210.

In example embodiments, a surface of the buried pattern structure 210 exposed by the channel hole 140 may have a varying slope with respect to the upper surface of the substrate 100, and a thickness of the buried pattern structure 210 may have decreased as the exposed surface thereof is close to each of the insulation layers 110. For example, a sidewall of buried pattern structure 210 may be curved away from channel hole 140 and may therefore have a nonuniform thickness with a smallest thickness corresponding to a mid-way distance between adjacent sacrificial layers 120.

The second etching process may include a wet etching process or a dry etching process.

Figure 15:
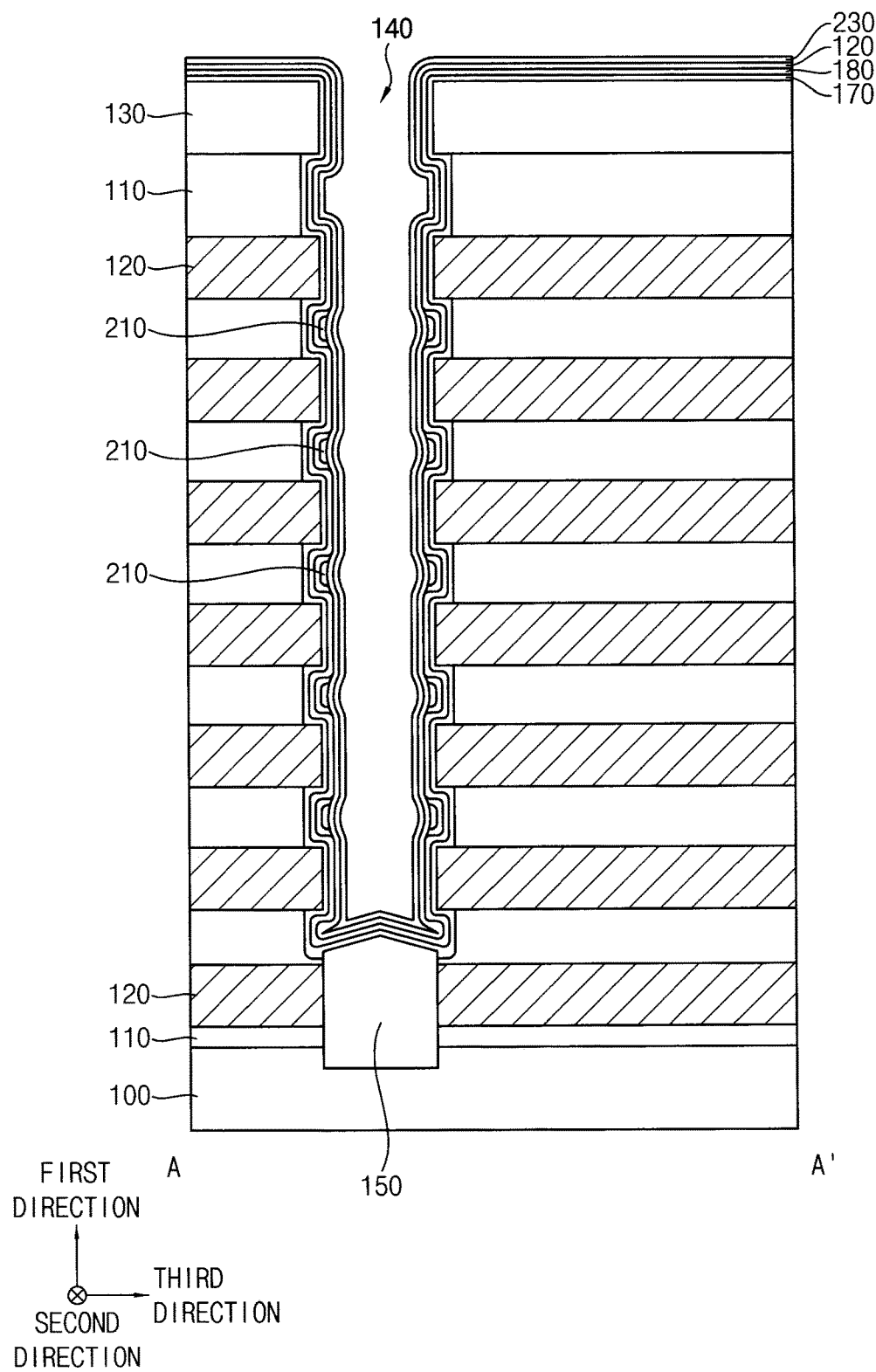
Figure 16:
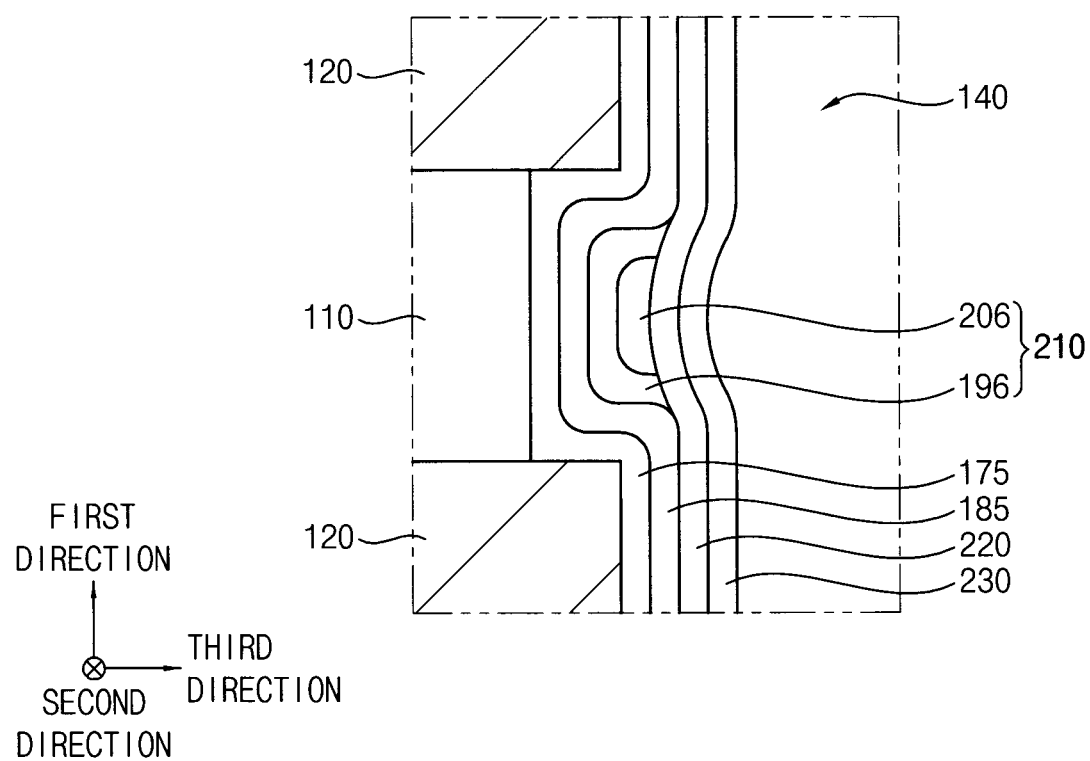

Referring to FIGS. 15 and 16, a tunnel insulation layer 220 and a first spacer layer 230 may be sequentially formed on the charge trapping layer 180 and the buried pattern structure 210.

The tunnel insulation layer 220 may include, e.g., silicon oxide, and the first spacer layer 230 may include, e.g., silicon nitride.

Figure 17:
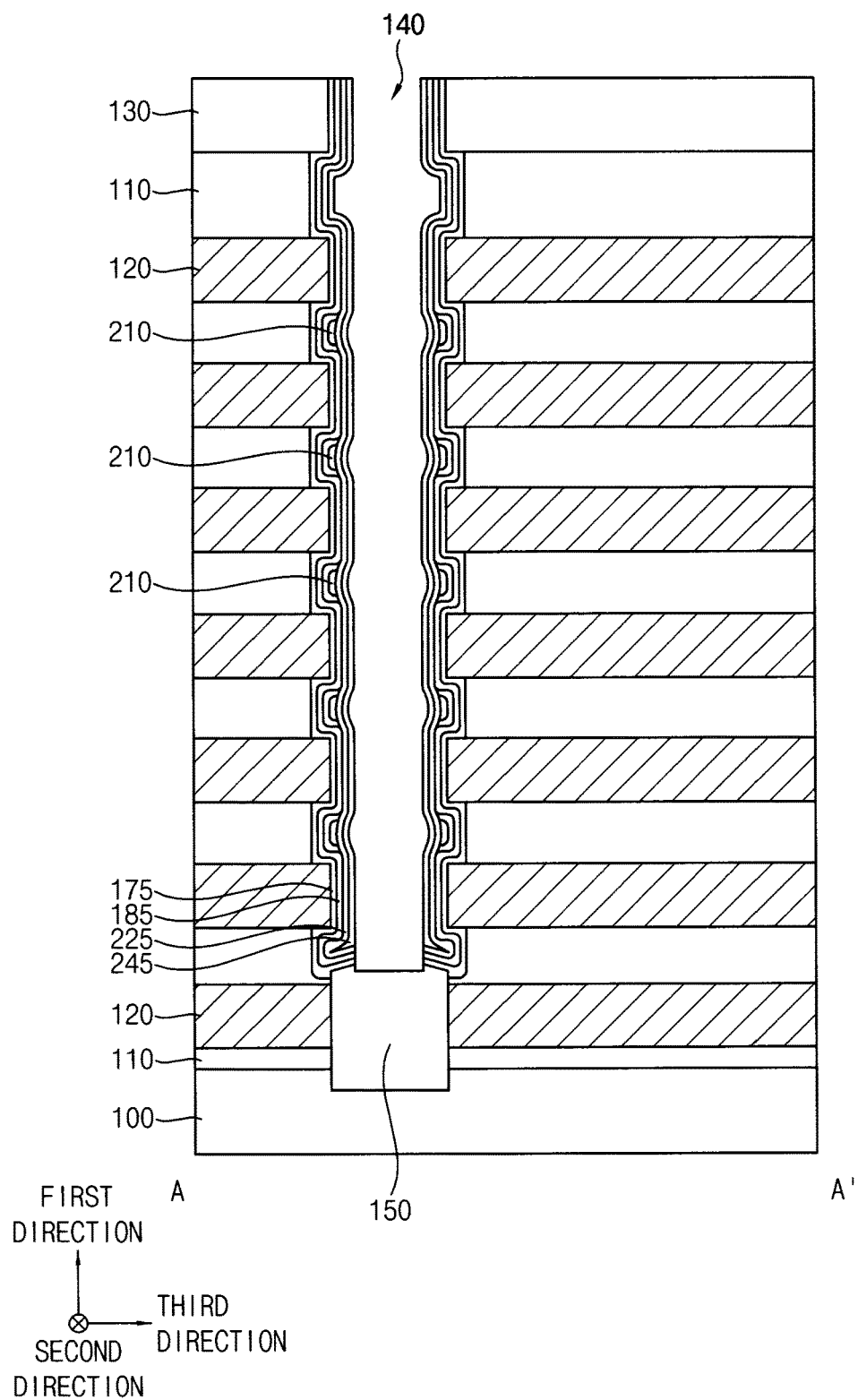

Referring to FIG. 17, the first spacer layer 230 may be anisotropically etched to form a first spacer 235 that may be formed only on the sidewall of the channel hole 140 and to expose the tunnel insulation layer 220 thereunder, and the tunnel insulation layer 220, the charge trapping layer 180 and the first blocking layer 170 may be etched using the first spacer 235 as an etching mask.

Accordingly, portions of the tunnel insulation layer 220, the charge trapping layer 180, and the first blocking layer 170 on the upper surface of the semiconductor pattern 150, and portions of the tunnel insulation layer 220, the charge trapping layer 180 and the first blocking layer 170 on the upper surface of the first insulating interlayer 130 may be removed, and an upper portion of the semiconductor pattern 150 may also be partially removed.

By the etching process, the tunnel insulation layer 220 may be converted into a tunnel insulation pattern 225, the charge trapping layer 180 may be converted into a charge trapping pattern 185, and the first blocking layer 170 may be converted into a first blocking pattern 175. Accordingly, each of the tunnel insulation pattern 225, the charge trapping pattern 185, and the first blocking pattern 175 may have a cup shape of which a center of a lower surface is penetrated. The buried pattern structure 210 between the charge trapping pattern 185 and the tunnel insulation pattern 225 may have a ring shape.

The tunnel insulation pattern 225, the charge trapping pattern 185, and the first blocking pattern 175 altogether may form a charge storage structure.

Figure 18:
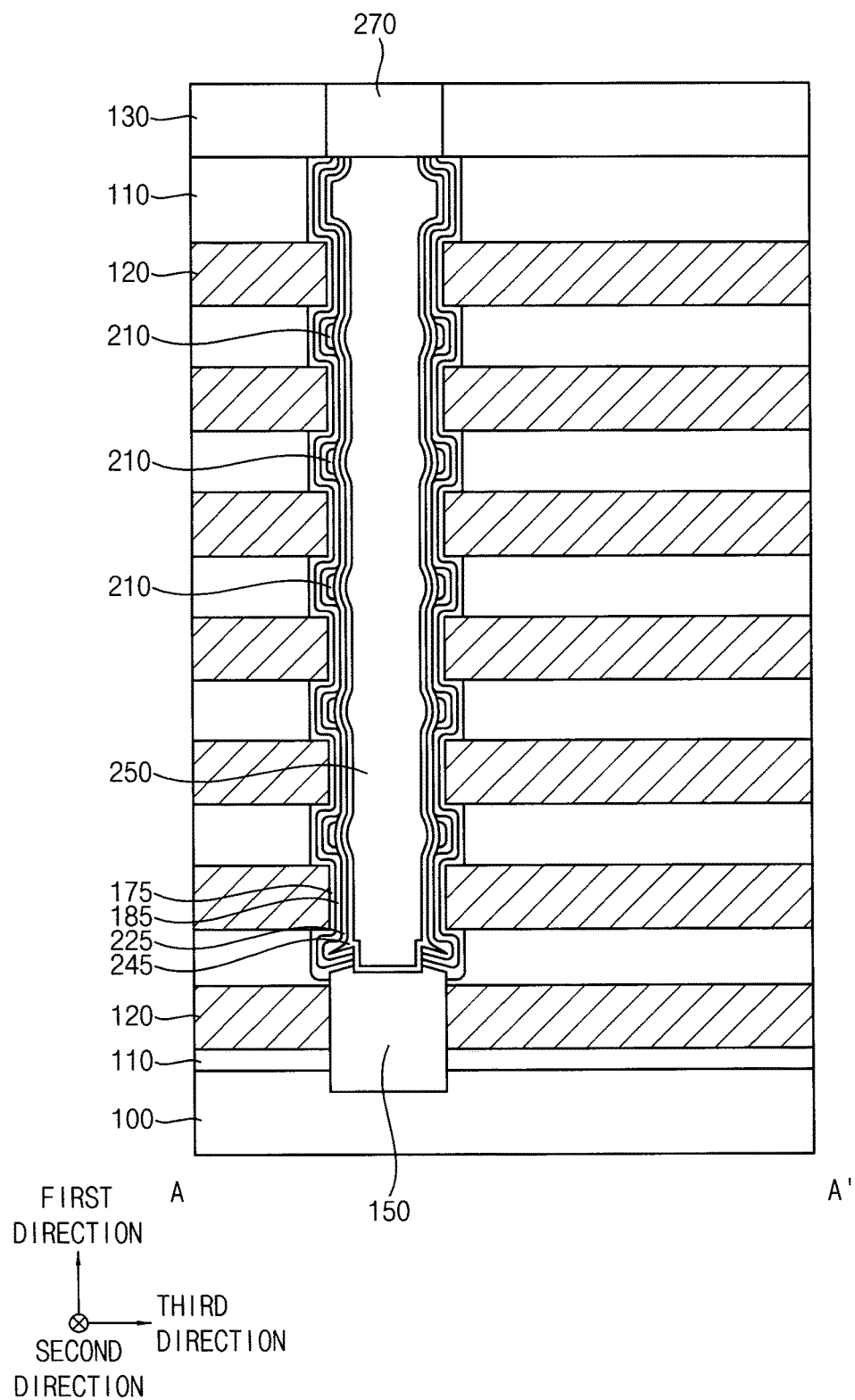

Referring to FIG. 18, after removing the first spacer 235 to expose the tunnel insulation pattern 225, a channel layer may be formed on the exposed tunnel insulation pattern 225, the semiconductor pattern 150, and the first insulating interlayer 130, and a third buried layer may be formed on the channel layer to sufficiently fill a remaining portion of the channel hole 140.

The channel layer may include, e.g., doped or undoped polysilicon, or amorphous silicon. When the channel layer includes amorphous silicon, a laser epitaxial growth (LEG) process or a solid phase epitaxy (SPE) process may be further performed to convert amorphous silicon into crystalline silicon. The third buried layer may include an oxide, e.g., silicon oxide.

By planarizing the third buried layer and the channel layer until the upper surface of the first insulating interlayer 130 may be exposed, a third buried pattern 250 may be formed to fill the remaining portion of the channel hole 140, and the channel layer may be converted into the channel 245.

Accordingly, the charge storage structure, the channel 245, and the third buried pattern 250 may be sequentially stacked on the semiconductor pattern 150 in the channel hole 140. The charge storage structure may have a cup shape of which a center of a lower surface is penetrated, and the third buried pattern 250 may have a pillar shape.

A plurality of channels 245 may be formed along each of the second and third directions to form a channel array.

An upper portion of a first structure including the third buried pattern 250, the channel 245, and the charge storage structure may be removed to form a trench, and a pad 270 may be formed to fill the trench.

Specifically, after removing the upper portion of the first structure to form the trench by an etch back process, a pad layer may be formed on the first structure and the first insulating interlayer 130 to fill the trench, and an upper portion of the pad layer may be planarized until the upper surface of the first insulating interlayer 130 may be exposed to form the pad 270. In example embodiments, the pad layer may include doped polysilicon or amorphous silicon, and when the pad layer includes amorphous silicon, a process for crystallizing it may be further performed.

Figure 19:
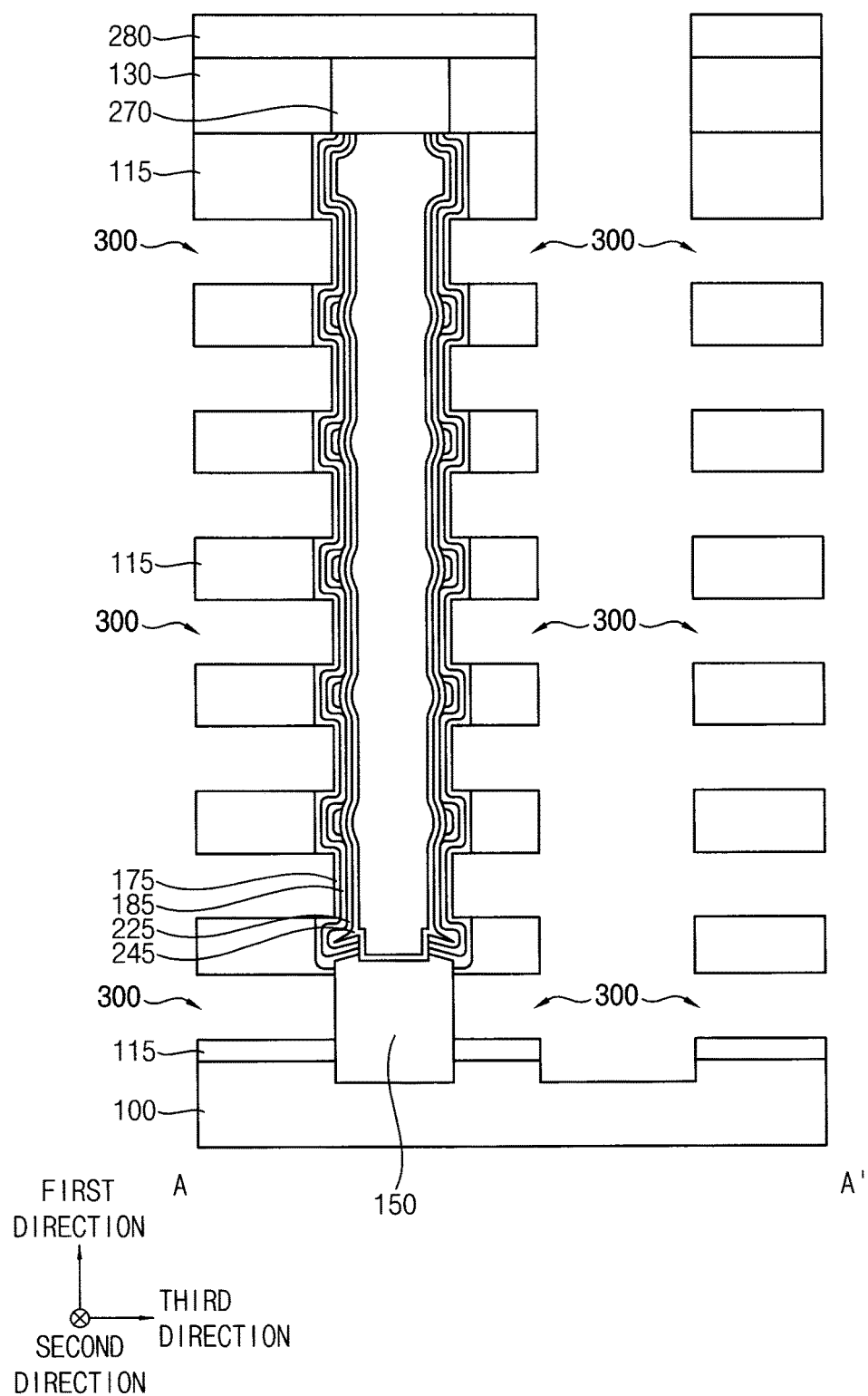
Figure 20:
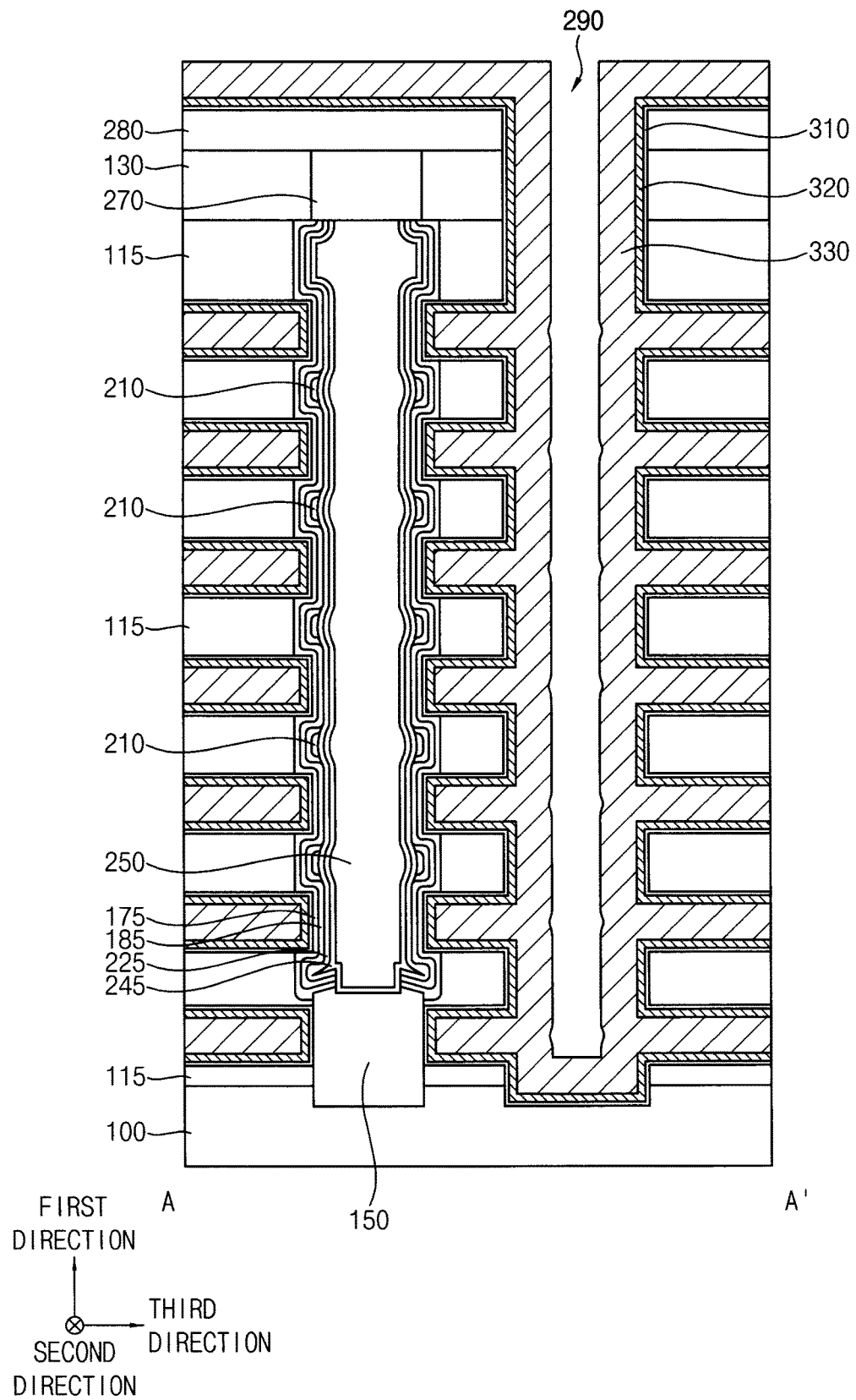

Referring to FIGS. 19 and 20, after forming a second insulating interlayer 280 on the first insulating interlayer 130 and the pad 270, a second opening 290 penetrating the first and second insulating interlayers 130 and 280, insulation layers 110, and the sacrificial layers 120 may be formed to expose the upper surface of the substrate 100 by an etching process using an etching mask.

In example embodiments, the second opening 290 may be formed to extend in the second direction, and a plurality of second openings 290 may be formed along the second direction.

As the second opening 290 is formed, the insulation layer 110 may be converted into an insulation pattern 115, and the sacrificial layer 120 may be converted into a sacrificial pattern (not shown).

The sacrificial patterns exposed by the second opening 290 may be removed to form a gap 300 between the insulation patterns 115 at each level, and a portion of an outer sidewall of the first blocking pattern 175 and a portion of a sidewall of the semiconductor pattern 150 may be exposed by the gap 300. In example embodiments, the sacrificial patterns exposed by the second opening 290 may be removed by a wet etching process using an etchant including phosphoric acid or sulfuric acid.

Referring to FIG. 20, a second blocking pattern 310 may be formed on the exposed outer sidewall of the first blocking pattern 175, the exposed sidewall of the semiconductor pattern 150, an inner wall of the gap 300, surfaces of the insulation patterns 115, the exposed upper surface of the substrate 100, and an upper surface of the second insulating interlayer 280, a gate barrier layer 320 may be formed on the second blocking pattern 310, and a gate conductive layer 330 may be formed on the gate barrier layer 320 to sufficiently fill a remaining portion of the gap 300.

The second blocking pattern 310 may include a metal oxide, e.g., aluminum oxide, hafnium oxide, zirconium oxide, etc. The gate conductive layer 330 may include a metal having low electrical resistance, e.g., tungsten, titanium, tantalum, platinum, etc. The gate barrier layer 320 may include a metal nitride, e.g., titanium nitride, tantalum nitride, etc. Alternatively, the gate barrier layer 320 may also include a first layer including a metal, and a second layer including a metal nitride.

Figure 21:
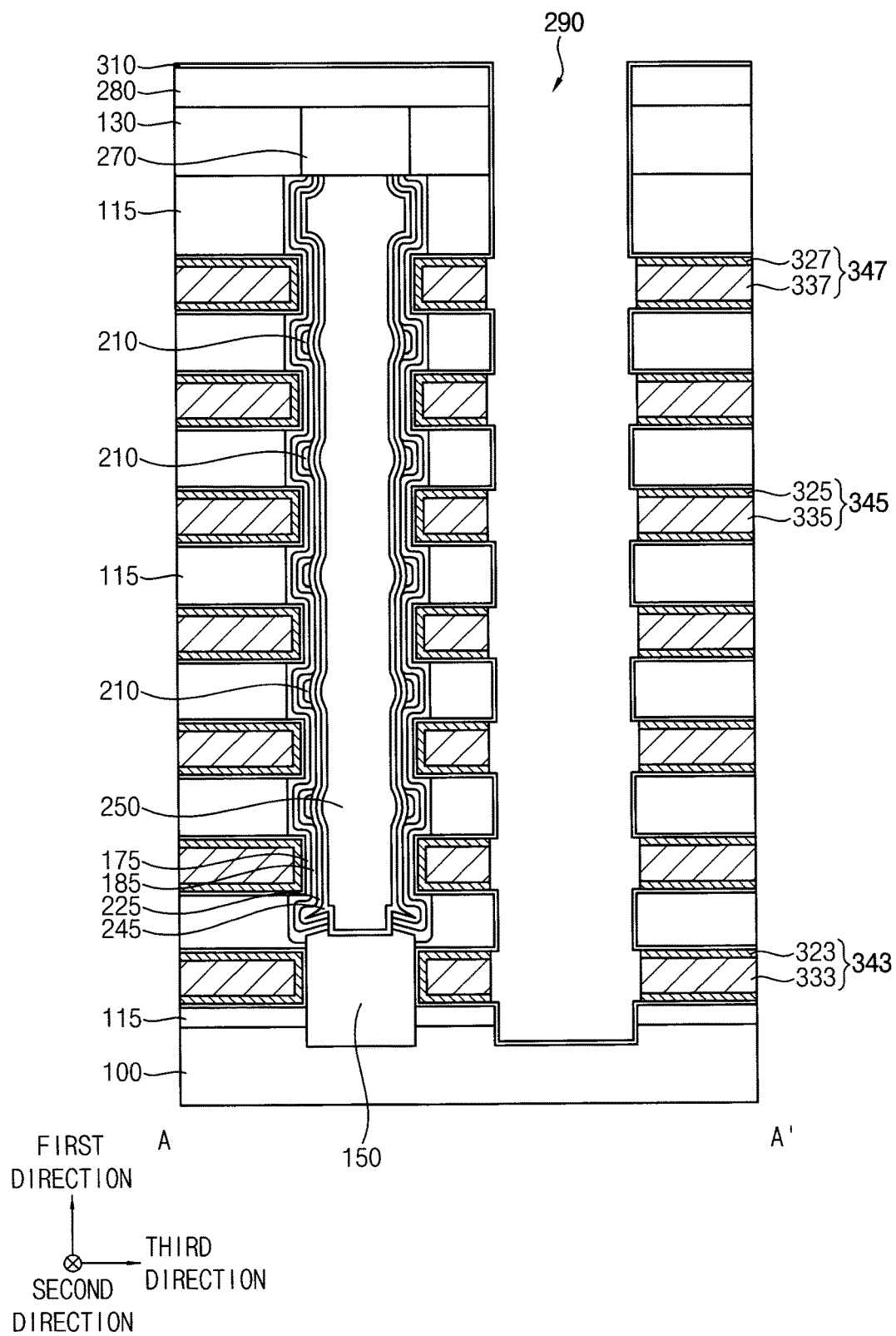

Referring to FIG. 21, the gate conductive layer 330 and the gate barrier layer 320 may be partially removed to form a gate conductive pattern and a gate barrier pattern in the gap 300, respectively, and the gate conductive pattern and the gate barrier pattern altogether may form a gate electrode. In example embodiments, the gate conductive layer 330 and the gate barrier layer 320 may be partially removed by a wet etching process.

In example embodiments, the gate electrode may extend in the second direction, and a plurality of gate electrodes may be formed along the third direction. For example, the plurality of gate electrodes each extending in the second direction may be spaced apart from each other in the third direction by the second opening 290.

The gate electrode may include first to third gate electrodes 343, 345, and 347 sequentially formed along the first direction. The first gate electrode 343 may serve as a ground selection line (GSL), the second gate electrode 345 may serve as a word line, and the third gate electrode 347 may serve as a string selection line (SSL). Each of the first to third gate electrodes 343, 345, and 347 may be formed at one or more levels. Also, one or more dummy word lines may be further formed between the first and second gate electrodes 343 and 345 and/or between the second and third gate electrodes 345 and 347.

In example embodiments, the first gate electrode 343 may be formed at the lowermost level of the gate structures (directly above lowermost insulation pattern 115), the third gate electrode 347 may be formed at the uppermost level of the gate structures (directly below uppermost insulation pattern 115) and one level that is directly thereunder, and the second gate electrode 345 may be formed at a plurality of levels between the first gate electrode 343 and the third gate electrode 347. Accordingly, the first gate electrode 343 may be formed horizontally adjacent to the semiconductor pattern 150, and each of the second and third gate electrodes 345 and 347 may be formed horizontally adjacent to the channel 245. For example, first gate electrode 343 may be formed at the same elevation or level as semiconductor pattern 150 and also be adjacent or proximate to one another.

The first gate electrode 343 may include a first gate conductive pattern 333 and a first gate barrier pattern 323 covering upper and lower surfaces and a portion of a sidewall of the first gate conductive pattern 333, the second gate electrode 345 may include a second gate conductive pattern 335 and a second gate barrier pattern 325 covering upper and lower surfaces and a portion of a sidewall of the second gate conductive pattern 335, and the third gate electrode 347 may include a third gate conductive pattern 337 and a third gate barrier pattern 327 covering upper and lower surfaces and a portion of a sidewall of the third gate conductive pattern 337.

Figure 22:
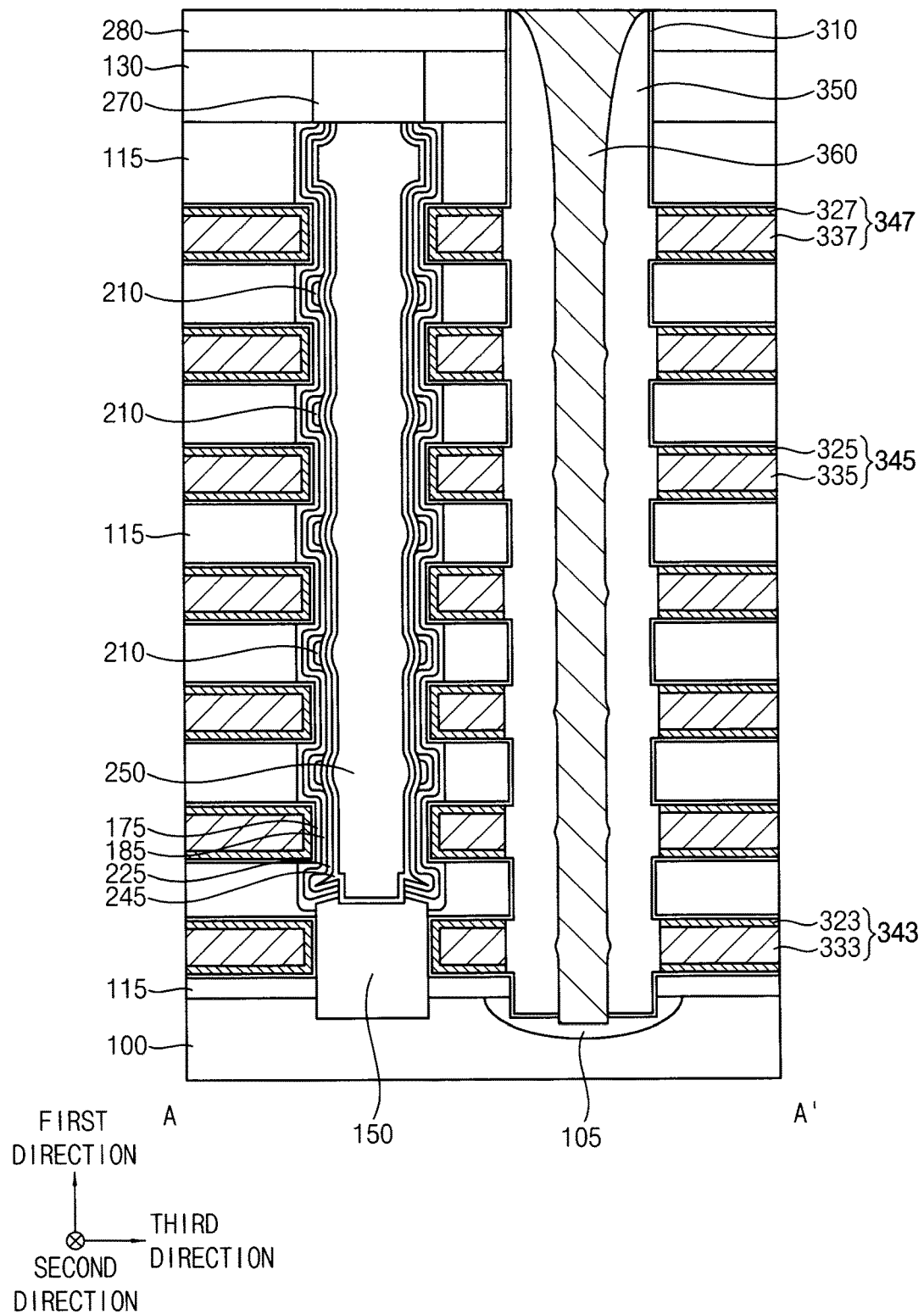

Referring to FIG. 22, after implanting impurities into the upper portion of the exposed substrate 100 to form an impurity region 105, a second spacer layer may be formed on an upper surface of the impurity region 105, the sidewall of the second opening 290, and the upper surface of the second insulating interlayer 280. The second spacer layer may be anisotropically etched to form a second spacer 350 on the sidewall of the second opening 290, and thus the impurity region 105 on the upper portion of the substrate 100 may be partially exposed.

The impurities may include an n-type impurity, e.g., phosphorous and arsenic, and the second spacer layer may include an oxide, e.g., silicon oxide.

A common source line (CSL) 360 may be formed on the exposed impurity region 105 to fill a remaining portion of the second opening 290.

In example embodiments, after forming a conductive layer on the exposed impurity region 105, the second spacer 350, and the second insulating interlayer 280 to fill the second opening 290, an upper portion of the conductive layer may be planarized until the upper surface of the second insulating interlayer 280 may be exposed to form the CSL 360. A portion of the second blocking pattern 310 on the upper surface of the second insulating interlayer 280 may be removed together with the conductive layer. The conductive layer may include, e.g., a metal, a metal nitride and/or a metal silicide.

Referring to FIGS. 1, 2A and 2B again, after forming a third insulating interlayer 370 on the second insulating interlayer 280, the CSL 360, the second spacer 350 and the second blocking pattern 310, a contact plug 380 may be formed to penetrate the third insulating interlayer 370 and the second insulating interlayer 280 and to contact the upper surface of the pad 270.

After forming a fourth insulating interlayer 390 on the third insulating interlayer 370 and the contact plug 380, a bit line 400 penetrating the fourth insulating interlayer 390 and contacting an upper surface of the contact plug 380 may be formed to complete the fabrication of the vertical memory device.

The third and fourth insulating interlayers 370 and 390 may include an oxide, e.g., silicon oxide, and the contact plug 380 and the bit line 400 may include, e.g., a metal such as copper, aluminum, tungsten, titanium, tantalum, etc., and/or a metal nitride such as titanium nitride, tantalum nitride, tungsten nitride, etc.

In example embodiments, the bit line 400 may extend in the third direction, and a plurality of bit lines 400 may be formed along the second direction.

Figure 23:
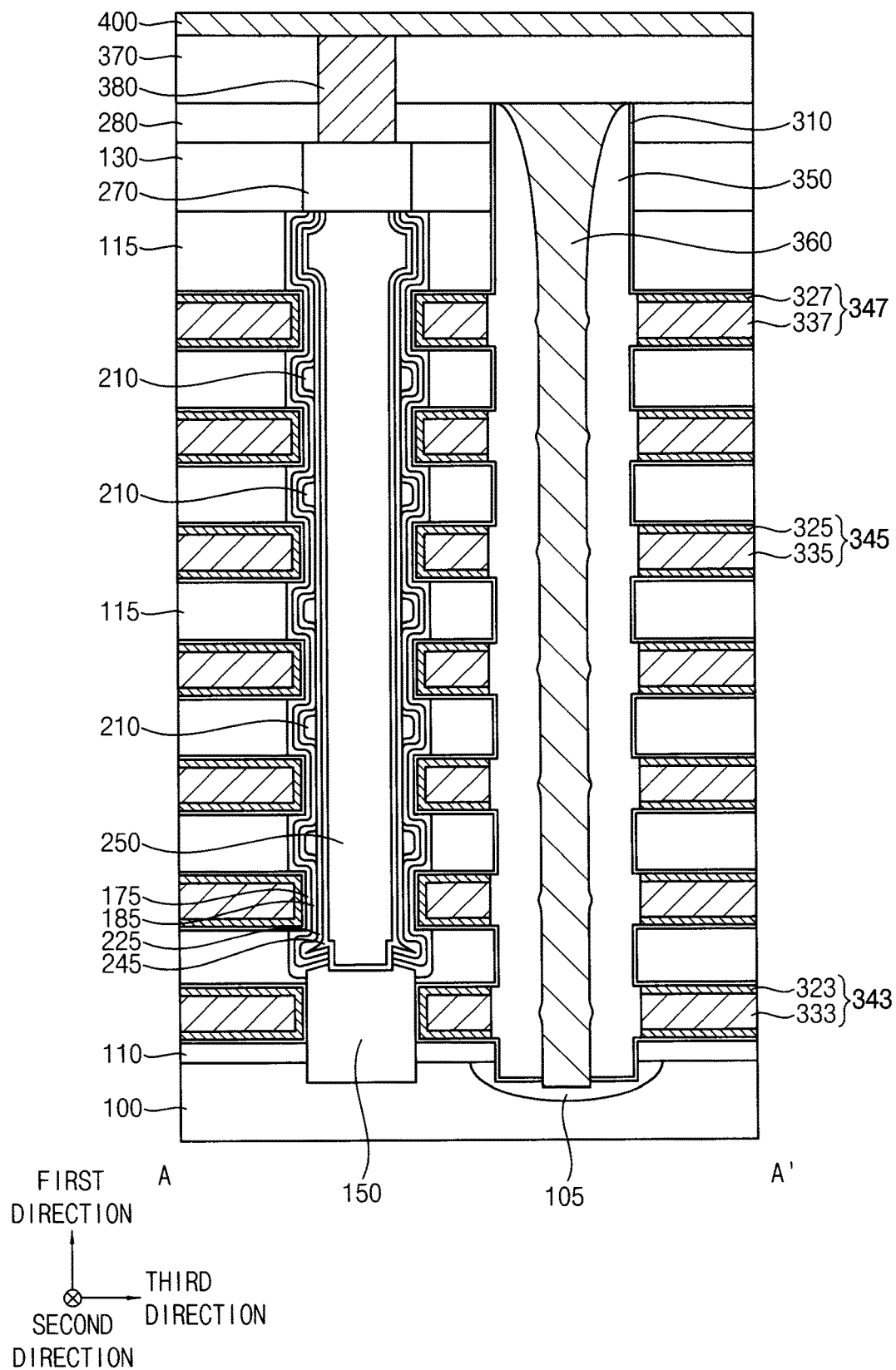
FIG. 23 is a cross-sectional view illustrating a vertical memory device in accordance with example embodiments.

FIG. 23 is a cross-sectional view illustrating a vertical memory device in accordance with example embodiments. The vertical memory device is similar to the vertical memory device described in FIGS. 1, 2A and 2B, except for shapes of the buried pattern structure 210, the tunnel insulation pattern 225, and the channel 245. Thus, like reference numerals refer to like elements, and detailed descriptions thereof are omitted herein.

Referring to FIG. 23, the vertical memory device may include the insulation patterns 115, the gate electrodes 343, 345, and 347, the channel 245, the charge storage structure, and the buried pattern structure 210 on the substrate 100.

However, the outer sidewall of the buried pattern structure 210 may have a concave shape toward the channel 245, while the inner sidewall of the buried pattern structure 210 may have vertical slope with respect to the upper surface of the substrate 100.

Figure 24:
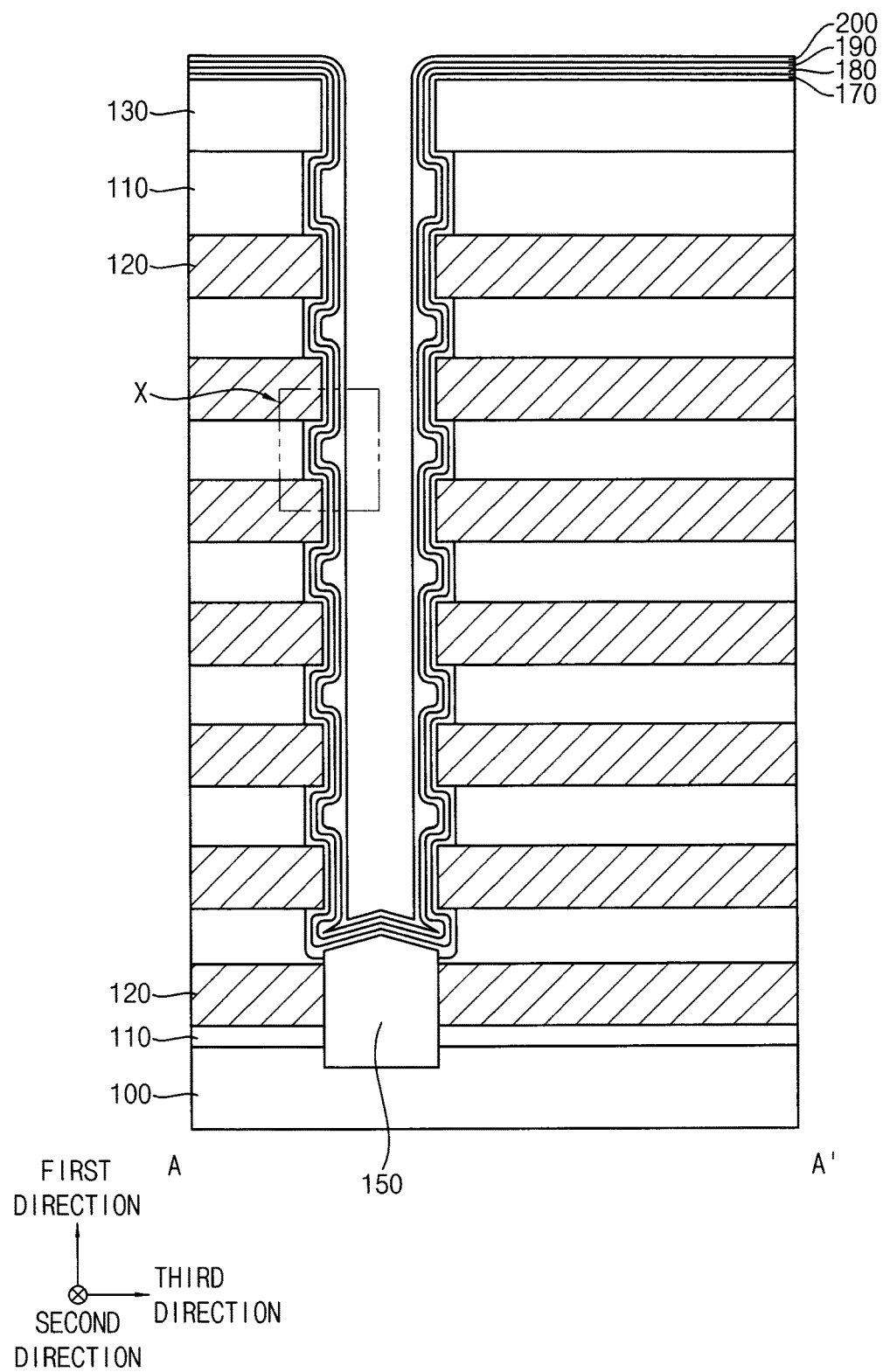
FIGS. 24 to 26 are cross-sectional views illustrating stages of a method of manufacturing a vertical memory device in accordance with example embodiments.
Figure 25:
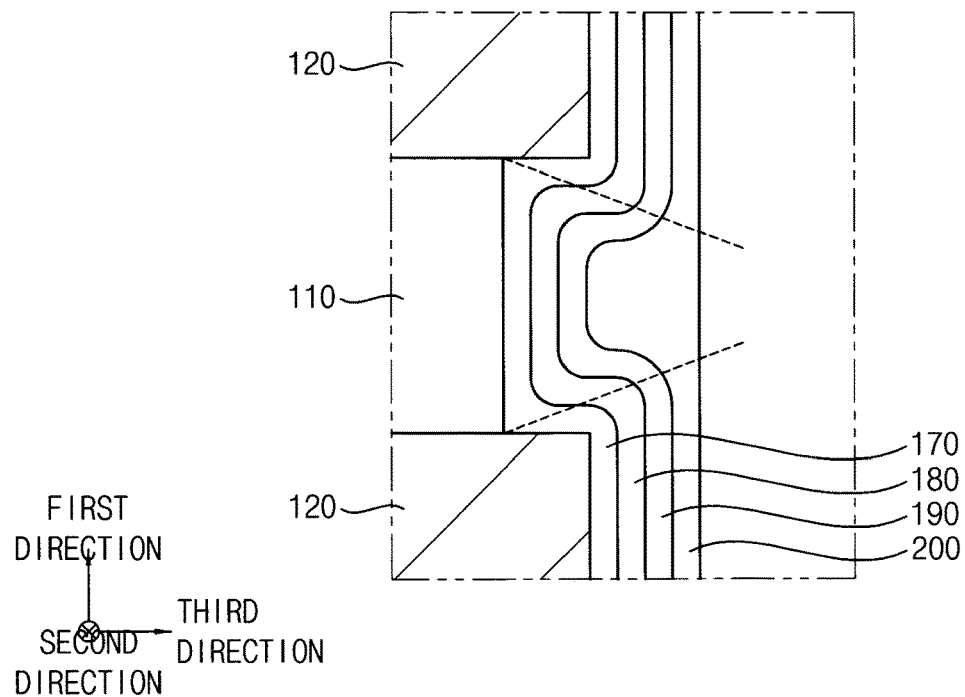
Figure 26:
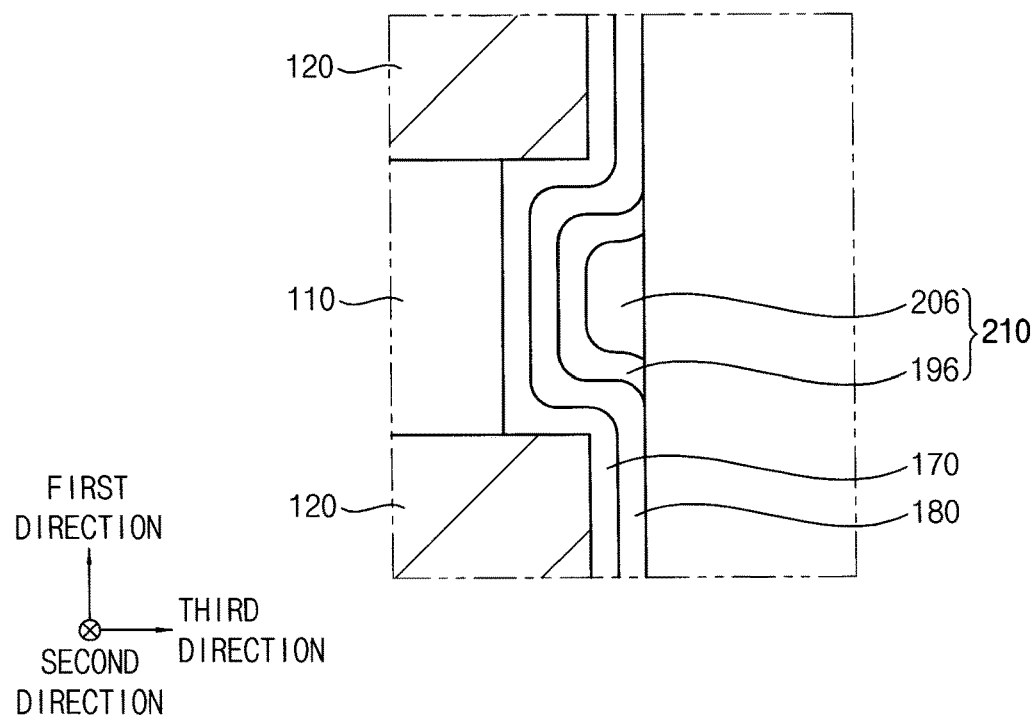

FIGS. 24 to 26 are cross-sectional views illustrating stages of a method of manufacturing a vertical memory device in accordance with example embodiments. FIG. 24 is a cross-sectional view taken along the line A-A' of FIG. 1, FIGS. 25-26 are enlarged cross sectional views of the region X of FIG. 24. The method includes processes substantially the same as or similar to the processes described in FIGS. 3 to 22 and FIGS. 1, 2A and 2B, and thus repetitive explanations thereof are omitted herein.

Referring to FIGS. 24 and 25, processes similar to the processes described in FIGS. 3 to 10 may be performed.

However, the seventh and eighth recesses 203 and 205 corresponding to the fourth and fifth recesses 193 and 195 on the first buried layer 190, respectively, may not be formed on the second portion of the second buried layer 200 adjacent to each of the insulation layers 110.

Accordingly, the surface of the second buried layer 200 exposed by the channel hole 140 may have a vertical slope with respect to the upper surface of the substrate 100, and a portion of the second buried layer 200 adjacent to each of the insulation layers 110 may have a greater thickness than other portions of the second buried layer 200.

In example embodiments, the second buried layer 200 may include a nitride, e.g., silicon nitride having excellent gap fill characteristics, and thus may completely fill the fourth and fifth recesses 193 and 195 on the first buried layer 190. In some cases, in order to make the surface of the second buried layer 200 exposed by the channel hole 140 have a vertical slope with respect to the upper surface of the substrate 100, an additional etching process may be further performed.

Referring to FIG. 26, processes similar to the processes described in FIGS. 11 to 14 may be performed.

Accordingly, the buried pattern structure 210 including the first and second buried patterns 196 and 206 may be formed on the portion of the charge trapping layer 180 adjacent to each of the insulation layers 110, and the inner sidewall of buried pattern structure 210 may have a vertical slope with respect to the upper surface of the substrate 100.

Referring to FIG. 23 again, processes similar to the processes described in FIGS. 15 to 22 and FIGS. 1, 2A and 2B may be performed to complete the fabrication of the vertical memory device.

Figure 27:
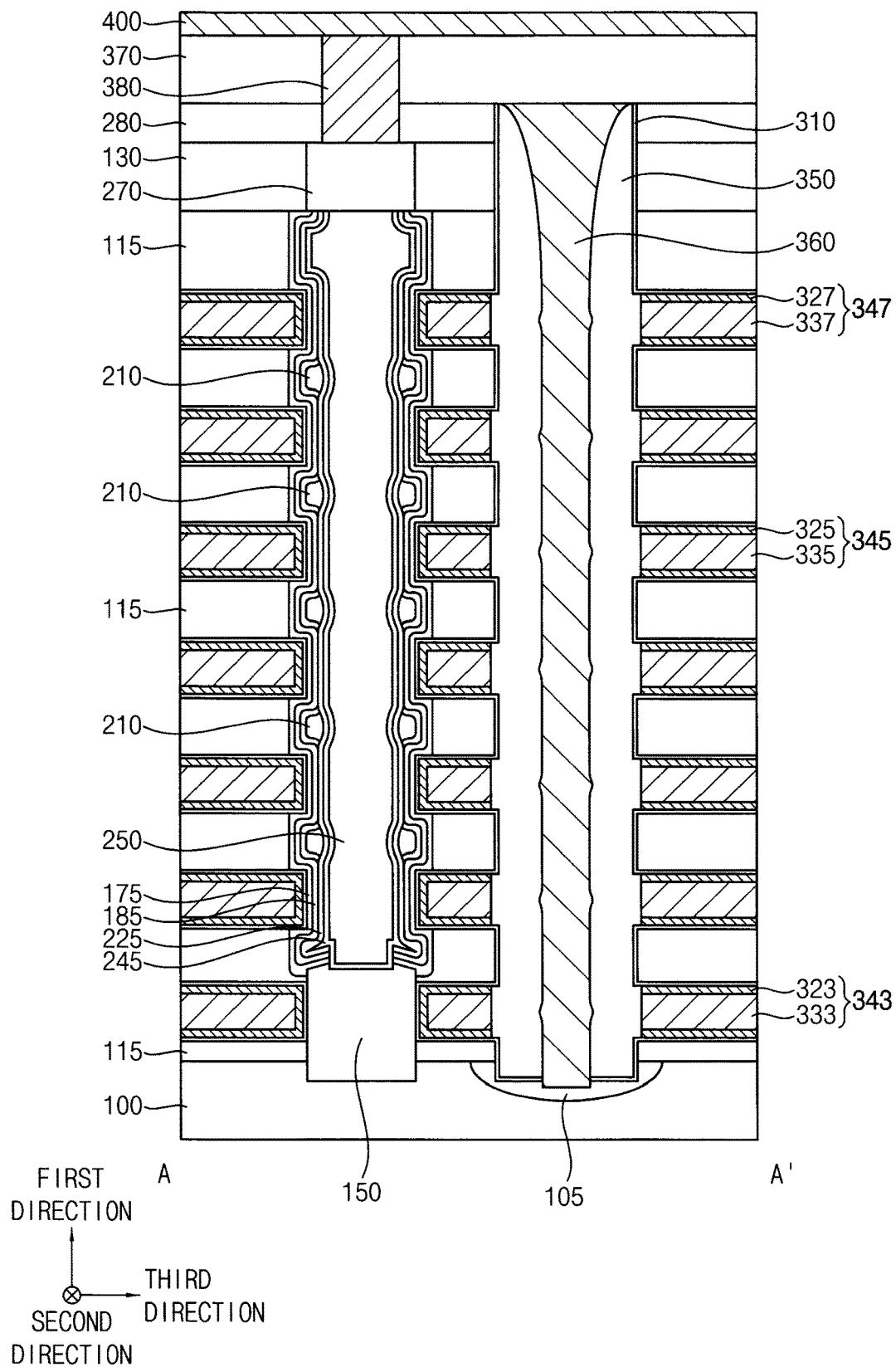
FIG. 27 is a cross-sectional view illustrating a vertical memory device in accordance with example embodiments.

FIG. 27 is a cross-sectional view illustrating a vertical memory device in accordance with example embodiments. The vertical memory device is similar to the vertical memory device described in FIGS. 1, 2A and 2B, except for shapes of the buried pattern structure 210, the tunnel insulation pattern 225, and the channel 245. Thus, like reference numerals refer to like elements, and detailed descriptions thereof are omitted herein.

Referring to FIG. 27, the vertical memory device may include the insulation patterns 115, the gate electrodes 343, 345, and 347, the channel 245, the charge storage structure and the buried pattern structure 210 on the substrate 100.

However, unlike the vertical memory device described in FIGS. 2A and 2B, the outer sidewall of the buried pattern structure 210 may have a concave shape toward the channel 245, and the inner sidewall of the buried pattern structure 210 may have a convex shape toward the channel 245.

Figure 28:
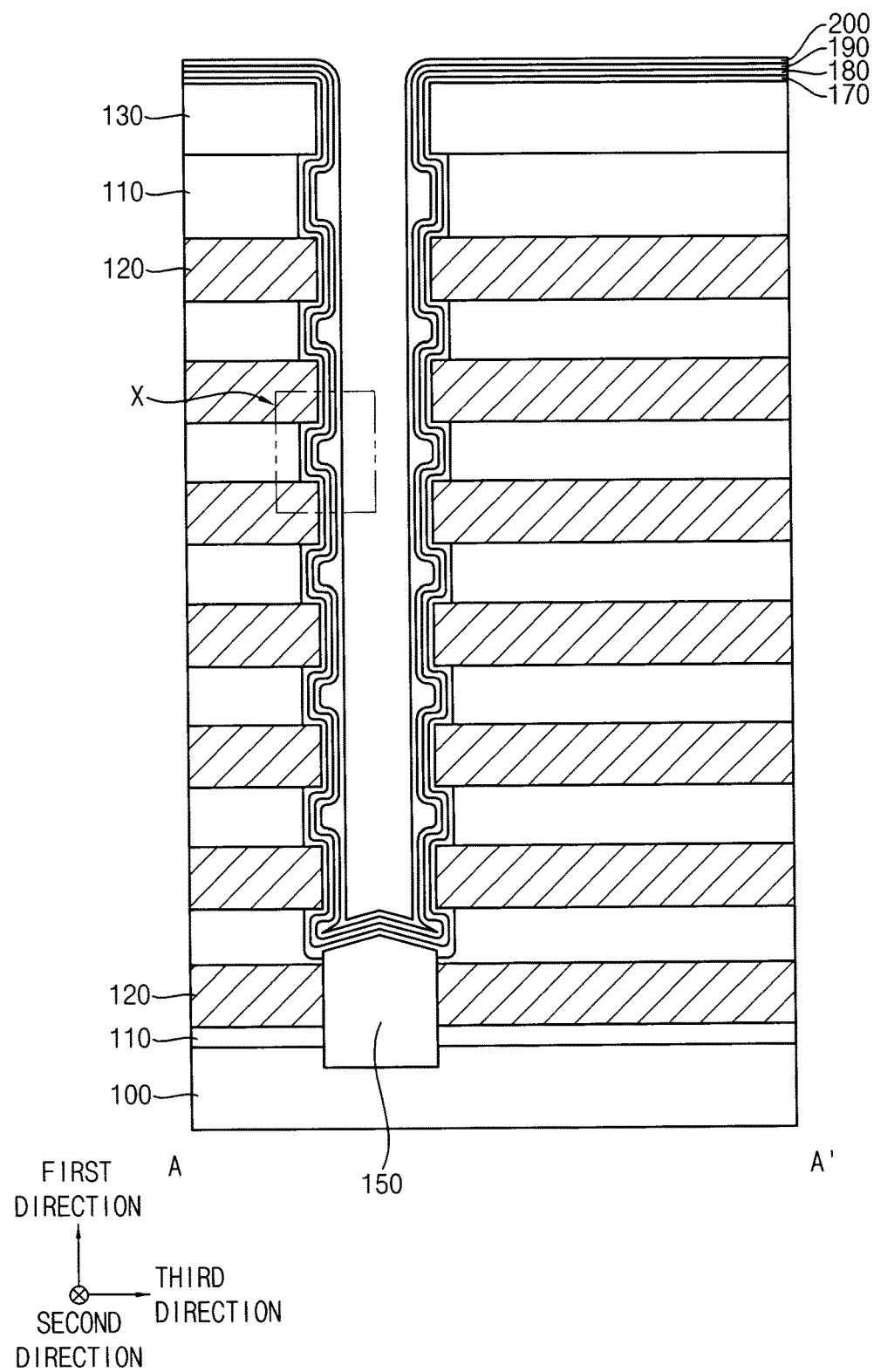
FIGS. 28 to 33 are cross-sectional views illustrating stages of a method of manufacturing a vertical memory device in accordance with example embodiments.

FIGS. 28 to 33 are cross-sectional views illustrating stages of a method of manufacturing a vertical memory device in accordance with example embodiments. FIG. 28 is a cross-sectional view taken along the line A-A' of FIG. 1, FIGS. 29-33 are enlarged cross-sectional views of the region X of FIG. 28. The method includes processes similar to the processes described in FIGS. 3 to 22 and FIGS. 1, 2A and 2B, and thus repetitive explanations thereof are omitted herein.

Figure 29:
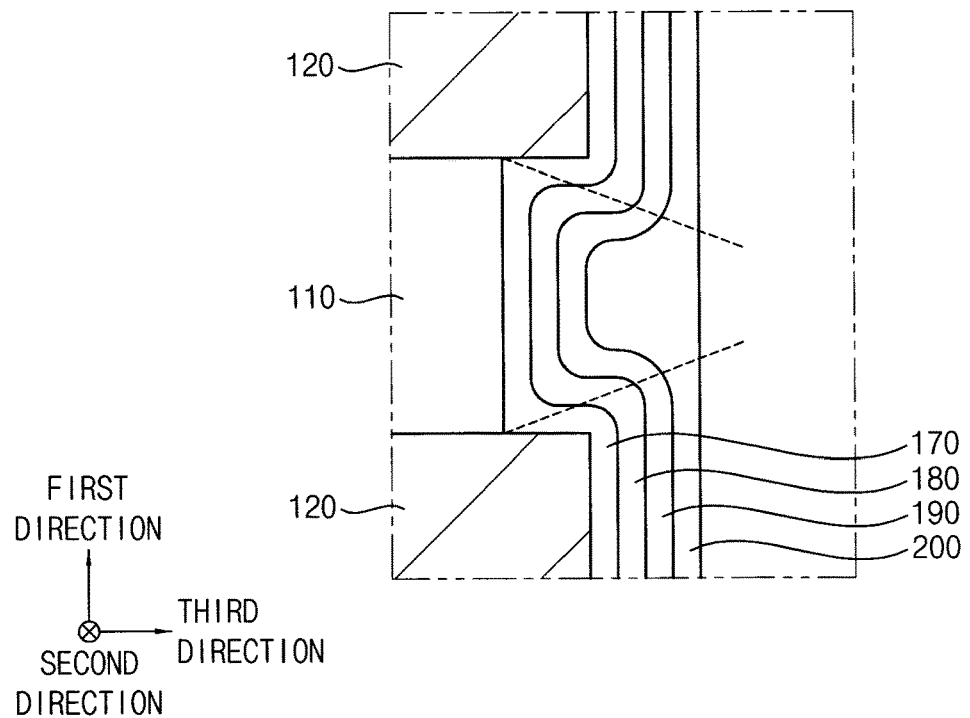

Referring to FIGS. 28 and 29, processes similar to the processes described in FIGS. 3 to 10 may be performed.

However, the seventh and eighth recesses 203 and 205 corresponding to the fourth and fifth recesses 193 and 195 on the first buried layer 190, respectively, may not be formed on the second portion of the second buried layer 200 adjacent to each of the insulation layers 110.

In example embodiments, the first and second buried layers 190 and 200 may include different materials from each other, that is, they may include an oxide, e.g., silicon oxide and a nitride, e.g., silicon nitride, respectively. Further, the first and second buried layers 190 and 200 may be formed to have different densities from each other, or to have specific gravities greater or smaller than those of reference materials. Accordingly, the first and second buried layers 190 and 200 may be etched to different thicknesses by a second etching process, which will be described later with reference to FIG. 41.

Figure 30:
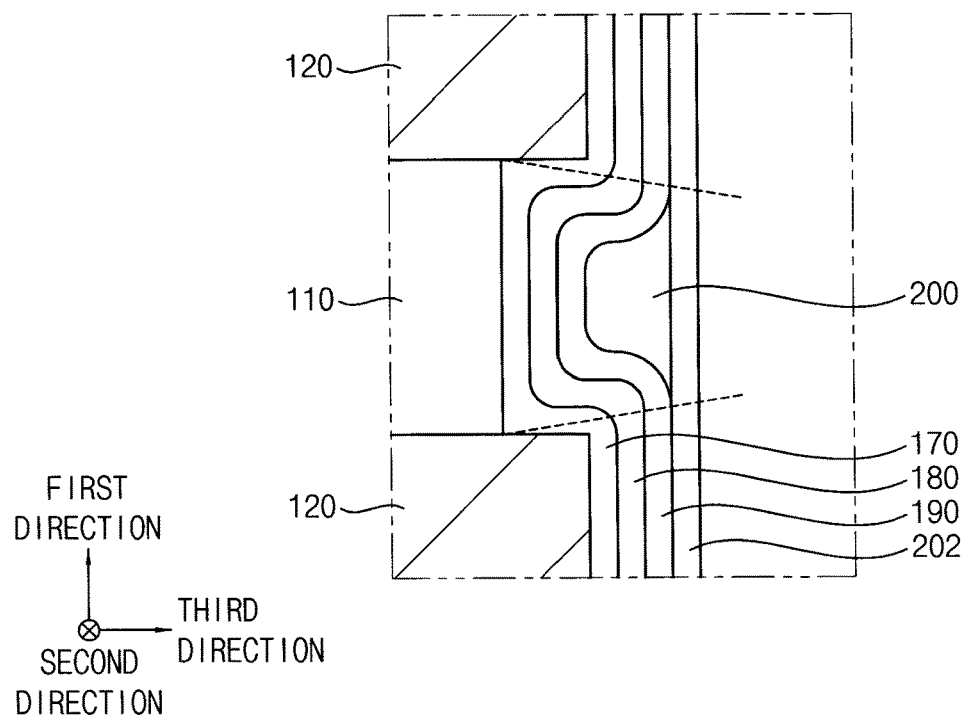

Referring to FIG. 30, processes similar to the processes described in FIG. 11 may be performed.

However, the first oxide layer 202 may be formed by the first oxidation process, but the second buried layer 200 may not remain on the portion of the first buried layer 190 adjacent to each of the sacrificial layers 120.

Figure 31:
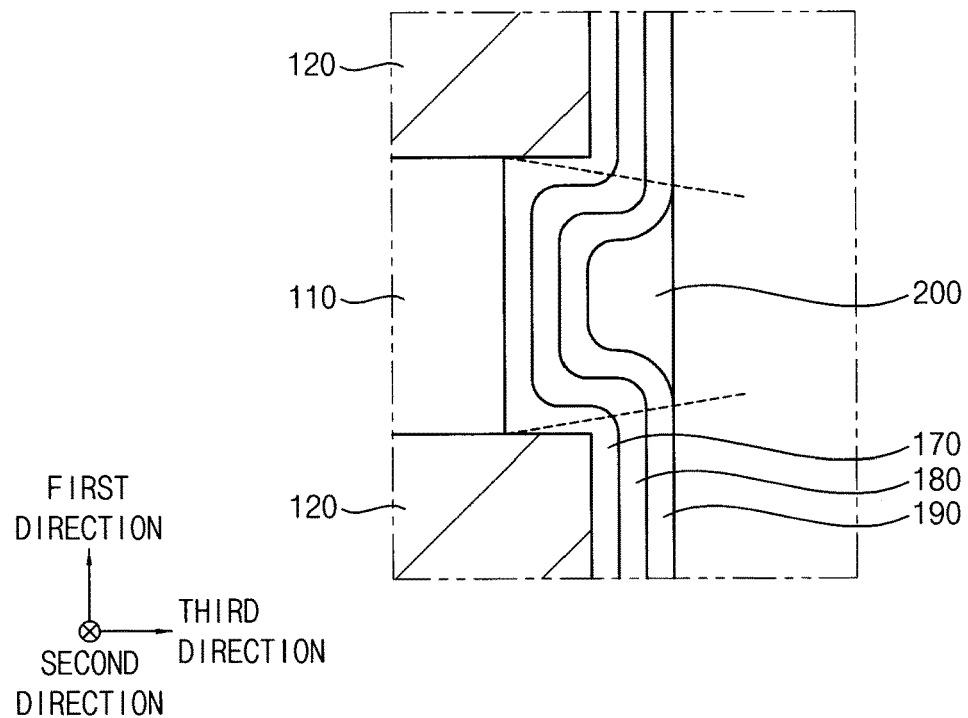

Referring to FIG. 31, processes similar to the processes described in FIG. 12 may be performed.

Accordingly, the first oxide layer 202 may be selectively removed by the first etching process, and the second buried layer 200 may be formed only on the portion of the first buried layer 190 adjacent to each of the insulation layers 110.

Figure 32:
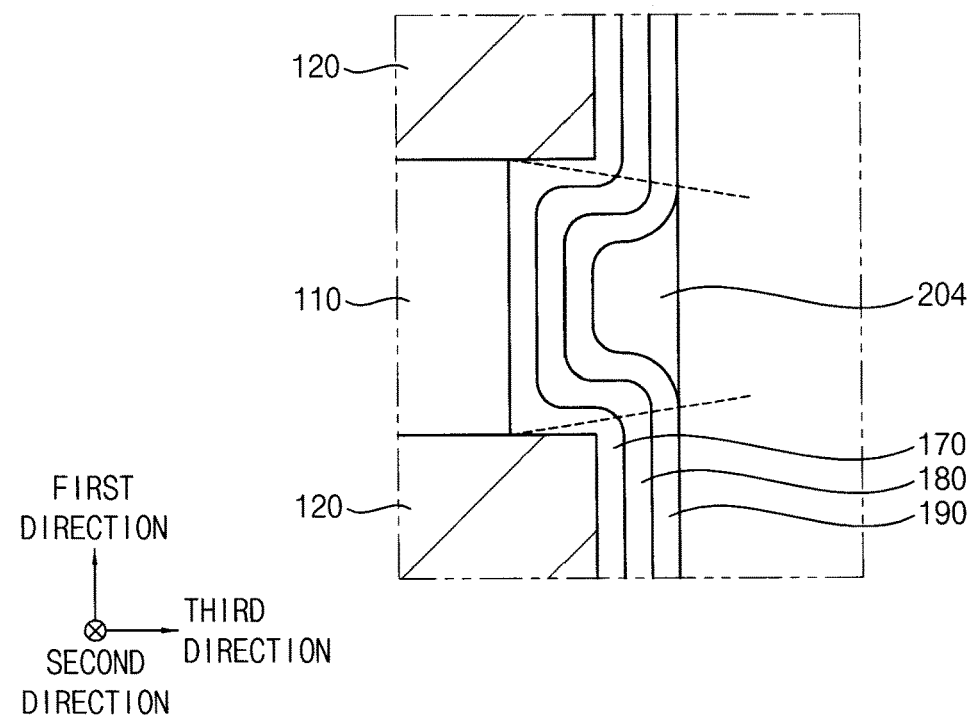

Referring to FIG. 32, processes similar to the processes described in FIG. 13 may be performed.

Accordingly, the second buried layer 200 may be completely oxidized to form the second oxide layer 204 by the second oxidation process.

Figure 33:
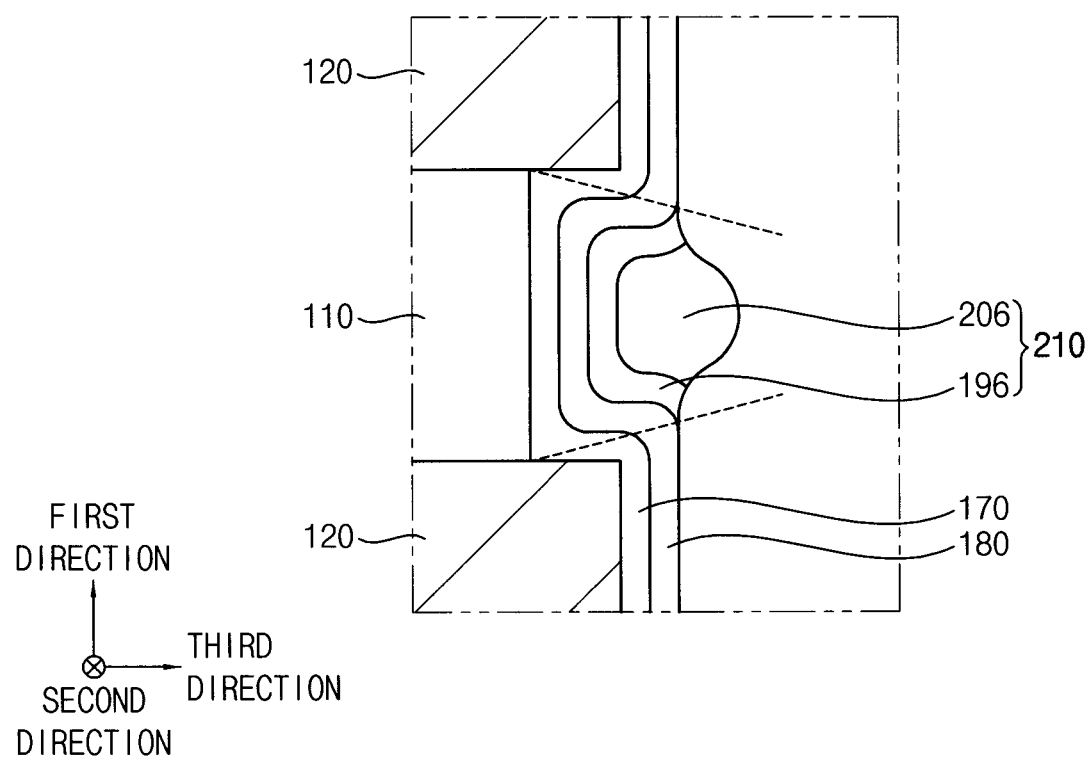

Referring to FIG. 33, processes similar to the processes described in FIG. 14 may be performed.

Accordingly, the first buried layer 190 and the second oxide layer 204 may be removed by the second etching process. However, since the first buried layer 190 and the second oxide layer 204 have different densities from each other or have different specific gravities compared with the reference materials, the second etching process may be performed to remove the first buried layer 190 and the second oxide layer 204 by different thicknesses.

In example embodiments, the surface of the first buried pattern 196 exposed by the channel hole 140 may have a vertical slope with respect to the upper surface of the substrate 100 (at least at both ends in the first direction), the surface of the second buried pattern 206 exposed by the channel hole 140 may have a varying slope with respect to the upper surface of the substrate 100, and in this case, the second buried pattern 206 may have a protruding shape from the first buried pattern 196 in the third direction.

In example embodiments, a central portion in the first direction of the buried pattern structure 210 including the first and second buried patterns 196 and 206 may have a maximum thickness, and each of both end portions in the first direction thereof may have a minimum thickness.

Referring to FIG. 27 again, processes similar to the processes described in FIGS. 15 to 22 and FIGS. 1, 2A and 2B may be performed to complete the fabrication of the vertical memory device.

Figure 34:
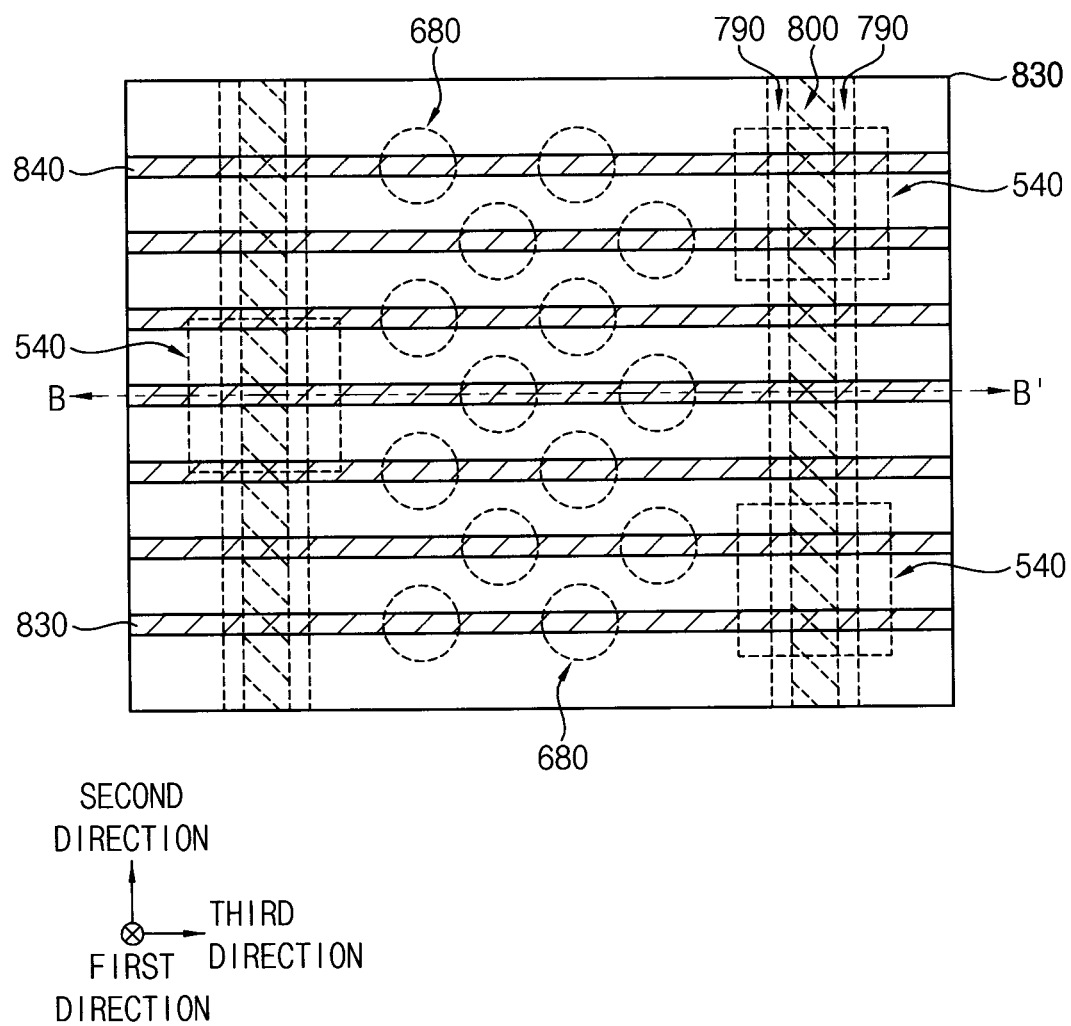
FIGS. 34 to 37 are a plan view and cross-sectional views illustrating a vertical memory device in accordance with example embodiments.
Figure 35:
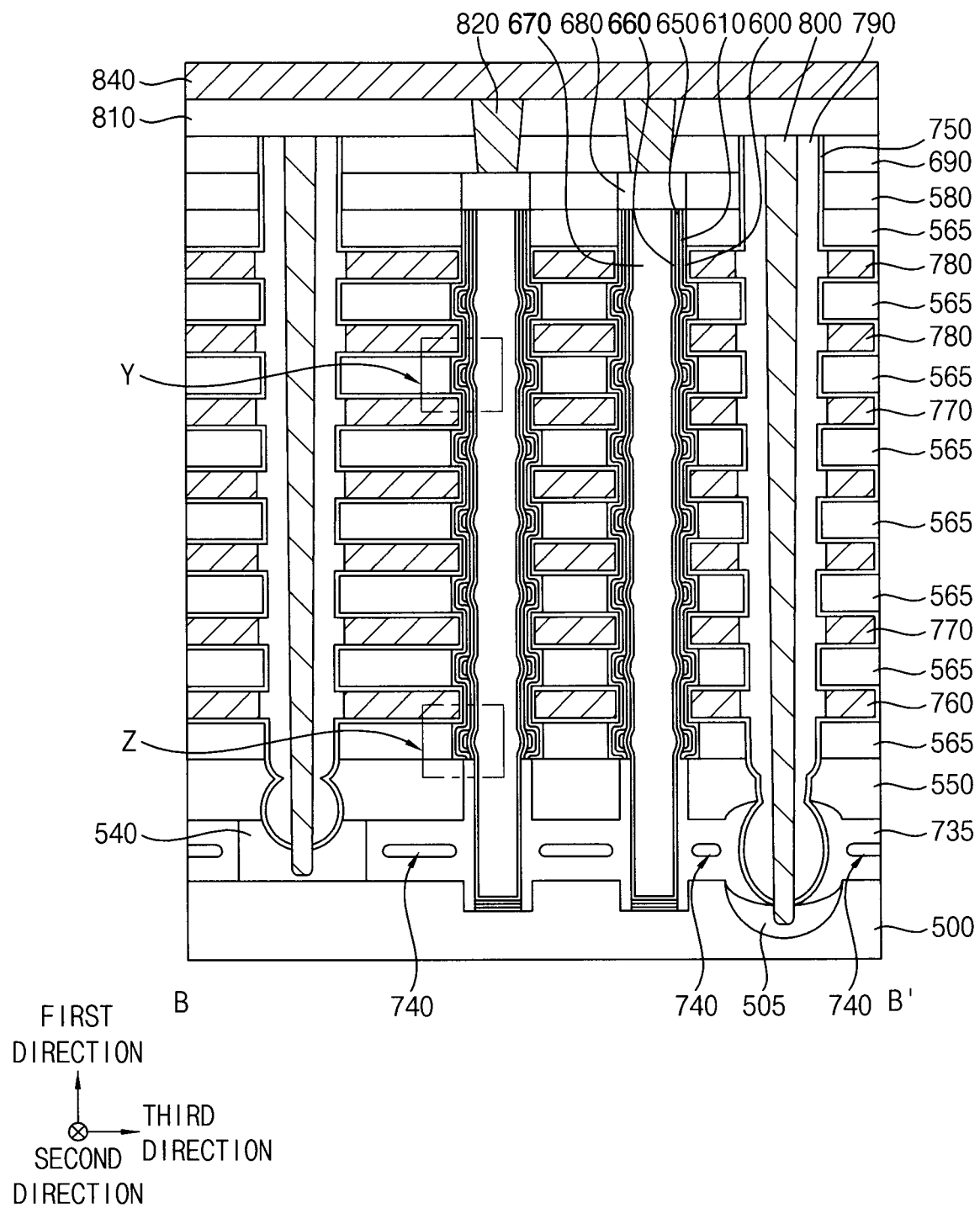
Figure 36:
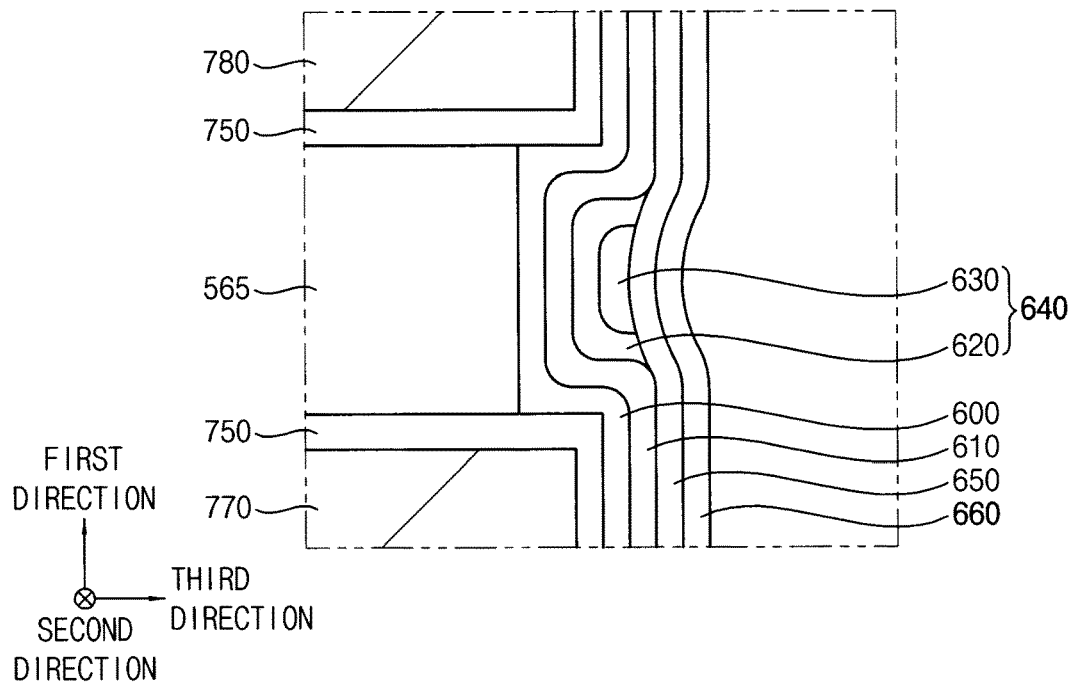
Figure 37:
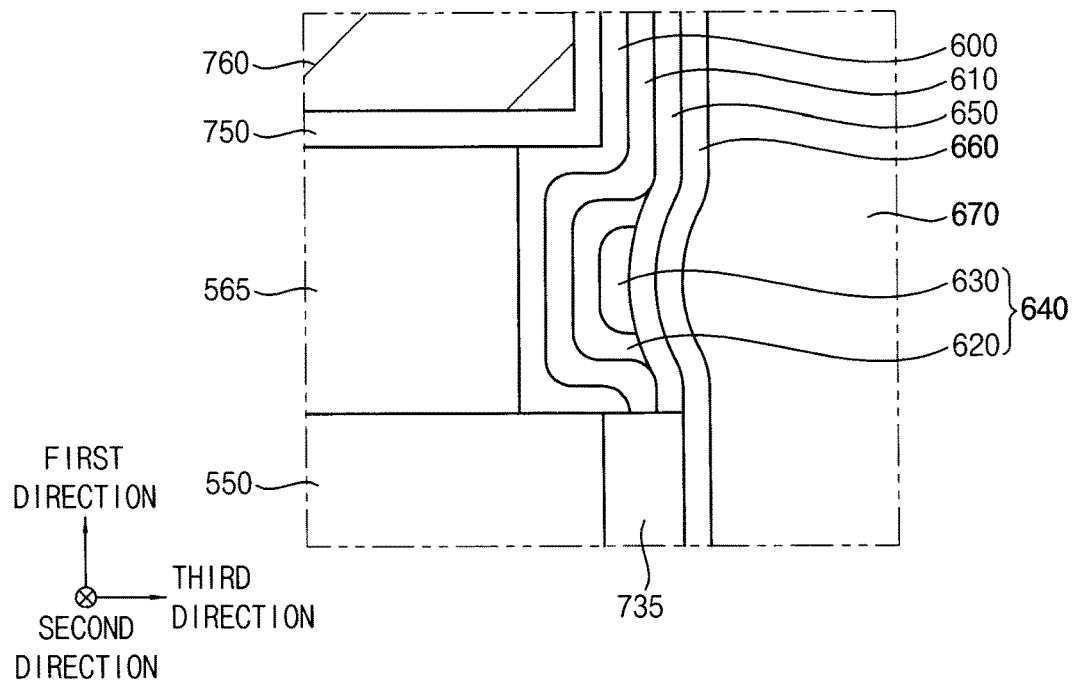

FIGS. 34 to 37 are a plan view and cross-sectional views illustrating a vertical memory device in accordance with example embodiments. FIG. 34 is the plan view, FIG. 35 is a cross-sectional view taken along a line B-B' of FIG. 34, FIG. 36 is an enlarged cross-sectional view of a region Y of FIG. 35, and FIG. 37 is an enlarged cross-sectional view of region Z of FIG. 35.

The vertical memory device includes a charge storage structure, a buried pattern structure, and a channel similar to those of the vertical memory device described in FIGS. 1, 2A, and 2B, and thus repetitive explanations thereof are omitted herein.

Referring to FIGS. 34 and 35, the vertical memory device may include a channel connection pattern 735, gate electrodes 760, 770, and 780 on the channel connection pattern 735, the gate electrodes 760, 770, and 780 sequentially stacked to be spaced apart from each other in the first direction and each extending in the second direction, a channel 660 extending in the first direction on the substrate 500, the channel 660 penetrating the gate electrodes 760, 770, and 780, and the channel connection pattern 735, and a CSL 800 extending in the second direction on the substrate 500, the CSL 800 separating the gate electrodes 760, 770, and 780 and the channel connection pattern 735 in the third direction.

Also, the vertical memory device may further include an impurity region 505 on an upper portion of the substrate 500, a support pattern 540 formed on the substrate 500 to contact a sidewall of the channel connection pattern 735, a support layer 550 between the channel connection pattern 735 and the support pattern 540, and a lowermost gate electrode 760 of the gate electrodes 760, 770, and 780, an insulation pattern 565 between the gate electrodes 760, 770, and 780, a charge storage structure covering an outer sidewall and a lower surface of the channel 660, a third buried pattern 670 filling a space defined by the channel 660, a pad 680 on the channel 660, the third buried pattern 670, and the charge storage structure, a second spacer 790 covering a sidewall of the CSL 800, a second blocking pattern 750 covering upper and lower surfaces and portions of sidewalls of the gate electrodes 760, 770, and 780, first to fourth insulating interlayers 580, 690, 810 and 830 sequentially stacked on the gate electrodes 760, 770, and 780, a contact plug 820 penetrating the second and third insulating interlayers 690 and 810 to contact an upper surface of the pad 680, and a bit line 840 penetrating the fourth insulating interlayer 830 to contact the contact plug 820.

Referring to FIGS. 36 and 37, the charge storage structure may include a first blocking pattern 600, a charge trapping pattern 610 and a tunnel insulation pattern 650, and a plurality of buried pattern structures 640 may be formed between the charge trapping pattern 610 and the tunnel insulation pattern 650 of the charge storage structure. The buried pattern structure 640 may include a first buried pattern 620 and a second buried pattern 630.

The plurality of buried pattern structures 640 may be formed along the first direction between the channel 660 and each of the insulation patterns 565. Buried pattern structure 640 may be surrounded by the tunnel insulation pattern 650 and the charge trapping pattern 610 to contact each of the tunnel insulation pattern 650 and the charge trapping pattern 610. Each of the buried pattern structures 640 may include an inner sidewall contacting the tunnel insulation pattern 650 and an outer sidewall contacting the charge trapping pattern 610. In example embodiments, each of the inner sidewall and the outer sidewall of the buried pattern structure 640 may have a concave shape toward the channel 660.

Since this example vertical memory device includes the support layer 550 and the channel connection pattern 735, instead of the semiconductor pattern 150 of the vertical memory device described in FIGS. 1, 2A and 2B, the charge storage structure and the buried pattern structure 640 may also be formed on a sidewall of the insulation pattern 565 between the lowermost gate electrode 760 and the support layer 550.

In example embodiments, the first blocking pattern 600, the charge trapping pattern 610, and the tunnel insulation pattern 650 are sequentially stacked to surround the channel 660, that is, the charge storage structure may have a ring shape, and each of the buried pattern structures 640 formed between the charge trapping pattern 610 and the tunnel insulation pattern 650 of the charge storage structure may also have a ring shape.

Figure 38:
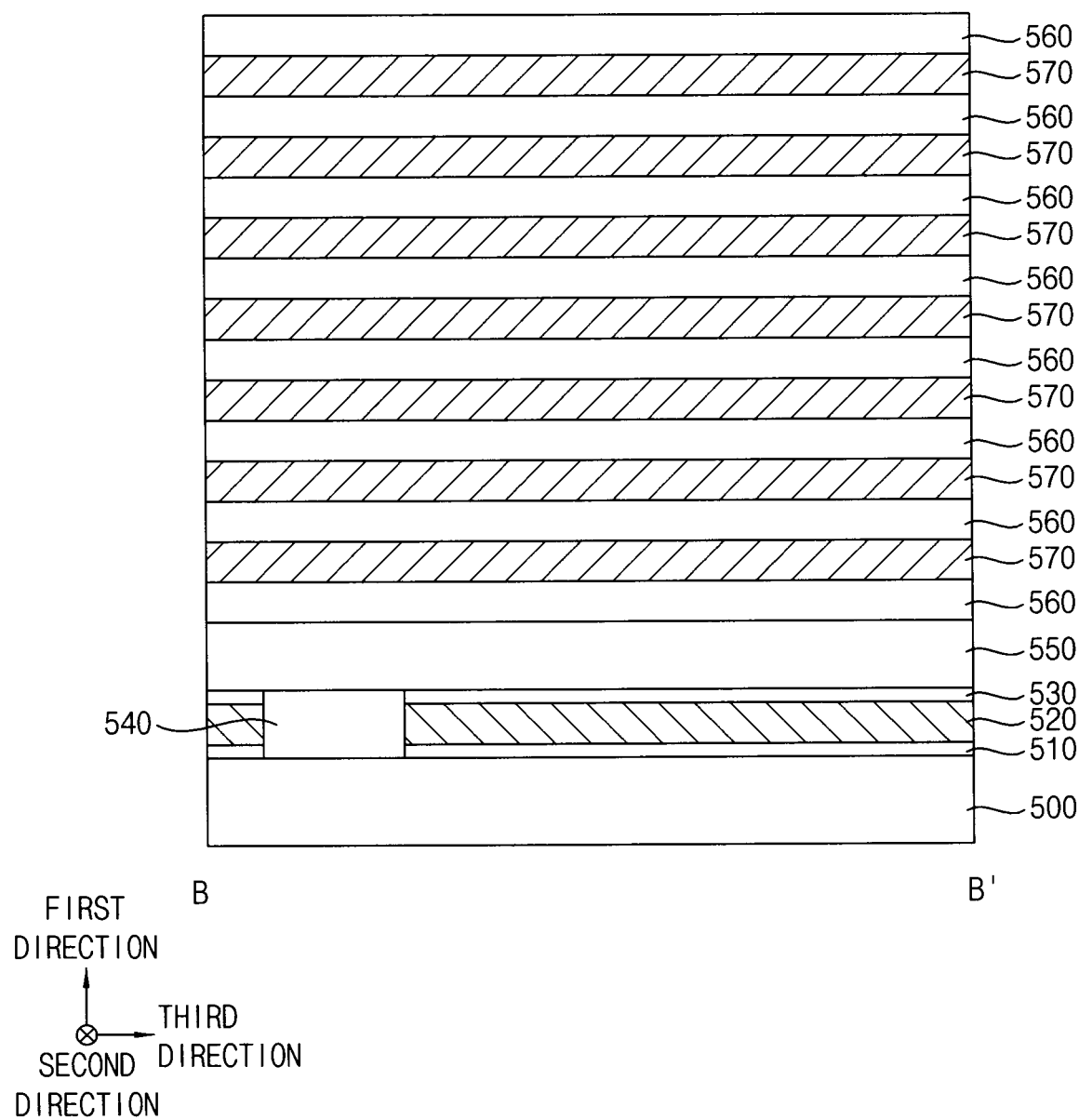
FIGS. 38 to 48 are cross-sectional views illustrating stages of a method of manufacturing a vertical memory device in accordance with example embodiments.
Figure 39:
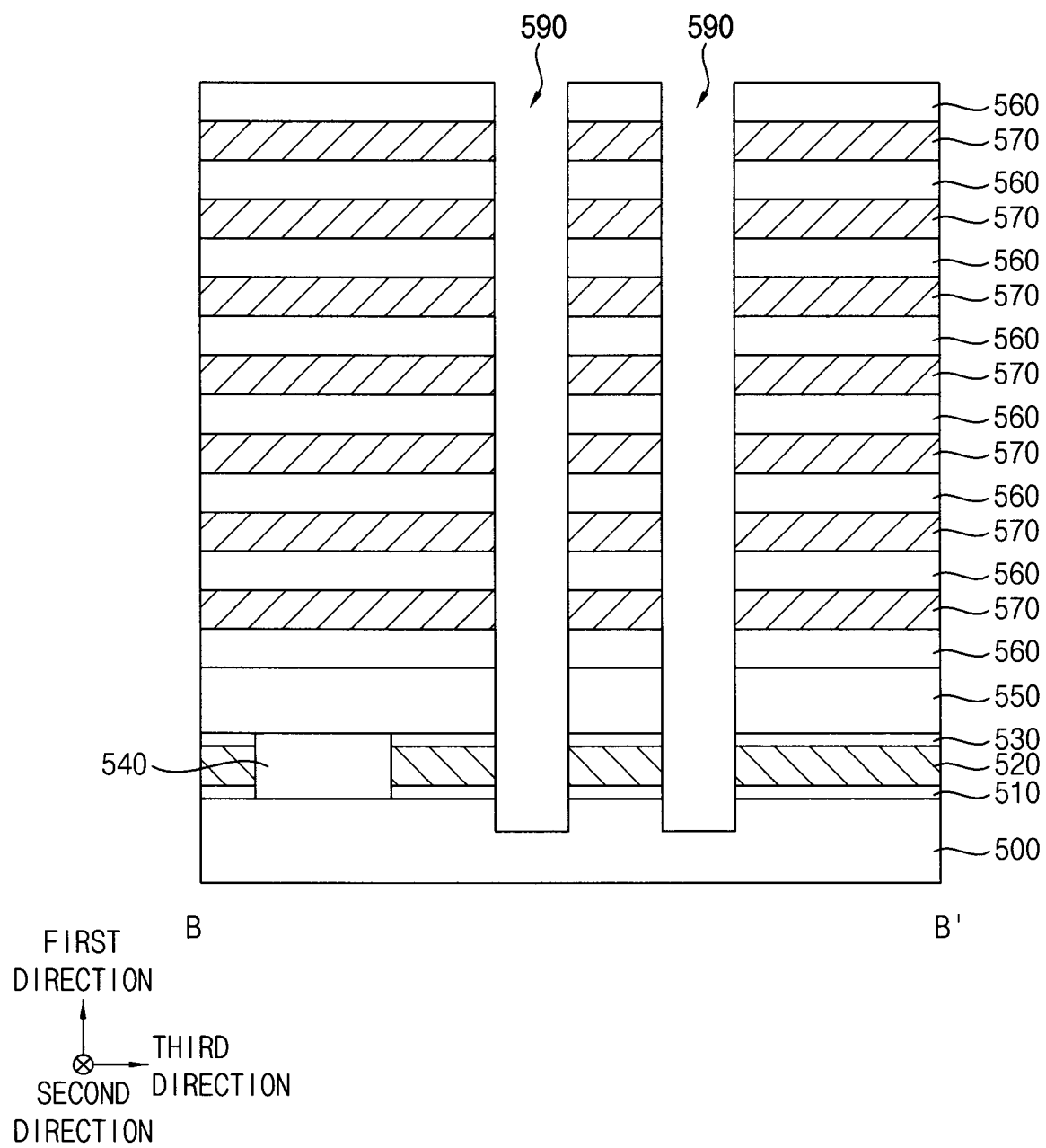
Figure 40:
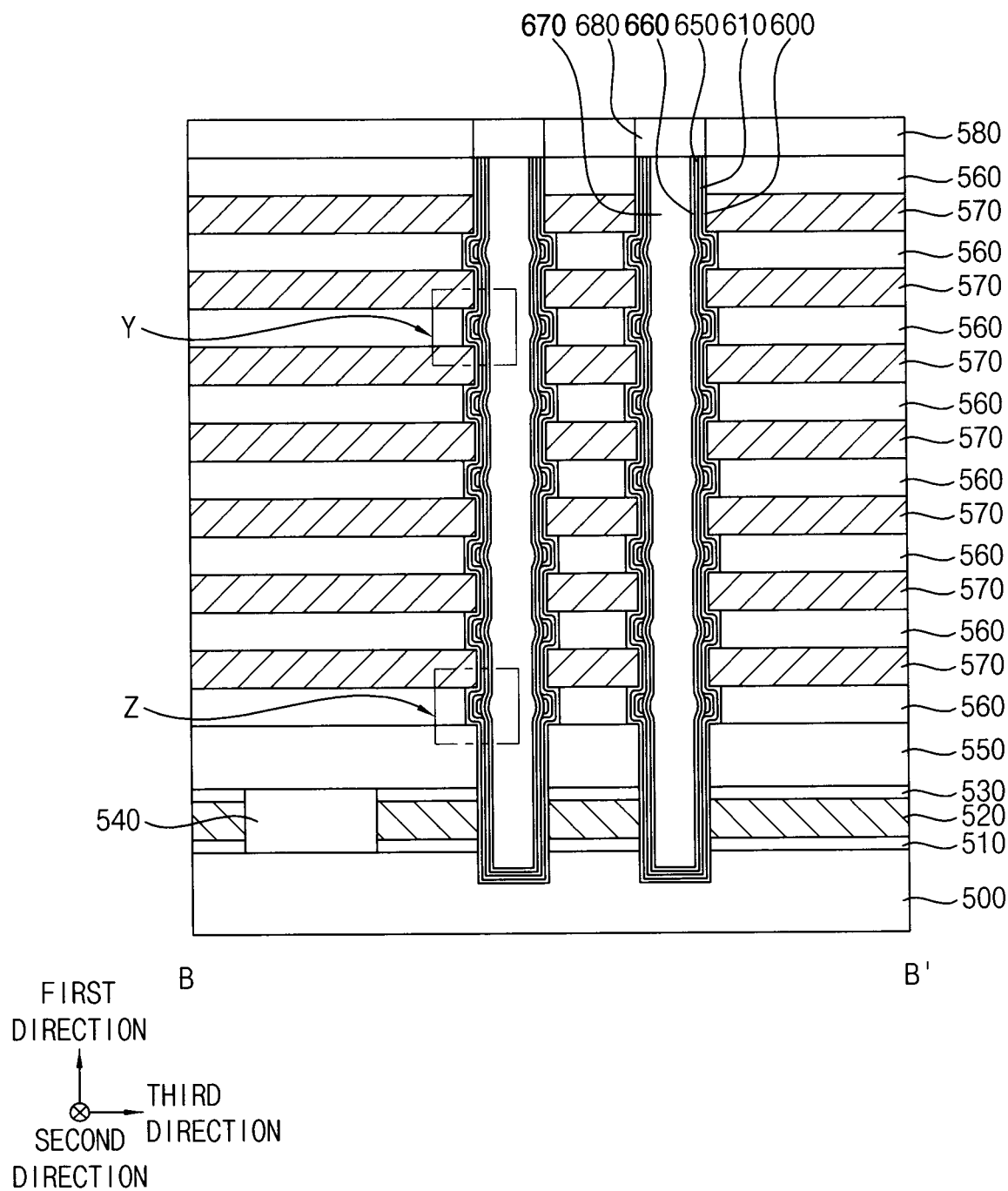
Figure 41:
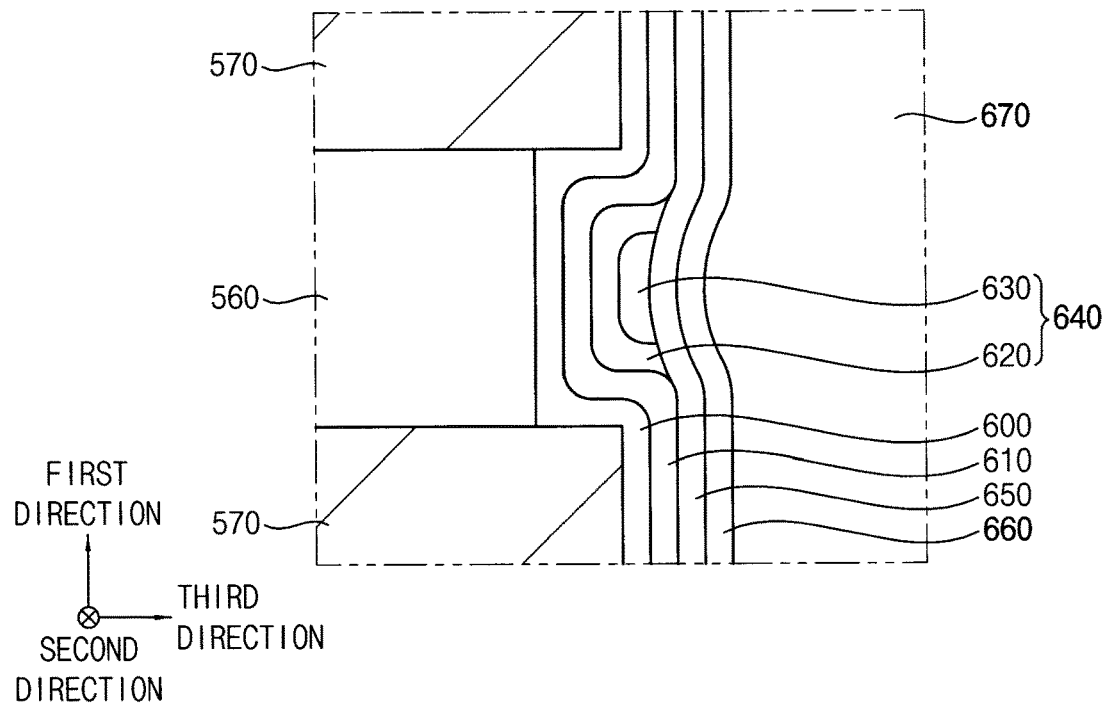
Figure 42:
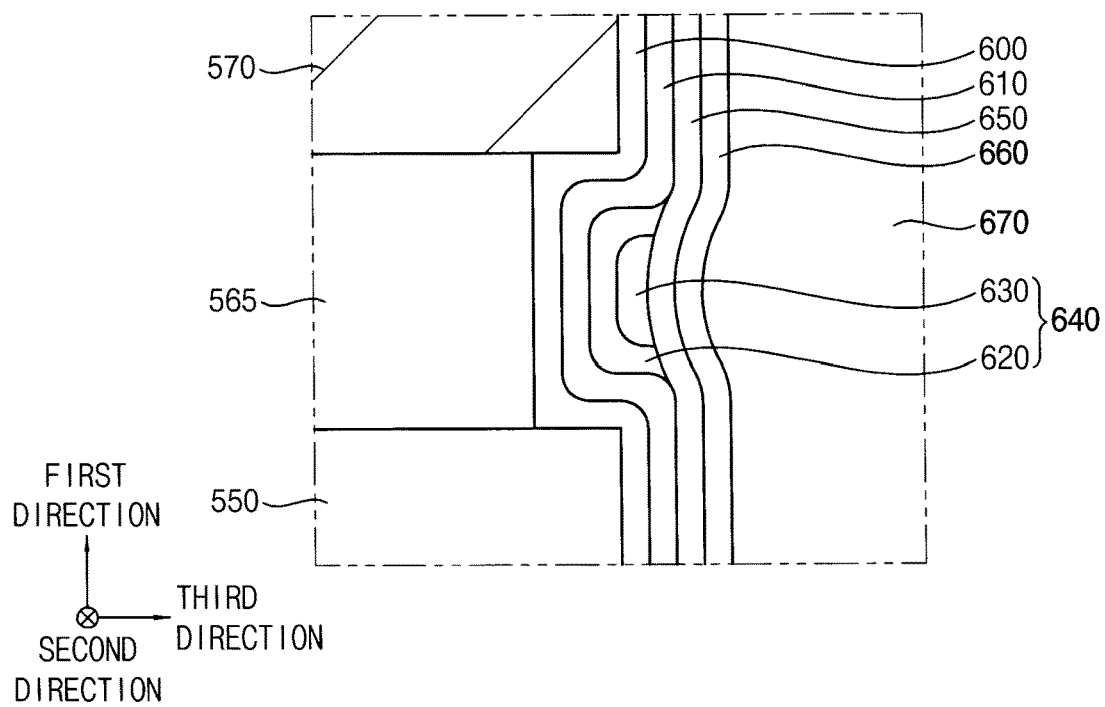

FIGS. 38 to 48 are cross-sectional views illustrating stages of a method of manufacturing a vertical memory device in accordance with example embodiments. Specifically, FIGS. 38-40 and 43-48 are cross-sectional views taken along a line B-B' of FIG. 34, FIG. 41 is an enlarged cross-sectional view of a region Y of FIG. 40, and FIG. 42 is an enlarged cross-sectional view of a region Z of FIG. 40.

Referring to FIG. 38, first to third sacrificial layers 510, 520, and 530 may be sequentially stacked on a substrate 500. The first to third sacrificial layers 510, 520, and 530 may be partially removed to form a support pattern 540, and a support layer 550 that may be formed on the third sacrificial layer 530 and the support pattern 540.

The first and third sacrificial layers 510 and 530 may include an oxide, e.g., silicon oxide, and the second sacrificial layer 520 may include a nitride, e.g., silicon nitride.

The support pattern 540 may be formed by partially removing the first to third sacrificial layers 510, 520, and 530 to form a first opening, and filling the first opening. Accordingly, the support pattern 540 may be formed at the same height as a structure including the first to third sacrificial layers 510, 520, and 530, and a sidewall of the support pattern 540 may contact sidewalls of the first to third sacrificial layers 510, 520, and 530.

In example embodiments, the support pattern 540 and the support layer 550 may include a material having an etching selectivity with respect to each of the first to third sacrificial layers 510, 520, and 530, e.g., doped or undoped polysilicon. In one embodiment, the support pattern 540 and the support layer 550 may be formed by depositing amorphous silicon first, and then performing an additional heat treatment process or crystallizing by heat generated in subsequent deposition processes of other layers to form polysilicon.

The support pattern 540 may be formed to overlap a region where a second opening 700 (to be described with reference to FIG. 43) is formed. The second opening 700 may extend in the second direction, and a plurality of second openings 700 may be formed along the third direction. Also, corresponding thereto, one or more support patterns 540 may extend in the second direction, and a plurality of support patterns 540 may be formed in the third direction. An insulation layer 560 and a fourth sacrificial layer 570 may be alternately and repeatedly stacked on the support layer 550 to form a mold in the first direction.

Referring to FIG. 39, after forming a first insulating interlayer 580 on an uppermost insulation layer 560, a set of channel holes 590 may be formed to penetrate the first to third sacrificial layers 510, 520, and 530 by a dry etching process. For example, as illustrated in FIG. 39 a first channel hole 590 and a second channel hole 590 each penetrate the first to third sacrificial layers 510, 520, and 530. For ease of understanding, example embodiments may refer to a set of channel holes 590 as including both the first channel hole 590 and the second channel hole 590.

Referring to FIGS. 40 to 42, processes similar to the processes described in FIGS. 5 to 19 may be performed.

Accordingly, a charge storage structure including a first blocking pattern 600, a charge trapping pattern 610 and a tunnel insulation pattern 650, a plurality of insulation pattern structures 640 between the charge trapping pattern 610 and the tunnel insulation pattern 650, and a channel 660 may be formed to partially fill the channel hole 590. A third buried pattern 670 may be formed to fill a remaining portion of the channel hole 590. Each of the insulation pattern structures 640 may include a first buried pattern 620 and a second buried pattern 630.

An upper portion of a first structure including portions of the third buried pattern 670, the channel 660, and the charge storage structure may be removed to form a trench (not shown), and a pad 680 may be formed to cover the trench, i.e., the removed portions of the third buried pattern 670, the channel 660, and the charge storage structure that were removed to form the trench.

However, in some example embodiments, the semiconductor pattern 150 described in FIGS. 5 to 19 may not be formed, and thus the charge storage structure sequentially formed may cover a portion of an upper surface of the substrate 500.

In example embodiments, the charge storage structure and the channel 660 may have a cup shape, the third buried pattern 670 in an inner space of the cup shape may have a pillar shape, and each of the insulation pattern structures 640 between the charge trapping pattern 610 and the tunnel insulation pattern 650 of the charge storage structure may have a ring shape.

Figure 43:
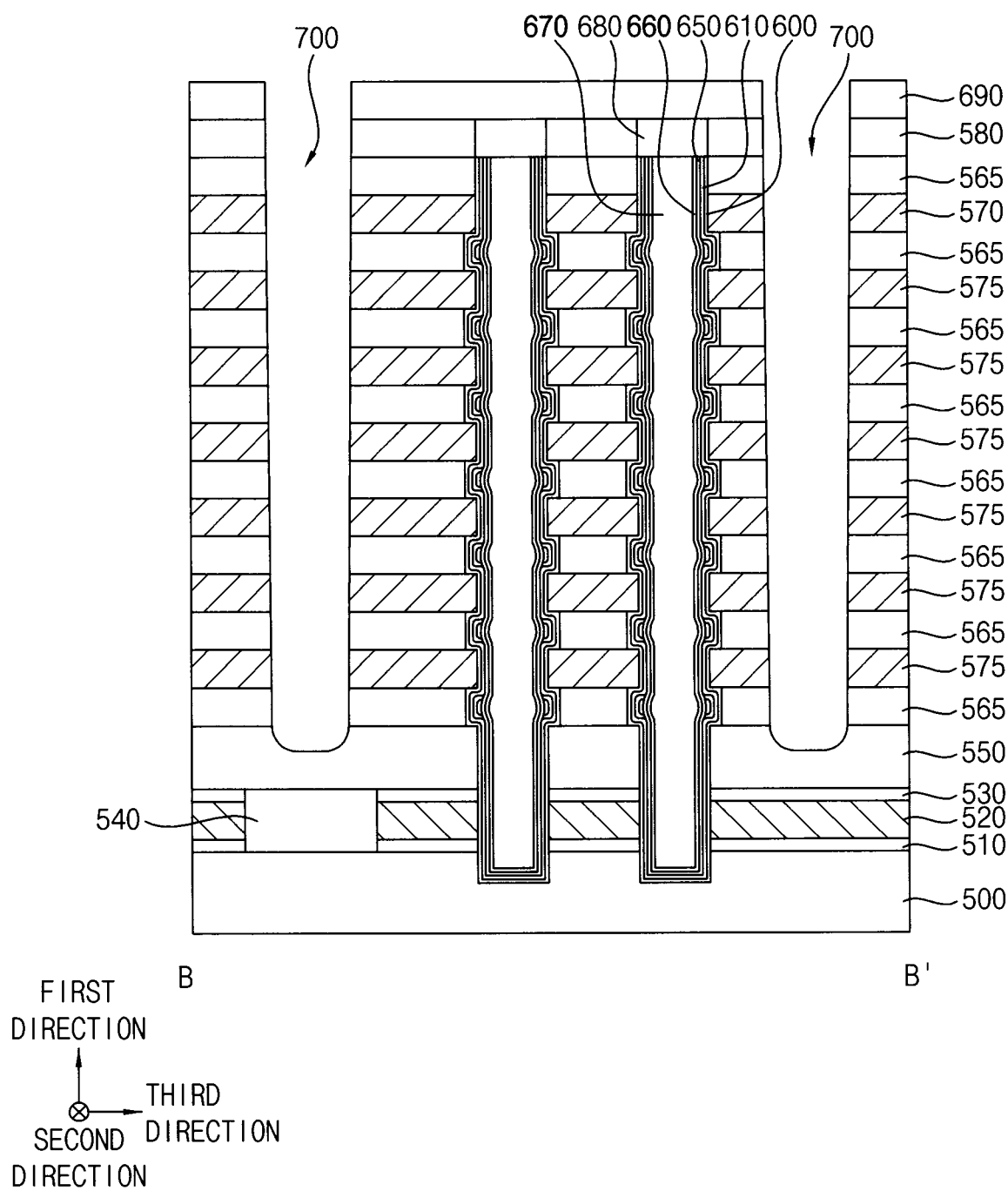
Figure 44:
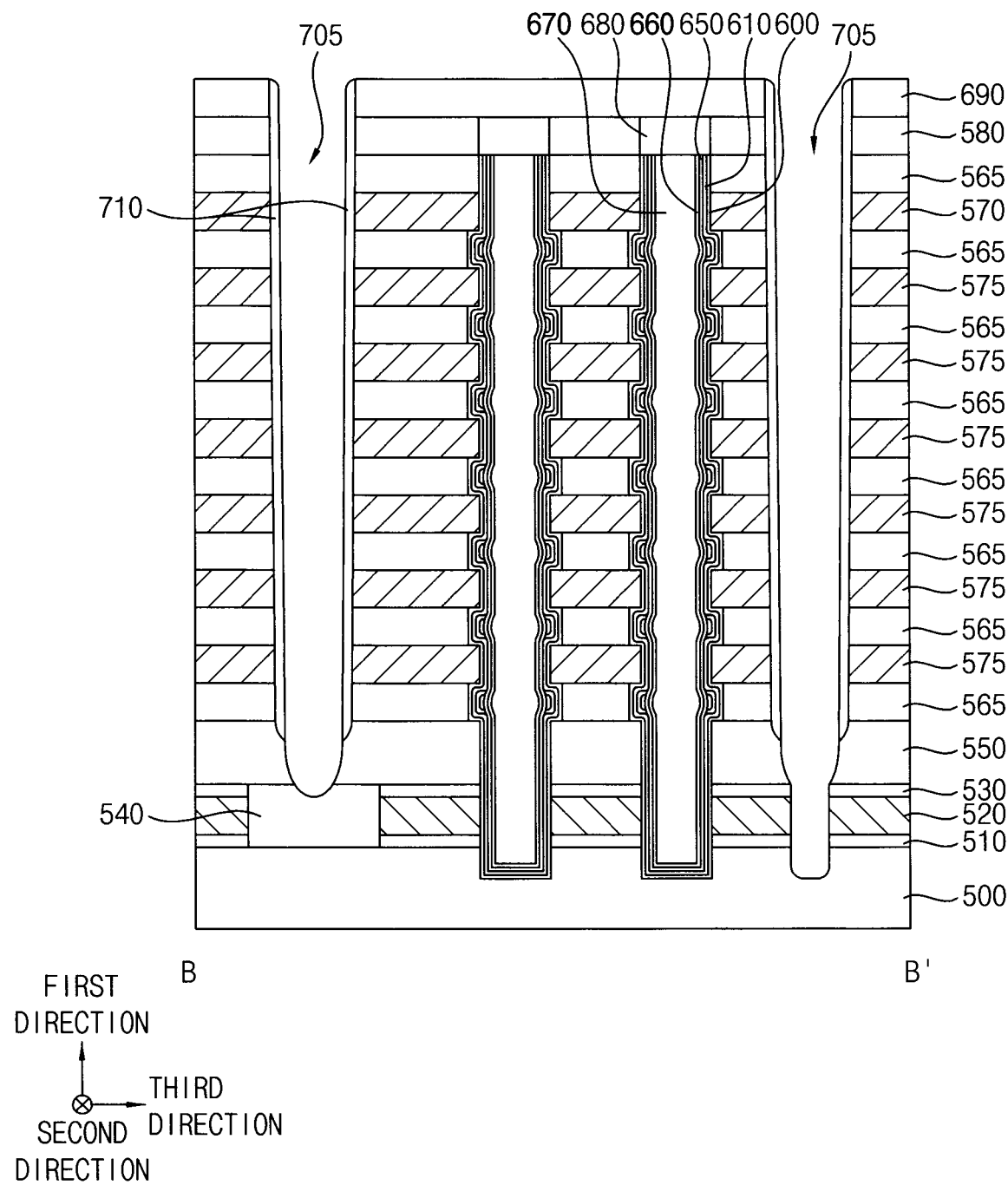

Referring to FIG. 43, after forming a second insulating interlayer 690 on the first insulating interlayer 580 and the pad 680, a set of second openings 700 may be formed to penetrate the first and second insulating interlayers 580 and 690, and the mold by a dry etching process. For example, as illustrated in FIG. 44 a first opening 700 (left side of page) and a second opening 700 (right side of page) penetrate the first and second insulating interlayers 580 and 690. For ease of understanding, example embodiments may refer to a second opening 700 as including both the first opening 700 and the second opening 700. In example embodiments, the dry etching process may be performed until the second set of openings 700 may expose an upper surface of the support layer 550, and may be further performed until the second openings 700 may penetrate an upper portion of the support layer 550. As the second set of openings 700 is formed, the insulation layer 560 and the fourth sacrificial layer 570 of the mold may be exposed by a sidewall of the second opening 700.

In example embodiments, the second set of openings 700 may extend in the second direction, and a plurality of second openings 700 may be formed along the third direction. As the second opening 700 is formed, the insulation layer 560 may be converted into an insulation pattern 565 extending in the second direction, and the fourth sacrificial layer 570 may be converted into a fourth sacrificial pattern 575 extending in the second direction.

Referring to FIG. 44, after forming a first spacer 710 on the sidewalls of the second openings 700, a portion of the support layer 550 exposed by a lower surface of each opening 700 of the second set of opening 700 thereunder may be removed to downwardly extend the second set of openings through the support layer 550. Additionally, portions of the first to third sacrificial layers 510, 520 and 530 under opening 700 (on right hand side of page) may be removed to downwardly extend the second opening 700 (opening 700 on right hand side of page), and expose the upper surface of the substrate 500. The extension of the second set of openings 700 may thereby form a third set of openings 705 with one opening 705 of the third set of openings 705 (left side of page) extending to support pattern 540 (i.e., partially within an upper portion of support pattern 540) and another opening 705 of the third set of openings 705 (right side of page) extending to the substrate (i.e., partially within an upper portion of substrate 500).

In example embodiments, the first spacer 710 may be formed by forming a first spacer layer that covers an inner wall of the second set of openings 700 and an upper surface of the second insulating interlayer 690, and then anisotropically etching the first spacer layer. The first spacer 710 may include, e.g., doped or undoped polysilicon.

The third opening 705 (right hand side) may expose not only the upper surface of the substrate 500, but may also penetrate a portion of the upper portion of the substrate 500. The third opening 705 (left hand side) may expose an upper surface of the support pattern 540, and may also penetrate a portion of the upper portion of the support pattern 540.

In example embodiments, when the third set of openings 705 is formed, as the first spacer 710 is formed on the sidewalls of the second set of openings 700, a portion that is formed from the downwardly extension of the second opening 700, that is, a lower portion of the third opening 705, may have a width smaller than that of the second set of openings 700, that is, a width of an upper portion of the third opening 705. For example, a width of each uppermost portion of each opening 705 of the third set of openings 705 is greater than a width of each lowermost portion of each opening 705 of the third set of openings 705.

Figure 45:
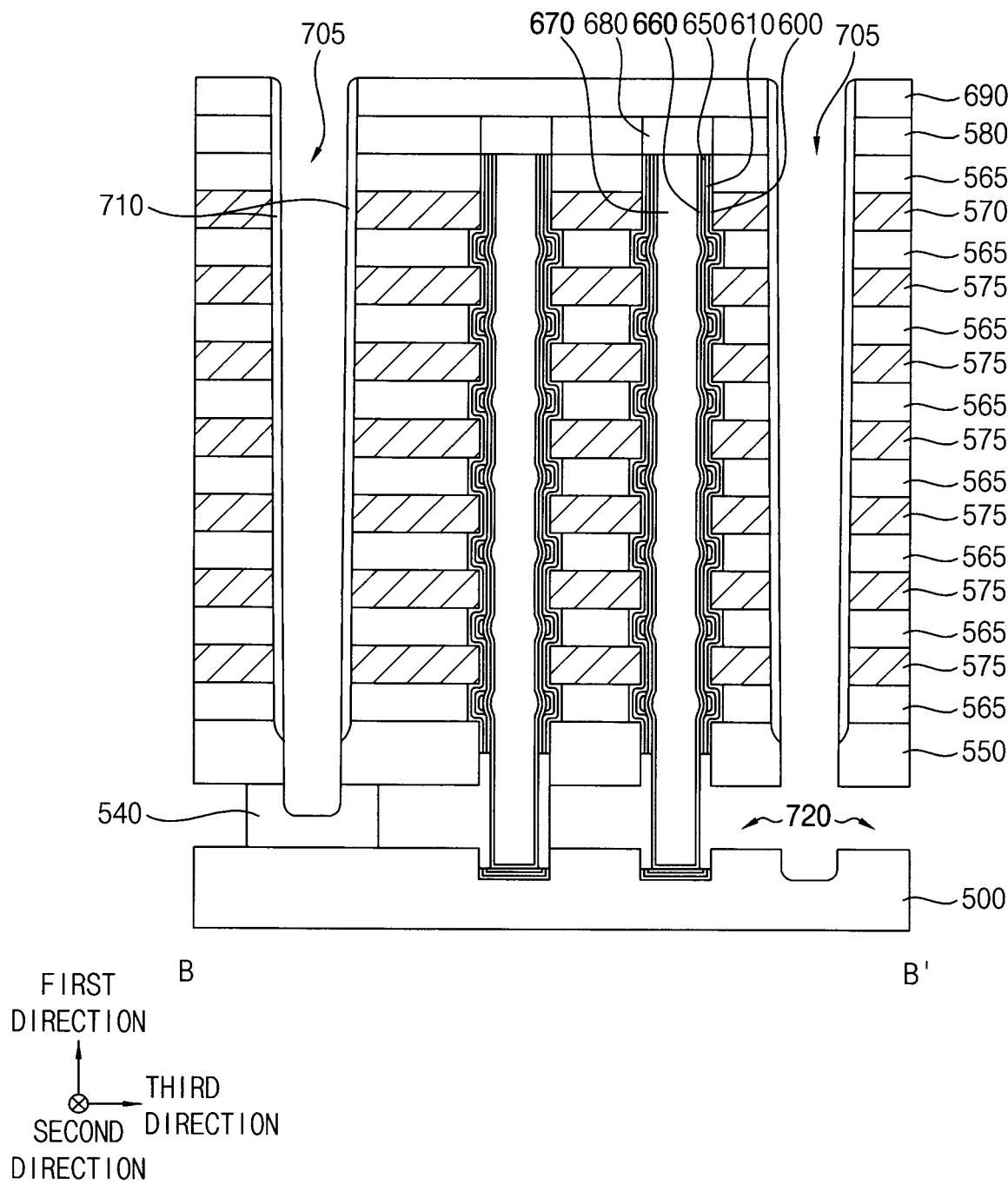

Referring to FIG. 45, the first to third sacrificial layers 510, 520, and 530 of which sidewalls may be exposed by the third opening 705 (right hand side) may be removed to form a first gap 720.

In example embodiments, the second sacrificial layer 520 may be removed by a wet etching process using phosphoric acid ($H_3PO_4$), and the first and third sacrificial layers 510 and 530 may be removed by a wet etching process using hydrofluoric acid (HF).

As the first gap 720 is formed, a lower portion of the charge storage structure covering a lower portion of an outer sidewall of the channel 660 may be exposed, and the exposed portion of the charge storage structure may be further removed to expose the lower portion of the outer sidewall of the channel 660.

The lower portion of the charge storage structure may be removed by, e.g., a wet etching process using phosphoric acid ($H_3PO_4$) or a wet etching process using hydrofluoric acid (HF). As the lower portion of the charge storage structure is removed, the charge storage structure may be understood as being separated into two portions, upper and lower portions. That is, the upper portion of the charge storage structure may penetrate the mold to cover portions of the outer sidewall of the channel 660, and the lower portion of the charge storage structure may be formed on the upper surface of the substrate 500 to cover the lower surface of the channel 660.

In the example embodiment of FIG. 45, the first gap 720 may include an interstitial gap corresponding to an upper surface of a portion adjacent to the outer sidewall of the channel 660 higher than a lower surface of the support layer 550, and a lower surface of the portion adjacent to the outer sidewall of the channel 660 lower than the upper surface of the substrate 500.

The support pattern 540 may not be removed when the first gap 720 is formed, and thus the mold may not collapse. Also, a lower surface of the mold may be covered by the support layer 550 when the first gap 720 is formed, and a lower portion of the mold may not be removed.

Figure 46:
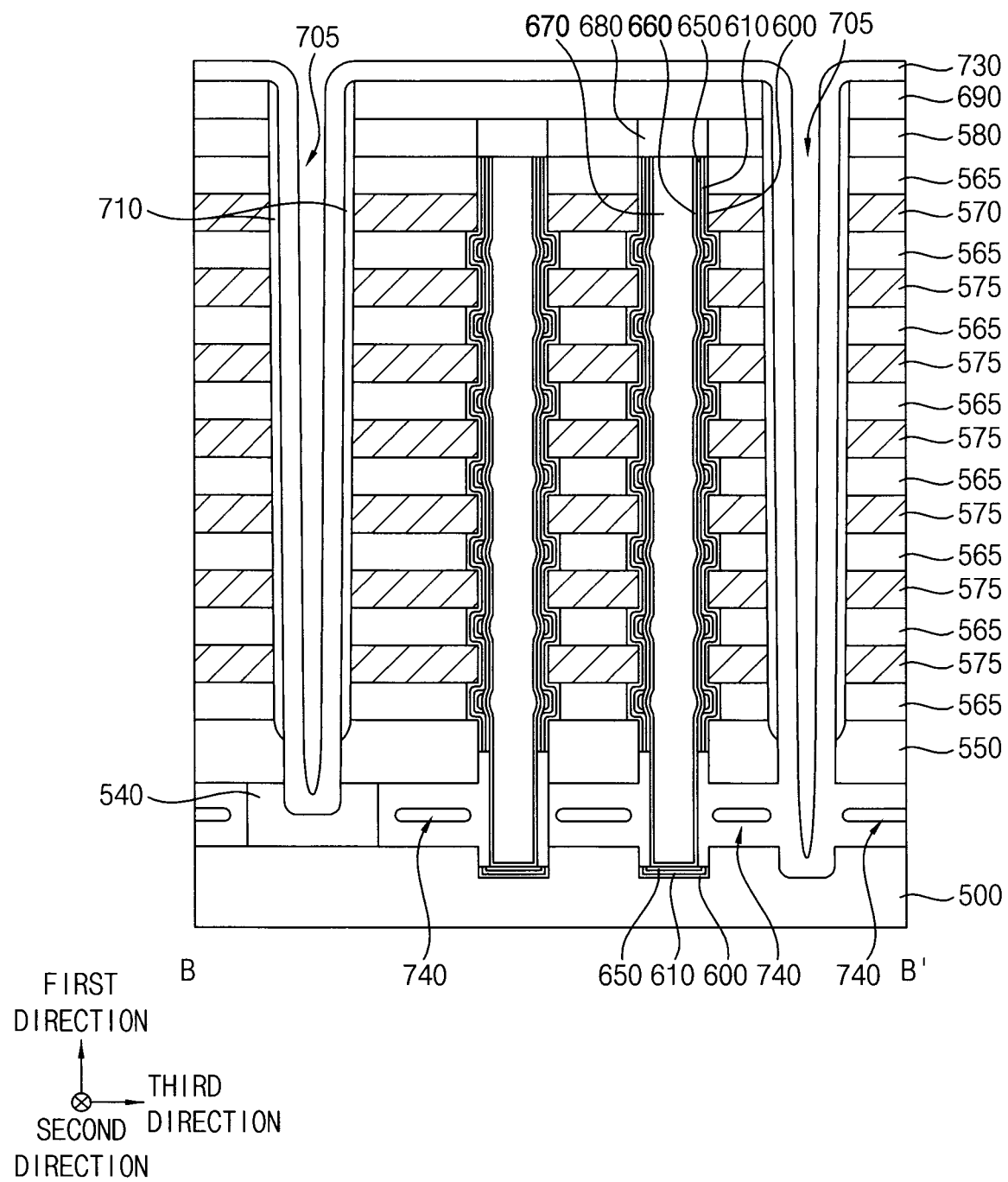

Referring to FIG. 46, a channel connection layer 730 may be formed to fill the first gap 720 and may also be formed on a sidewall and a lower surface of the third set of openings 705, and the upper surface of the second insulating interlayer 690. As the channel connection layer 730 is formed to fill the first gap 720, the channels 660 may be connected to each other thereby forming a channel array.

A portion of the channel connection layer 730 in the first gap 720 may include an air gap 740 therein.

The channel connection layer 730 may include, e.g., polysilicon doped with impurities.

Figure 47:
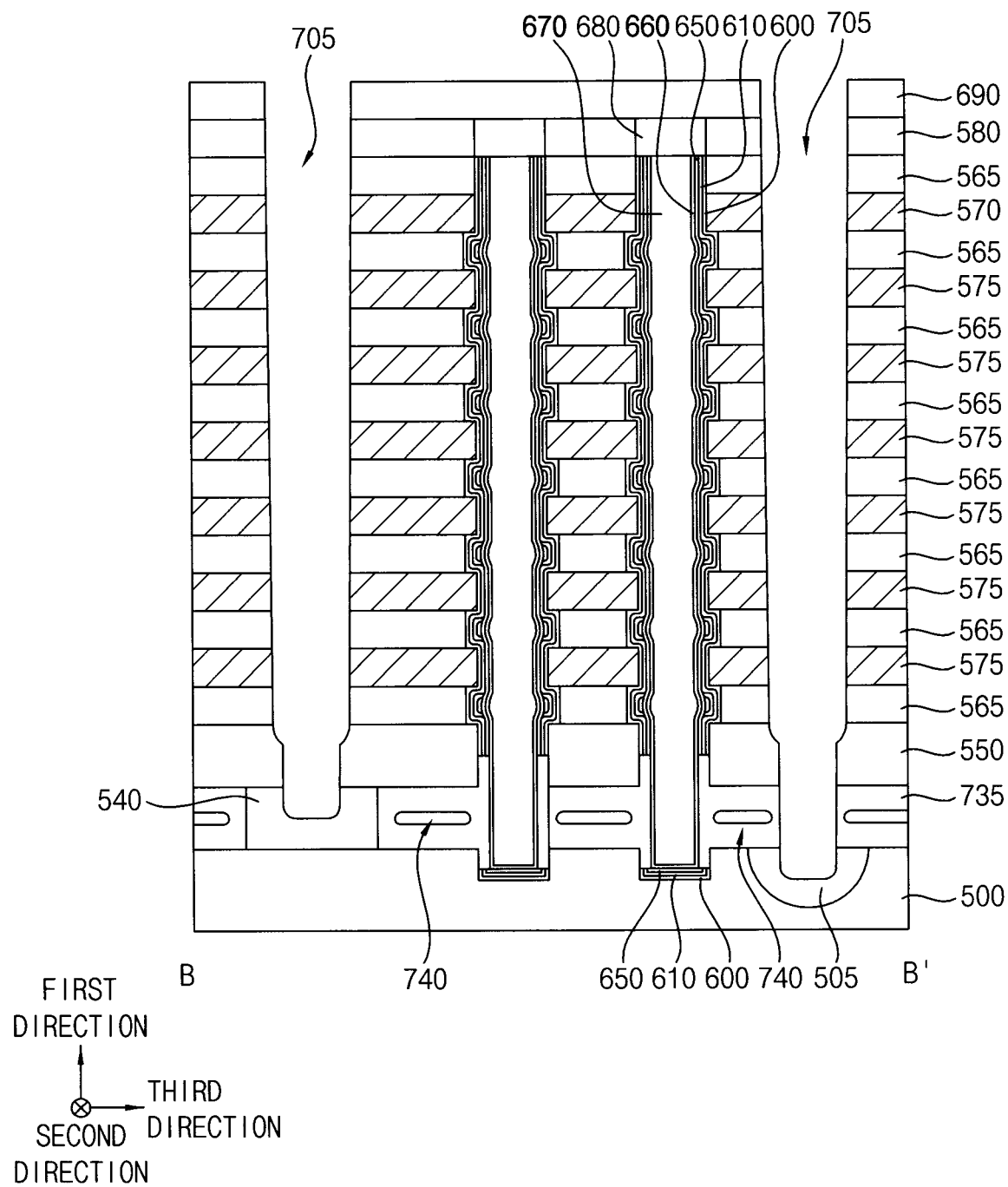

Referring to FIG. 47, the channel connection layer 730 may be partially removed to form a channel connection pattern 735 only in the first gap 720.

In example embodiments, the channel connection pattern 735 may be formed by performing an etch back process to remove a portion of the channel connection layer 730 in the set of third openings 705. When the etch back process is performed, the first spacer 710 (on a sidewall of the third opening 705) may also be removed.

An upper portion of the substrate 500 exposed by the third opening 705 may be doped with impurities to form an impurity region 505. In example embodiments, the impurity region 505 may contact a lower surface of the channel connection pattern 735, and thus may be electrically connected to the channel connection pattern 735 including polysilicon doped with impurities.

Figure 48:
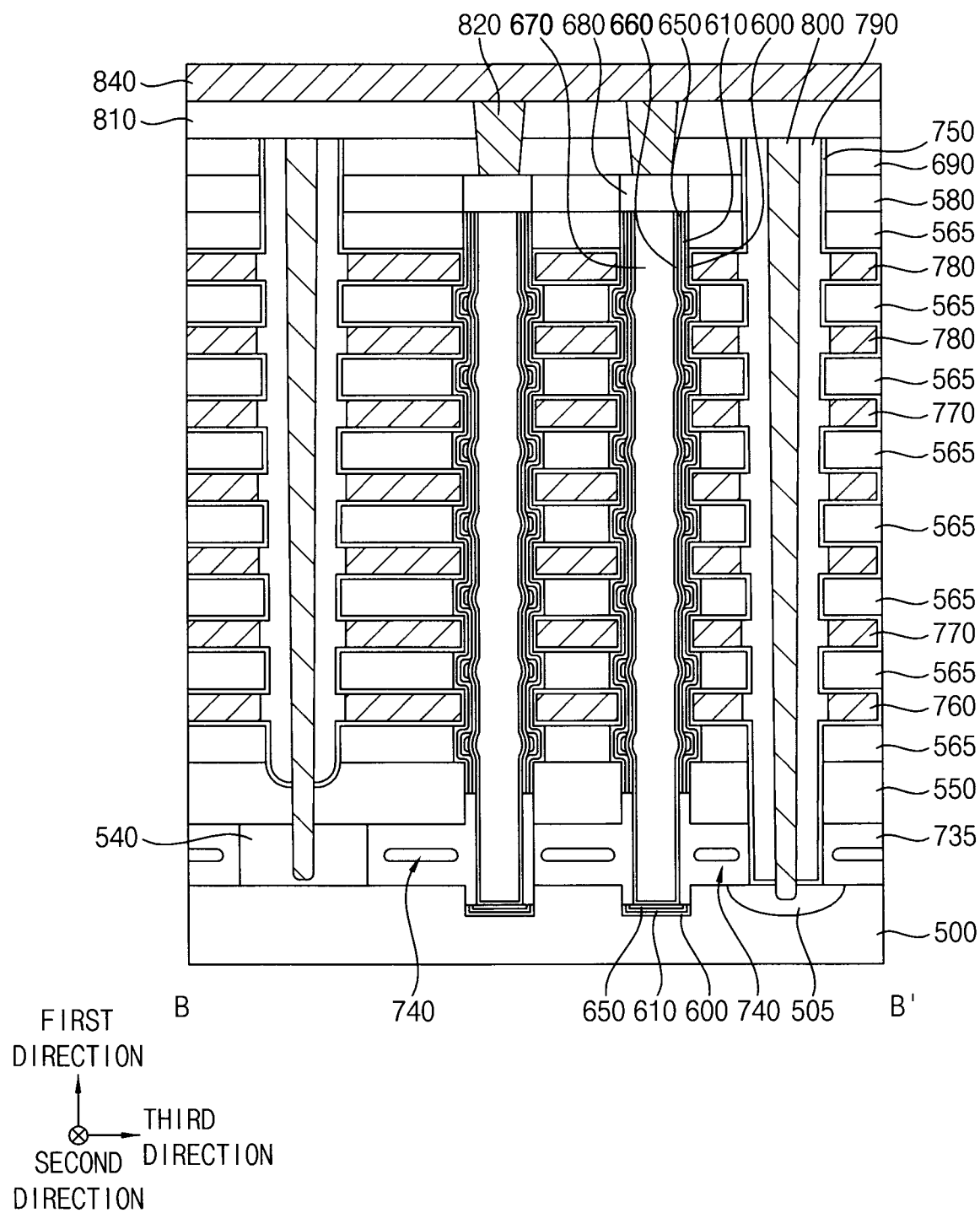

Referring to FIG. 48, processes similar to the processes described in FIGS. 20 to 25 may be performed to complete the fabrication of the vertical memory device.

Specifically, after removing each of the fourth sacrificial patterns 575 to form a second gap, a second blocking pattern 750 may be formed on an exposed outer sidewall of the first blocking pattern 600, an inner wall of the second gap, surfaces of the insulation patterns 565, the support layer 550 and the channel connection pattern 735, the exposed upper surface of the substrate 500, the upper surface of the support pattern 540, and a sidewall of the second insulating interlayer 690, and a gate electrode layer may be formed on the second blocking pattern 750.

The gate electrode layer may include a gate barrier layer and a gate conductive layer sequentially stacked. The gate conductive layer may include a metal having low electrical resistance, e.g., tungsten, titanium, tantalum, platinum, etc. The gate barrier layer may include a metal nitride, e.g., titanium nitride, tantalum nitride, etc.

The gate electrode layer may be partially removed to form a gate electrode in each of the second gaps. In example embodiments, the gate electrode layer may be partially removed by a wet etching process, and the gate electrode formed therefrom may fill some or all of each of the second gaps.

The gate electrode may extend in the second direction, and a plurality of gate electrodes may be formed along the third direction. That is, the gate electrodes extending in the second direction may be spaced apart from each other by the third opening 705.

In example embodiments, the gate electrode may be formed on a plurality of levels spaced apart from each other in the first direction, and the gate electrodes at the plurality of levels may form a gate electrode structure. The gate electrode structure may include one or more of first gate electrodes 760, a plurality of second gate electrodes 770, and one or more of the third gate electrodes 780 sequentially stacked. For example, the gate electrode structure may include a first gate electrode 760, a series of second gate electrodes 770 above the first gate electrode 760, and a series of third gate electrodes 780 above the second gate electrodes 770. The number of levels where each of the first to third gate electrodes 760, 770, and 780 are formed may vary according to the number of levels of the fourth sacrificial patterns 575.

After forming a second spacer layer on the second blocking pattern 750, the second spacer layer may be anisotropically etched to form a second spacer 790 on the sidewalls of the set of third openings 705, and thus an upper surface of the second blocking pattern may be partially exposed.

A portion of the second blocking pattern 750 not covered by the second spacer 790 may be etched using the second spacer 790, and a portion of the second blocking pattern 750 on the upper surface of the second insulating interlayer 690 may also be removed. In this case, the substrate 500, that is an upper portion of the impurity region 505 and the support pattern 540 may also be partially removed.

After forming a conductive layer on the substrate 500, that is, an upper surface of the impurity region 505, the upper surface of the support pattern 540, the second spacer 790, and the second insulating interlayer 690 to fill a remaining portion of the third opening 705, the conductive layer may be planarized until the upper surface of the second insulating interlayer 690 may be exposed to form a common source line, CSL 800. The CSL 800 may include a metal, e.g., tungsten.

In example embodiments, the CSL 800 may extend in the first direction, and may also extend in the second direction. A lower surface of the CSL 800 (right hand side) may be covered by the substrate 500, that is, the impurity region 505 and a lower surface of the CSL 800 (left hand side) may be covered by the support pattern 540. Alternatively, the CSL 800 may fully penetrate the support pattern 540, and may be covered by a portion of the substrate 500 under the support pattern 540.

After forming a third insulating interlayer 810 on the second insulating interlayer 690, the CSL 800, the second spacer 790, and the second blocking layer 750, a contact plug 820 may be formed to penetrate the second and third insulating interlayers 690, 810 and to contact the upper surface of the pad 680. For example, as illustrated by FIG. 48, each contact plug 820 of the pair of contact plugs 820 is contacting a respective pad 680. After forming a fourth insulating interlayer 830 (See FIG. 34) on the third insulating interlayer 810 and the contact plug 820, a bit line 840 penetrating the fourth insulating interlayer 830 and contacting an upper surface of the contact plug 820 may be formed to complete the fabrication of the vertical memory device.

As may be consistent with previously disclosed example embodiments, the buried pattern structure 640 may be formed on respective portions of the charge storage structure between the insulation patterns 565 and the channel 660, and corresponding portions of the charge trapping pattern 610 between the insulation patterns 565 and the channel 660 may have a curved shape, so that a lateral charge loss of the charge trapping pattern 610 may be reduced. Also, as may be consistent with previously disclosed example embodiments, portions of the tunnel insulation pattern 650 and channel 660 that are horizontally adjacent to buried pattern structures 640 may have a curved shape, e.g., tunnel insulation pattern 650 and channel 660 are curved toward buried pattern structure 640.

Also, as the first to third gate electrodes 760, 770, and 780 and the insulation patterns 565 alternately and repeatedly stacked on the substrate 500 may be formed to have a concavo-convex shape as a whole, the outer sidewall of the charge storage structure contacting the first to third gate electrodes 760, 770, and 780 and the insulation patterns 565 may also be formed to have the concavo-convex shape as a whole. Accordingly, since the charge storage structure may be at least partially interposed between the first to third gate electrodes 760, 770, and 780, the interference between the first to third gate electrodes 760, 770, and 780 may be minimized, the occurrence of coupling between the second electrodes 770 serving as word lines may be reduced, and thus the electrical characteristics of the vertical memory device may be improved.

As described above, although the present invention has been described with reference to example embodiments, those skilled in the art will readily appreciate that many modifications are possible in the example embodiments without materially departing from the novel teachings and advantages of the present inventive concept.

What is claimed is:

1. A vertical memory device, comprising:
 a plurality of gate electrodes spaced apart from each other and being sequentially stacked in a vertical direction that is substantially perpendicular to an upper surface of a substrate, the plurality of gate electrodes including a first gate electrode and a second gate electrode;
 a plurality of insulation patterns between the gate electrodes including a first insulation pattern located at an elevation between the first gate electrode and the second gate electrode;
 a channel extending in the vertical direction on the substrate, the channel penetrating at least the first gate electrode, the second gate electrode, and the first insulation pattern;
 a charge storage structure extending in the vertical direction and covering an outer sidewall of the channel, the charge storage structure including a tunnel insulation pattern, a charge trapping pattern, and a blocking pattern that are sequentially stacked from the outer sidewall of the channel along a horizontal direction that is substantially parallel to the upper surface of the substrate; and
 a plurality of buried pattern structures including a first buried pattern structure, each buried pattern structure being completely surrounded by the tunnel insulation pattern and the charge trapping pattern between the channel and a respective insulation pattern, each buried pattern structure including an inner sidewall that contacts the tunnel insulation pattern and an outer sidewall that contacts the charge trapping pattern, wherein a maximum thickness of a first portion of the charge trapping pattern having a vertical slope with respect to the upper surface of the substrate and being horizontally between the channel and the first gate electrode is less than or equal to a maximum thickness of a second portion of the charge trapping pattern having a vertical slope with respect to the upper surface of the substrate and being horizontally between the channel and the first insulation pattern.

2. The vertical memory device of claim 1, wherein the maximum thickness of the first portion of the charge trapping pattern, a minimum thickness of the first portion of the charge trapping pattern, the maximum thickness of the second portion of the charge trapping pattern, and a minimum thickness of the second portion of the charge trapping pattern are the same.

3. The vertical memory device of claim 1, wherein the inner sidewall of the first buried pattern structure is concave toward the channel along the horizontal direction.

4. The vertical memory device of claim 1, wherein the inner sidewall of the first buried pattern structure extends in the vertical direction.

5. The vertical memory device of claim 1, wherein the inner sidewall of the first buried pattern structure is convex toward the channel along the horizontal direction.

6. The vertical memory device of claim 1, wherein the first buried pattern structure includes first and second buried patterns sequentially stacked from a sidewall of the charge trapping pattern along the horizontal direction.

7. The vertical memory device of claim 6, wherein the first buried pattern includes silicon oxide, and the second buried pattern includes one of: silicon oxide or silicon oxynitride.

8. The vertical memory device of claim 1, wherein each vertically sloped portion of the charge trapping pattern has a constant thickness in the horizontal direction.

9. The vertical memory device of claim 8, further comprising:
 a channel connection pattern between the substrate and the second gate electrode, the channel connection pattern including polysilicon doped with impurities.

10. A vertical memory device, comprising:
 a support pattern and a channel connection pattern on a substrate;
 a plurality of gate electrodes on the support pattern and the channel connection pattern, the gate electrodes being spaced apart from each other in a vertical direction that is substantially perpendicular to an upper surface of the substrate;
 a plurality of insulation patterns respectively between the gate electrodes, including a first insulation pattern being located at an elevation between two adjacent gate electrodes;
 a plurality of channels on the substrate, each of the channels extending in the vertical direction and penetrating the gate electrodes and the insulation patterns;
 a charge storage structure extending in the vertical direction and covering an outer sidewall of each of the channels, the charge storage structure including a tunnel insulation pattern, a charge trapping pattern, and a blocking pattern that are sequentially stacked from the outer sidewall of each of the channels along a horizontal direction that is substantially parallel to the upper surface of the substrate; and
 a plurality of buried pattern structures, each buried pattern structure being surrounded by the tunnel insulation pattern and laterally surrounded on one side by the charge trapping pattern between each of the channels and a respective insulation pattern, each buried pattern structure including an inner sidewall and an outer sidewall, and a lower surface and an upper surface, wherein the inner sidewall contacts the tunnel insulation pattern, and the outer sidewall, lower surface, and upper surface contact the charge trapping pattern, wherein the plurality of channels are electrically connected to each other by the channel connection pattern, and wherein vertical portions of the charge trapping pattern have a constant thickness.

11. The vertical memory device of claim 10, wherein the tunnel insulation pattern, the blocking pattern, and each buried pattern structure includes an oxide, and the charge trapping pattern includes a nitride.

* * * * *